United States Patent
Kim et al.

(10) Patent No.: US 11,600,570 B2
(45) Date of Patent: Mar. 7, 2023

(54) SEMICONDUCTOR MEMORY DEVICE AND METHOD OF FABRICATING THE SAME

(71) Applicant: Samsung Electronics Co., Ltd., Suwon-si (KR)

(72) Inventors: Hyo-Sub Kim, Seoul (KR); Sohyun Park, Seoul (KR); Daewon Kim, Seoul (KR); Dongoh Kim, Daegu (KR); Eun A Kim, Seoul (KR); Chulkwon Park, Hwaseong-si (KR); Taejin Park, Yongin-si (KR); Kiseok Lee, Hwaseong-si (KR); Sunghee Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 88 days.

(21) Appl. No.: 17/097,337

(22) Filed: Nov. 13, 2020

(65) Prior Publication Data

US 2021/0296237 A1 Sep. 23, 2021

(30) Foreign Application Priority Data

Mar. 17, 2020 (KR) .......................... 10-2020-0032824

(51) Int. Cl.
| | |
|---|---|
| *H01L 23/535* | (2006.01) |
| *H01L 21/768* | (2006.01) |
| *H01L 27/108* | (2006.01) |
| *H01L 23/532* | (2006.01) |

(52) U.S. Cl.
CPC ........ *H01L 23/535* (2013.01); *H01L 21/7682* (2013.01); *H01L 21/76805* (2013.01); *H01L 21/76895* (2013.01); *H01L 23/5329* (2013.01); *H01L 27/10814* (2013.01); *H01L 27/10823* (2013.01); *H01L 27/10855* (2013.01);
(Continued)

(58) Field of Classification Search
CPC ............ H01L 23/535; H01L 21/76805; H01L 21/7682; H01L 21/76895; H01L 23/5329;
(Continued)

(56) References Cited

U.S. PATENT DOCUMENTS

| | | |
|---|---|---|
| 8,969,936 B2 | 3/2015 | Lee et al. |
| 9,196,620 B2 | 11/2015 | Park et al. |

(Continued)

FOREIGN PATENT DOCUMENTS

| | | |
|---|---|---|
| JP | 2015216236 A | 12/2015 |
| KR | 10-2014-0078473 A | 6/2014 |

(Continued)

*Primary Examiner* — Herve-Louis Y Assouman
(74) *Attorney, Agent, or Firm* — Muir Patent Law, PLLC

(57) ABSTRACT

A semiconductor memory device is disclosed. The device may include first and second impurity regions provided in a substrate and spaced apart from each other, the second impurity region having a top surface higher than the first impurity region, a device isolation pattern interposed between the first and second impurity regions, a first contact plug, which is in contact with the first impurity region and has a bottom surface lower than the top surface of the second impurity region, a gap-fill insulating pattern interposed between the first contact plug and the second impurity region, a first protection spacer interposed between the gap-fill insulating pattern and the second impurity region, and a first spacer, which is in contact with a side surface of the first contact plug and the device isolation pattern and is interposed between the first protection spacer and the gap-fill insulating pattern.

20 Claims, 75 Drawing Sheets

(52) U.S. Cl.
CPC .. *H01L 27/10876* (2013.01); *H01L 27/10888* (2013.01); *H01L 27/10894* (2013.01); *H01L 27/10897* (2013.01)

(58) Field of Classification Search
CPC ......... H01L 27/10814; H01L 27/10823; H01L 27/10855; H01L 27/10876; H01L 27/10888; H01L 27/10894; H01L 27/10897; H01L 27/10885; H01L 27/10891
See application file for complete search history.

(56) References Cited

U.S. PATENT DOCUMENTS

| | | | |
|---|---|---|---|
| 9,209,241 | B2 | 12/2015 | Kim et al. |
| 9,312,184 | B2 | 4/2016 | Yu et al. |
| 9,412,642 | B2 | 8/2016 | Chung |
| 9,831,172 | B2 | 11/2017 | Kim et al. |
| 2010/0109073 | A1 | 5/2010 | Park |
| 2016/0197042 | A1 | 7/2016 | Lee et al. |
| 2019/0164975 | A1* | 5/2019 | Song ................. H01L 27/10888 |
| 2019/0333918 | A1 | 10/2019 | Kim et al. |
| 2020/0013668 | A1 | 1/2020 | Choi et al. |
| 2021/0273048 | A1 | 9/2021 | Park et al. |

FOREIGN PATENT DOCUMENTS

| | | |
|---|---|---|
| KR | 10-2016-0073700 A | 6/2016 |
| KR | 10-1934366 B1 | 1/2019 |
| KR | 1020210109700 A | 9/2021 |
| TW | 201019420 A | 5/2010 |
| TW | 201436224 A | 9/2014 |

\* cited by examiner

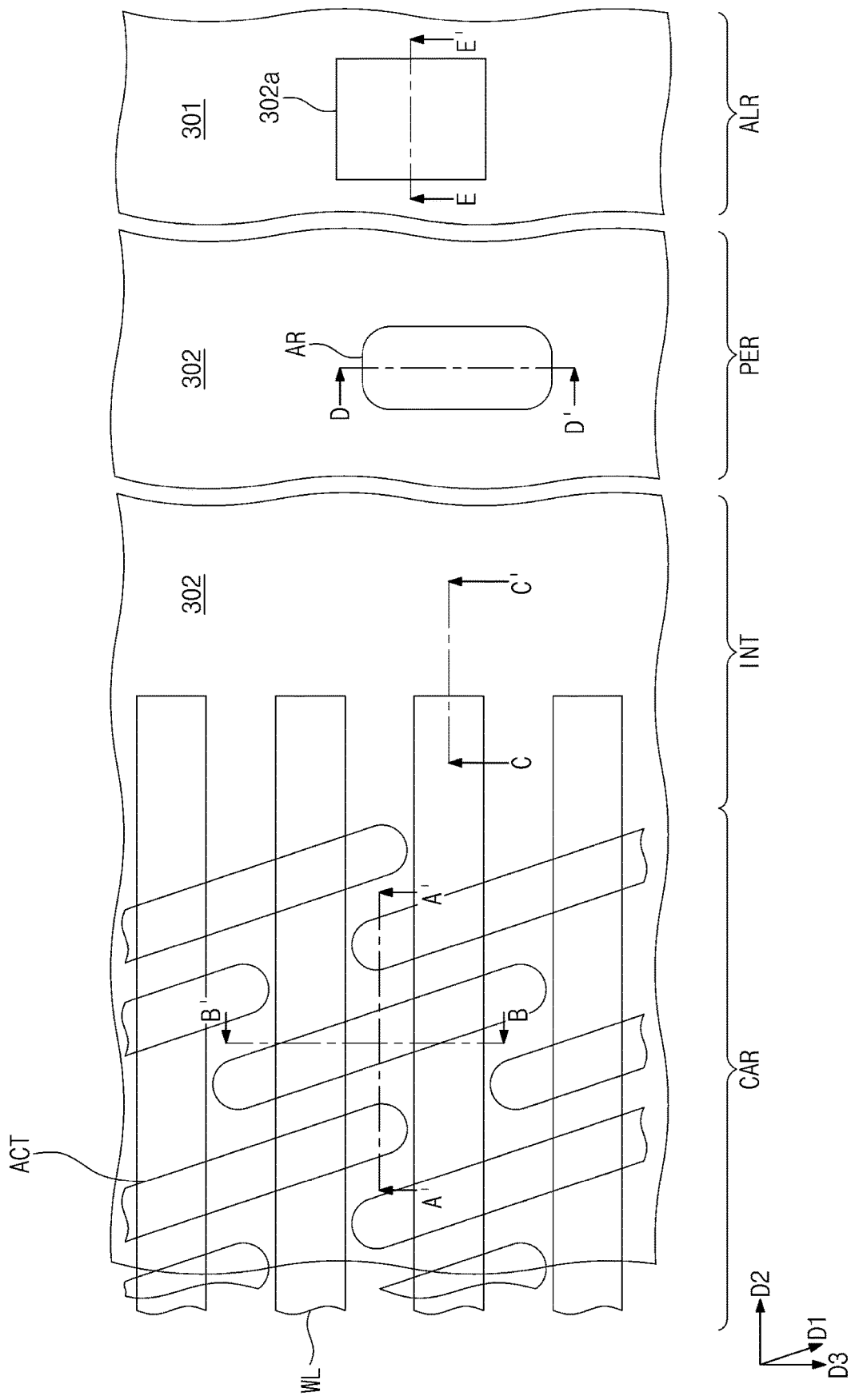

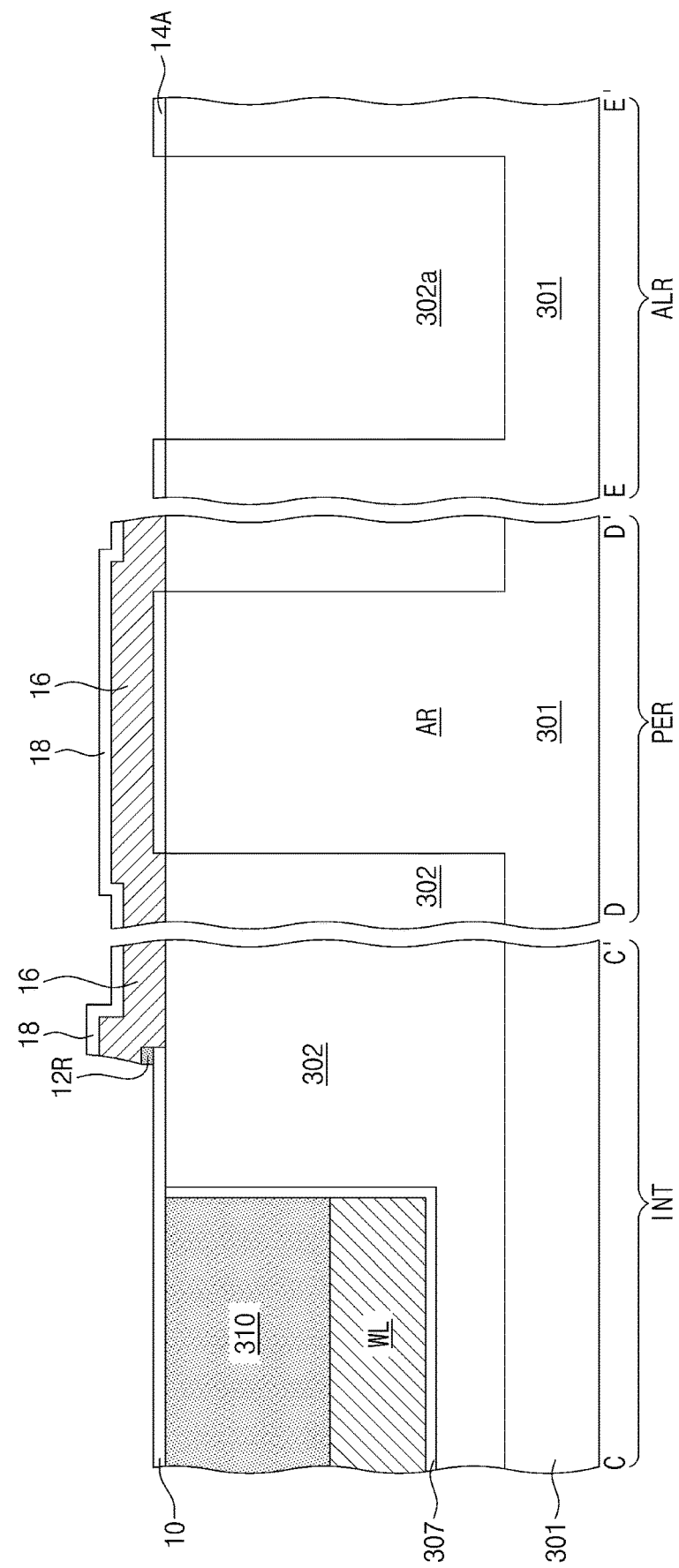

SEMICONDUCTOR MEMORY DEVICE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2020-0032824, filed on Mar. 17, 2020, in the Korean Intellectual Property Office, the entire contents of which are hereby incorporated by reference.

BACKGROUND OF THE INVENTION

The present disclosure relates to a semiconductor memory device and a method of fabricating the same.

Due to their small-sized, multifunctional, and/or low-cost characteristics, semiconductor devices are being esteemed as important elements in the electronic industry. In the recent electronics industry, highly integrated semiconductor devices are strongly demanded. To increase the integration density of a semiconductor device, it is desirable to reduce linewidths of patterns constituting the semiconductor device. However, novel and expensive exposure technologies are needed to reduce the linewidths of the patterns, and thus, it becomes difficult to increase the integration density of the semiconductor device. Recently, a variety of new technologies are being studied to increase an integration density of a semiconductor memory device.

SUMMARY

An embodiment of the inventive concept provides a semiconductor memory device with improved reliability.

An embodiment of the inventive concept provides a method of fabricating a highly-reliable semiconductor memory device.

According to an embodiment of the inventive concept, a semiconductor memory device may include a first impurity region and a second impurity region, which are provided in a substrate and are spaced apart from each other, a top surface of the second impurity region being higher than a top surface of the first impurity region, a device isolation pattern interposed between the first impurity region and the second impurity region, a first contact plug, which is in contact with the first impurity region and has a bottom surface lower than the top surface of the second impurity region, a gap-fill insulating pattern interposed between the first contact plug and the second impurity region, a first protection spacer interposed between the gap-fill insulating pattern and the second impurity region, and a first spacer, which is in contact with a side surface of the first contact plug and the device isolation pattern and is interposed between the first protection spacer and the gap-fill insulating pattern.

According to an embodiment of the inventive concept, a semiconductor memory device may include a device isolation pattern disposed in a substrate to define a plurality of active regions, a recess region defined in the device isolation pattern and the substrate and having a first inner side surface and a second inner side surface opposite to each other, a first impurity region and a second impurity region disposed in a first active region of the plurality of active regions and a second active region of the plurality of active regions, respectively, the first impurity region being provided in the substrate exposed through a bottom surface of the recess region, a bit-line contact, which is in contact with the first impurity region and is disposed in the recess region, a first protection spacer covering the first inner side surface of the recess region, and a second protection spacer covering the second inner side surface of the recess region. The first protection spacer and the second protection spacer may include the same material and have different shapes from each other.

According to an embodiment of the inventive concept, a semiconductor memory device may include a device isolation pattern disposed in a substrate to define a plurality of active regions, a recess region defined in the device isolation pattern and the substrate and having a first inner side surface and a second inner side surface opposite to each other, a first impurity region and a second impurity region disposed in a first active region of the plurality of active regions and a second active region of the plurality of active regions, respectively, the first impurity region being provided in the substrate exposed through a bottom of the recess region, a bit-line contact, which is in contact with the first impurity region and is disposed in the recess region, a first protection spacer covering the first inner side surface of the recess region, and a second protection spacer covering the second inner side surface of the recess region. The first protection spacer may be in contact with the substrate, and the second protection spacer may be spaced apart from the substrate.

According to an exemplary embodiment of the present invention, a method of fabricating a semiconductor memory device includes forming a device isolation pattern and a plurality of active regions in a substrate, the plurality of active regions being defined by the device isolation pattern, performing a first etching process to partially recess the device isolation pattern and the plurality of active regions, thereby forming a preliminary recess region defined by a first active region, partially recessed, of the plurality of active regions and the device isolation pattern partially recessed, the preliminary recess region having a first inner side surface and a second inner side surface opposite to each other and having a first maximum width therebetween, performing a second etching process on the preliminary recess region to form a recess region, the device isolation pattern being further recessed in the second etching process and the first active region partially recessed protruding from a bottom surface of the recess region, and the recess region having a third inner side surface and a fourth inner side surface opposite to each other and having a second maximum width therebetween greater than the first maximum width, forming a bit-line contact on the first active region and in the recess region, forming a first protection spacer covering the third inner side surface of the recess region, forming a second protection spacer covering the fourth inner side surface of the recess region, forming a storage node contact on a second active region of the plurality of active regions, the storage node contact being in contact with an end portion of the first protection spacer, forming a landing pad on the storage node contact, and forming a data storage pattern on the landing pad.

BRIEF DESCRIPTION OF THE DRAWINGS

FIGS. 2A, 7A, 8A, and 15A are plan views sequentially illustrating a process of fabricating the semiconductor memory device of FIG. 1A.

FIGS. 2C, 3B, 4B, 5B, 6B, 7C, 9B, 10B, 11, 12, 13B, and 14B are sectional views sequentially illustrating a process of fabricating the semiconductor memory device of FIG. 1C.

DETAILED DESCRIPTION

Example embodiments of the inventive concepts will now be described more fully with reference to the accompanying drawings, in which example embodiments are shown.

Figure 1A:
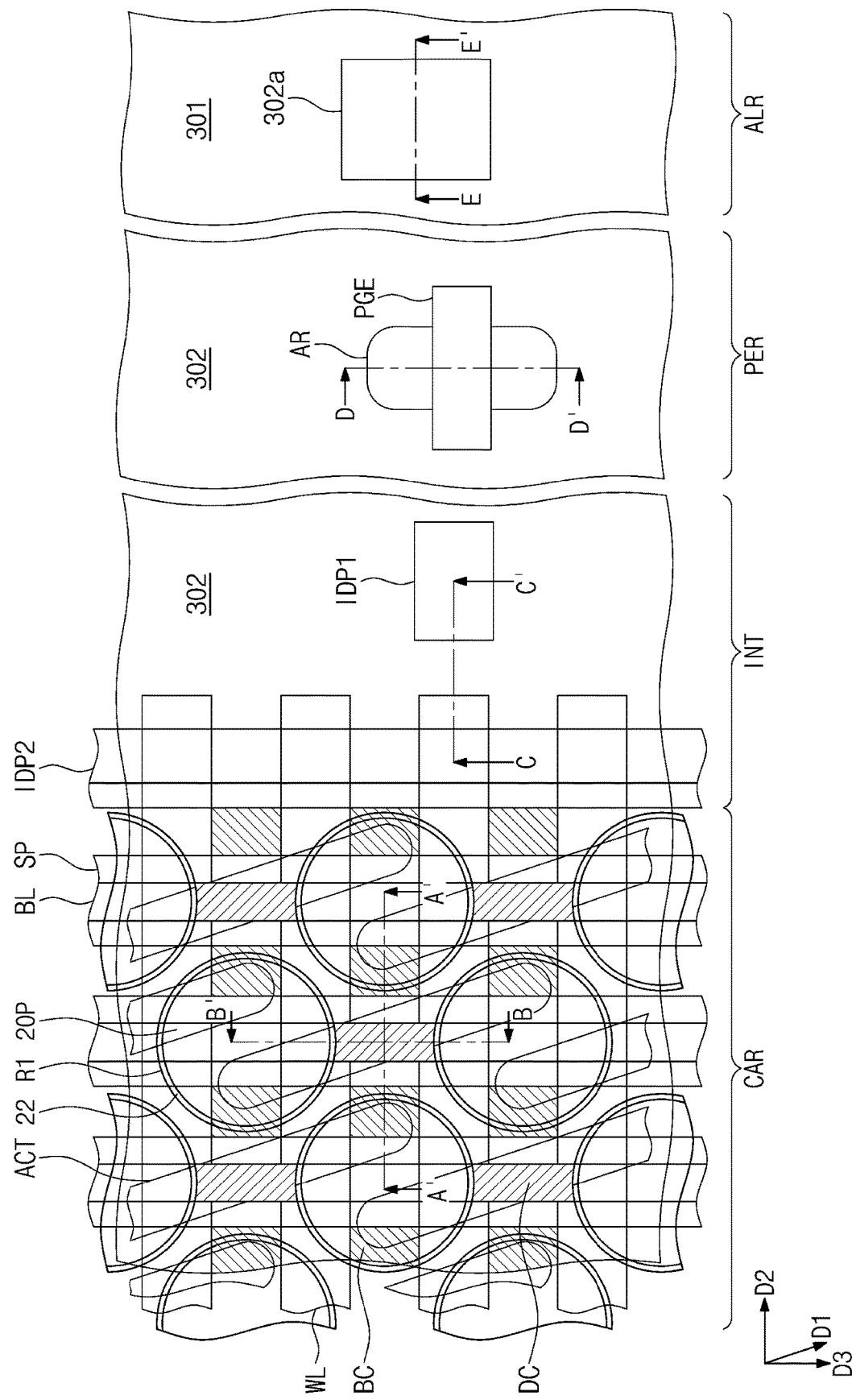
FIG. 1A is a plan view illustrating a semiconductor memory device according to an embodiment of the inventive concept.
Figure 1B:
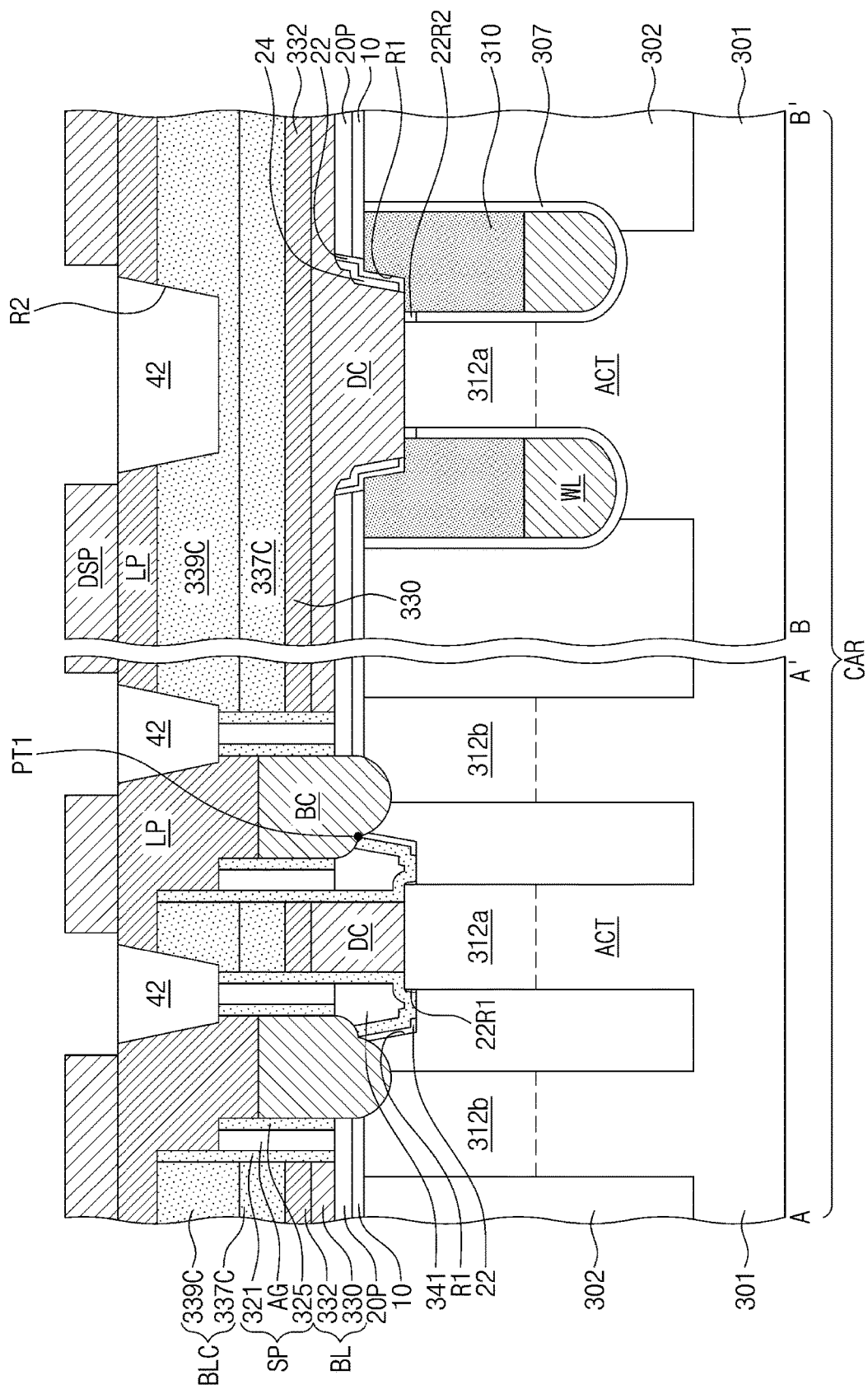
FIG. 1B is a sectional view taken along lines A-A' and B-B' of FIG. 1A.
Figure 1C:
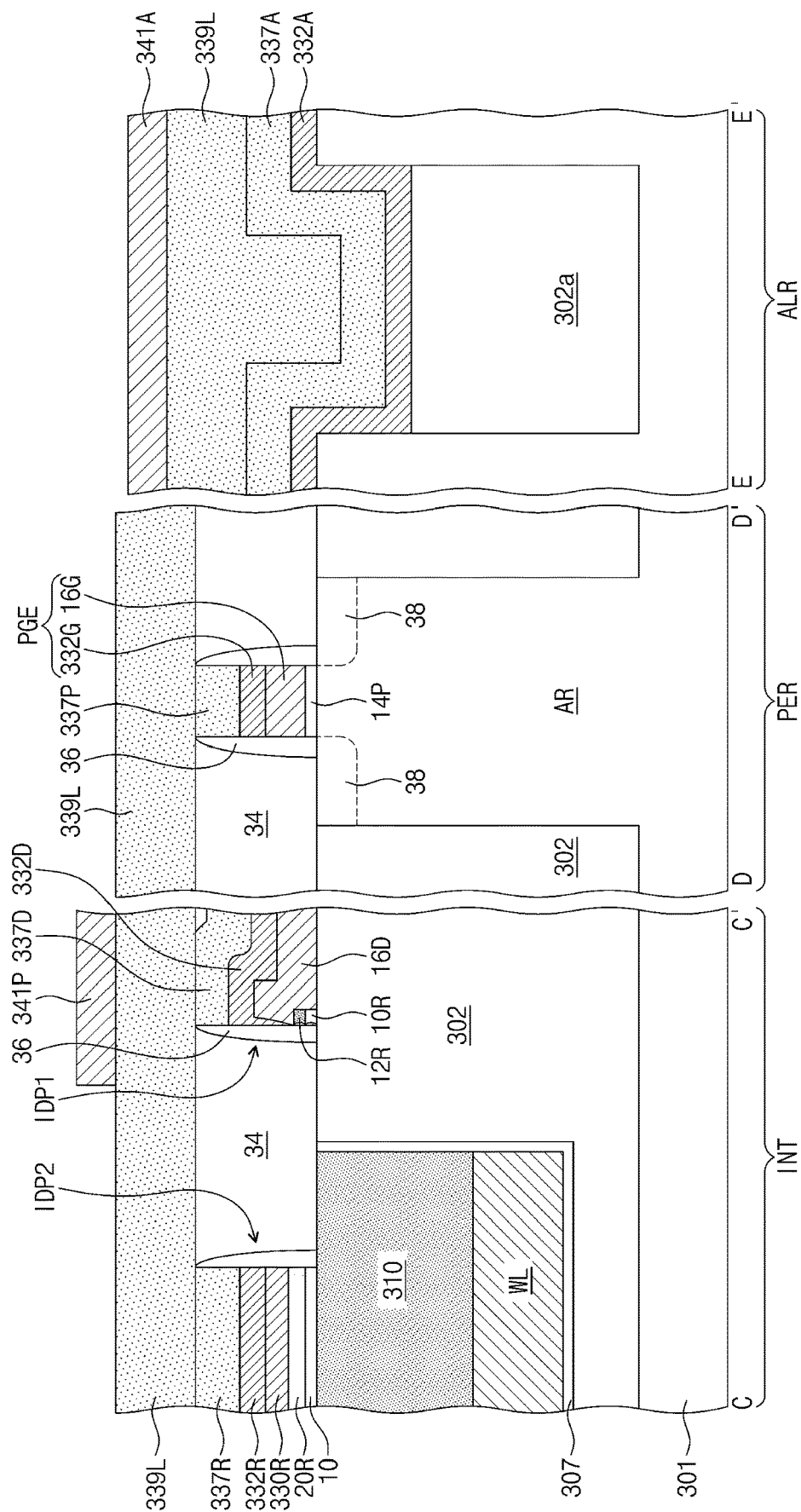
FIG. 1C is a sectional view taken along lines C-C', D-D', and E-E' of FIG. 1A.

FIG. 1A is a plan view illustrating a semiconductor memory device according to an embodiment of the inventive concept. FIG. 1B is a sectional view taken along lines A-A' and B-B' of FIG. 1A. FIG. 1C is a sectional view taken along lines C-C', D-D', and E-E' of FIG. 1A.

Referring to FIGS. 1A to 1C, a substrate 301 may be provided. The substrate 301 may include a cell array region CAR, a peripheral circuit region PER, an interface region INT between the cell array region CAR and the peripheral circuit region PER, and an alignment key region ALR. The substrate 301 may be formed of or include a semiconductor material. For example, the substrate 301 may be a silicon substrate, a germanium substrate, or a silicon-germanium substrate. Device isolation patterns 302 may be disposed in the cell array region CAR and on the substrate 301 to define cell active portions ACT. The device isolation patterns 302 may be formed of or include at least one of oxide materials (e.g., silicon oxide), nitride materials (e.g., silicon nitride), and/or oxynitride materials (e.g., silicon oxynitride). Each of the cell active portions ACT may have an isolated shape. Each of the cell active portions ACT may be a bar-shaped pattern extending in a first direction D1, when viewed in a plan view. The cell active portions ACT may correspond to respective portions of the substrate 301, which are enclosed by the device isolation patterns 302 when viewed in a plan view. The cell active portions ACT may be arranged to be parallel to each other in the first direction D1 and here, end portions of each of the cell active portions ACT may be placed near a center portion of another cell active portion ACT adjacent thereto.

Word lines WL may be disposed to cross the cell active portions ACT. The word lines WL may be disposed in grooves that are formed in the device isolation patterns 302 and the cell active portions ACT. The word lines WL may be parallel to each other and extend in a second direction D2, which is not parallel to the first direction D1. The word lines WL may be spaced apart from each other in a third direction D3 which is different from the first direction D1 and the second direction D2. The word lines WL may be formed of or include a conductive material. A cell gate dielectric layer 307 may be disposed between each of the word lines WL and an inner surface of each of the grooves. Although not shown, bottoms of the grooves may be located at a relatively deep level in the device isolation patterns 302 and at a relatively shallow level in the cell active portions ACT. The cell gate dielectric layer 307 may be formed of or include at least one of thermally-grown oxide materials, silicon nitride, silicon oxynitride, or high-k dielectric materials. In an embodiment, the word lines WL may have uneven bottom surfaces.

A first impurity region 312a may be disposed in a portion of each of the cell active portions ACT located between a pair of word lines WL adjacent to each other in the third direction D3, and a pair of second impurity regions 312b may be respectively disposed in opposite edge regions of each of the cell active portions ACT. In an embodiment, each of the cell active portions ACT may have three impurity regions (e.g., one first impurity region and two second impurity regions). The first and second impurity regions 312a and 312b may be doped with, for example, n-type impurities. The first impurity region 312a may correspond to a common drain region, and each of the pair of second impurity regions 312b may correspond to a source region. Each of the word lines WL and the first and second impurity regions 312a and 312b adjacent thereto may constitute a transistor. The word lines WL may be disposed in the grooves, and in this case, it may be possible to increase a channel length of a channel region, which is located under the word lines WL, within a given planar area. Thus, it may be possible to minimize a short channel effect.

Top surfaces of the word lines WL may be lower than top surfaces of the cell active portions ACT. A word-line capping pattern 310 may be disposed on each of the word lines WL. The word-line capping patterns 310 may be line-shaped patterns, which are extended in a length direction of the word lines WL and fully cover the top surfaces of the word lines WL. The word-line capping patterns 310 may fill the grooves on the word lines WL. For example, the word-line capping pattern 310 may be formed of or include silicon nitride. The cell gate dielectric layer 307 may be extended into regions between the word-line capping pattern 310 and the device isolation pattern 302 and between the word-line capping pattern 310 and the substrate 301.

In the cell array region CAR, a first buffer layer 10 (i.e., a first buffer pattern) and a second buffer pattern 20P may be sequentially stacked on the substrate 301. The first and second buffer patterns 10 and 20P may be formed of or include the same insulating material as the device isolation pattern 302. In an embodiment, the first and second buffer patterns 10 and 20P may be formed of or include silicon oxide. The first and second buffer patterns 10 and 20P may cover a top surface of the device isolation pattern 302 and a top surface of the word-line capping pattern 310. In the cell array region CAR, the first and second buffer patterns 10 and 20P may be provided to form isolated island-shaped patterns, which are spaced apart from each other when viewed in a plan view. Unless context indicates otherwise, it should be appreciated that reference to a "layer" may refer to a pattern which is formed from the "layer" using a patterning process.

The substrate 301, the device isolation pattern 302, and an upper portion of the word-line capping pattern 310 may be recessed to form a first recess region R1. The first recess region R1 may be provided in a mesh shape, when viewed in the plan view of FIG. 1A. A side surface of the first recess region R1 may be aligned to side surfaces of the first and second buffer patterns 10 and 20P.

Bit lines BL may be disposed on the second buffer pattern 20P. The bit lines BL may be provided to cross the word-line capping patterns 310 and the word lines WL. As illustrated in FIG. 1A, the bit lines BL may be parallel to each other and extend in a third direction D3 crossing the first and second directions D1 and D2. The bit lines BL may include a bit-line polysilicon pattern 330 and a bit-line metal-containing pattern 332, which are sequentially stacked. The bit-line polysilicon pattern 330 may be formed of or include doped or undoped polysilicon. The bit-line metal-containing pattern 332 may be formed of or include at least one of metallic materials (e.g., tungsten, titanium, tantalum, or the like), metal silicide materials (e.g., cobalt silicide or the like), or metal nitride materials (e.g., titanium nitride, tantalum nitride, tungsten nitride, or the like).

A bit-line capping pattern BLC may be disposed on each of the bit lines BL. The bit-line capping pattern BLC may include a first bit-line capping pattern 337C and a second bit-line capping pattern 339C, which are sequentially stacked. The first bit-line capping pattern 337C and the second bit-line capping pattern 339C may have thicknesses different from each other. For example, the second bit-line capping pattern 339C may be thicker than the first bit-line capping pattern 337C. The first bit-line capping pattern 337C and the second bit-line capping pattern 339C may be formed of or include at least one of nitrides (e.g., silicon nitride) and/or oxynitrides (e.g., silicon oxynitride).

Bit-line contacts DC may be disposed in the first recess region R1 crossing the bit lines BL. The bit-line contacts DC may be formed as portions of the bit-line polysilicon pattern 330. For example, portions of the bit-line polysilicon pattern 330 may be extended into the first recess region R1 to serve as the bit-line contacts DC. The bit-line contacts DC may be in contact with the first impurity region 312a. The bit-line contact DC may electrically connect the first impurity region 312a to the bit line BL. A lower gap-fill insulating pattern 341 may be disposed in a portion of the first recess region R1, in which the bit-line contact DC is not provided. The lower gap-fill insulating pattern 341 may be formed of or include silicon nitride or silicon oxynitride. A bottom surface of the lower gap-fill insulating pattern 341 may have an uneven structure. In an example embodiment, the surface of the lower gap-fill insulating pattern 341 may include a portion with a convex bottom surface, a portion with a concave bottom surface, or a portion with a flat bottom surface.

A protection spacer 22 may be interposed between the device isolation pattern 302, which constitutes the side surface of the first recess region R1, and the lower gap-fill insulating pattern 341. The protection spacer 22 may have a hollow closed-curve shape (e.g., circular or elliptical shape), when viewed in a plan view. The protection spacer 22 may be formed of or include a material different from the lower gap-fill insulating pattern 341. When viewed in the A-A' section of FIG. 1B, the protection spacer 22 may have an 'L'-shaped section. An upper portion (e.g., provided with the first impurity region 312a) of the substrate 301, which is provided near the bottom of the first recess region R1 and is in contact with the bit-line contact DC, may have a top surface protruding above a bottom surface of the first recess region R1. For example, the upper portion of the substrate 301, which is provided near the bottom of the first recess region R1 and is provided with the first impurity region 312a, has an upper side surface that is not covered with the device isolation pattern 302 and is exposed. The upper side surface of the substrate 301 may be covered with a first protection remaining pattern 22R1. The first protection remaining pattern 22R1 may be formed of or include the same material as the protection spacer 22. The term "contact," as used herein, refers to a direct connection (i.e., touching) unless the context indicates otherwise.

When viewed in the B-B' section of FIG. 1B, the upper side surface of the word-line capping pattern 310 constituting the side surface of the first recess region R1 is not aligned to the side surfaces of the first and second buffer patterns 10 and 20P, and thus, a staircase structure may be formed between the word-line capping pattern 310 and the first and second buffer patterns 10 and 20P. A portion of the top surface of the word-line capping pattern 310 is not covered with the first buffer layer 10 and may be exposed. For example, the portion of the top surface of the word-line capping pattern 310 is exposed without being covered with the first buffer layer 10. In an example embodiment, the side surfaces of the first and second buffer patterns 10 and 20P, the exposed portion of the top surface of the word-line capping pattern 310 and the upper side surface of the word-line capping pattern 310 may constitute the staircase structure or a stepped side surface of the first recess region R1. The protection spacer 22 may be provided to cover the side surfaces of the first and second buffer patterns 10 and 20P, the top surface (i.e., a first upper surface) of the word-line capping pattern 310, the upper side surface of the word-line capping pattern 310, and a portion of the bottom surface of the first recess region R1. In an example embodiment, the protection spacer 22 may cover (or may be in contact with) the stepped side surface of the first recess region R1 and the portion of the bottom surface of the first recess region R1. The portion of the bottom surface of the first recess region R1 may be defined by a second upper surface of the word-line capping pattern 310 which is lower than the top surface of the word-line capping pattern 310. The top surface of the word-line capping pattern 310 and the second upper surface thereof may be connected to each other via the upper side surface of the word-line capping pattern 310. The protection spacer 22 may have a staircase shape. Near the bottom surface of the first recess region R1, a top portion of the cell gate dielectric layer 307 may be lower than the top surface of the word-line capping pattern 310. A second protection remaining pattern 22R2 may be interposed between the side surface of the upper portion of the substrate 301 provided with the first impurity region 312a and the upper side surface of the word-line capping pattern 310 and may be in contact with the cell gate dielectric layer 307. The second protection remaining pattern 22R2 may be formed of or include the same material as the protection spacer 22.

When viewed in the B-B' section of FIG. 1B, a polysilicon spacer 24 may be disposed between the bit-line contacts DC and the protection spacer 22. In an embodiment, the polysilicon spacer 24 may be used to protect the protection spacer 22. The polysilicon spacer 24 may include a doped or undoped poly-silicon layer. Near the bottom of the first recess region R1, a side surface of the polysilicon spacer 24 may be aligned to a side surface of the protection spacer 22. The polysilicon spacer 24 may be spaced apart from the second protection remaining pattern 22R2.

When viewed in the A-A' section of FIG. 1B, the first recess region R1 may have a substantially mirror symmetric shape. The bit-line contact DC may be disposed at the center of the first recess region R1. Opposite side surfaces of the first recess region R1 may be covered with the protection spacer 22. The protection spacers 22 respectively covering the opposite side surfaces of the first recess region R1 may be provided to have substantially mirror symmetry. In the first recess region R1, the lower gap-fill insulating patterns 341 may also be provided to have substantially mirror symmetry.

Storage node contacts BC may be disposed between an adjacent pair of the bit lines BL. The storage node contacts BC may be spaced apart from each other. The storage node contacts BC may include doped or undoped poly-silicon. In a region between the bit lines BL, an insulating pattern (not shown) may be disposed between the storage node contacts BC. The storage node contacts BC may be provided to penetrate the second buffer pattern 20P and the first buffer layer 10 and to be in contact with the second impurity region 312b. The storage node contact BC may have a rounded bottom surface. The bottom surface of the storage node contact BC may be concave with an inflection point PT1 on an interface between the protection spacer 22 and a first sub-spacer 321. In an example embodiment, the bottom surface of the storage node contact BC may include a first concave bottom surface and a second concave bottom surface divided by the inflection point PT1. The first concave bottom surface of the storage node contact BC may be in contact with the protection spacer 22. The second concave bottom surface of the storage node contact BC may be in contact with the first sub-spacer 321. The protection spacer 22 may be formed to be thinner than the first sub-spacer 321.

A bit-line spacer SP may be interposed between the bit line BL and the storage node contact BC. The bit-line spacer SP may include the first sub-spacer 321 and a second sub-spacer 325, which are spaced apart from each other by an air gap region AG. The air gap region AG may be filled with a gaseous material (e.g., the air) or vacuum, whose dielectric constant is lower than that of silicon oxide, and thus, it may be possible to reduce parasitic capacitance between the bit line BL and the storage node contact BC. Furthermore, it may be possible to reduce parasitic capacitance between landing pads LP. This may make it possible to improve reliability of the semiconductor device. The term "air" as discussed herein, may refer to atmospheric air, or other gases that may be present during the manufacturing process.

The first sub-spacer 321 may cover a side surface of the bit line BL and a side surface of the bit-line capping pattern BLC. The second sub-spacer 325 may be adjacent to the storage node contact BC. The first sub-spacer 321 and the second sub-spacer 325 may be formed of or include the same material. For example, the first sub-spacer 321 and the second sub-spacer 325 may be formed of or include silicon nitride. Although not shown, an oxide spacer may be interposed between the second sub-spacer 325 and the lower gap-fill insulating pattern 341.

A top portion of the second sub-spacer 325 may be located at a level that is lower than that of a top portion of the first sub-spacer 321. This may make it possible to increase a process margin in a subsequent process of forming the landing pad LP. Furthermore, it may be possible to prevent a disconnection between the landing pad LP and the storage node contact BC. The first sub-spacer 321 may be extended to cover the side surface of the bit-line contact DC and the side and bottom surfaces of the first recess region R1. The first sub-spacer 321 may be interposed between the lower gap-fill insulating pattern 341 and the protection spacer 22. Near the bottom of the first recess region R1, the first sub-spacer 321 may be in contact with the device isolation pattern 302. The first sub-spacer 321 may also be in contact with the first protection remaining pattern 22R1. In the first recess region R1, the first sub-spacers 321 may also be provided to have substantially mirror symmetry.

The landing pad LP may be disposed on the storage node contact BC. Although not shown, a storage node ohmic layer may be interposed between the storage node contact BC and the landing pad LP. The storage node ohmic layer may be formed of or include at least one of, for example, metal silicide materials (e.g., cobalt silicide). Although not shown, a diffusion prevention pattern may be interposed between the storage node ohmic layer and the landing pad LP. The diffusion prevention pattern may be interposed between the bit-line spacer SP and the landing pad LP and between the bit-line capping pattern BLC and the landing pad LP. In an embodiment, the diffusion prevention pattern may have a conformal thickness. The diffusion prevention pattern may be formed of or include at least one of metal nitride materials (e.g., titanium nitride and tantalum nitride). The landing pad LP may be formed of or include at least one of metal-containing materials (e.g., tungsten). An upper portion of the landing pad LP may cover a top surface of the bit-line capping pattern BLC and may have a width greater than that of the storage node contact BC. A center of the landing pad LP may be shifted from a center of the storage node contact BC in the second direction D2. A portion of the bit line BL may be vertically overlapped with the landing pad LP. In an embodiment, a second recess region R2, which is partly defined by other side surfaces of an upper portion of the bit-line capping pattern BLC, may be provided.

A landing pad separation pattern 42 may be disposed in the second recess region R2. The landing pad separation pattern 42 may be formed of or include at least one of silicon nitride, silicon oxide, or silicon oxynitride.

A data storage pattern DSP may be disposed on the landing pad LP. The data storage pattern DSP may be a bottom electrode of a capacitor, a phase-change pattern, a variable resistance pattern, or a magnetic tunnel junction pattern.

When viewed in the D-D' section of FIG. 1C, peripheral circuits (e.g., a word line decoder, a sense amplifying circuit, and so forth), which are used to apply or sense electrical signals to or from the word and bit lines WL and BL disposed in the cell array region CAR, may be disposed in the peripheral circuit region PER of the substrate 301. The device isolation pattern 302 may be disposed in the peripheral circuit region PER of the substrate 301 to define a peripheral active portion AR. A plurality of peripheral transistors may be disposed on the peripheral active portion AR. As an example, the peripheral transistor may include a peripheral gate electrode PGE, which is provided to cross the peripheral active portion AR, and peripheral source/drain regions 38, which are provided in two regions of the substrate 301 located at opposite sides of the peripheral gate electrode PGE.

The peripheral gate electrode PGE may include a peripheral polysilicon pattern 16G and a peripheral metal pattern 332G, which are sequentially stacked. The peripheral polysilicon pattern 16G may be doped to have a conductivity type different from the bit-line polysilicon pattern 330. In addition, the peripheral polysilicon pattern 16G may be provided to have a doping concentration different from the bit-line polysilicon pattern 330. The peripheral metal pattern 332G may contain the same metallic element as that in the bit-line metal-containing pattern 332.

A peripheral gate dielectric layer 14P may be interposed between the peripheral gate electrode PGE and the substrate 301. A peripheral gate capping pattern 337P may be disposed on the peripheral gate electrode PGE. The peripheral gate capping pattern 337P may be formed of or include the same material as the first bit-line capping pattern 337C. The peripheral gate capping pattern 337P may have the same thickness as the first bit-line capping pattern 337C.

A side surface of the peripheral gate electrode PGE may be covered with a peripheral gate spacer 36. The substrate 301 and the device isolation pattern 302, which are exposed at opposite sides of the peripheral gate electrode PGE, may be covered with a peripheral interlayer insulating layer 34. A top surface of the peripheral interlayer insulating layer 34 may be coplanar with a top surface of the peripheral gate capping pattern 337P. The peripheral interlayer insulating layer 34 and the peripheral gate capping pattern 337P may be covered with a second capping layer 339L. The second capping layer 339L may be formed of or include the same material as the second bit-line capping pattern 339C. The second capping layer 339L may have the same thickness as the second bit-line capping pattern 339C.

When viewed in the C-C' section of FIG. 1C, end portions of the word lines WL may be disposed in the device isolation pattern 302 of the interface region INT. In the interface region INT, a first interfacial dummy pattern IDP1 may be disposed on the device isolation pattern 302. In the interface region INT, a second interfacial dummy pattern IDP2 may be disposed on the word-line capping pattern 310. The second interfacial dummy pattern IDP2 may be a line-shaped pattern which is parallel to the bit line BL when viewed in a plan view.

The first interfacial dummy pattern IDP1 may include a first polysilicon remaining pattern 16D, which is in contact with the device isolation pattern 302, and a first metal remaining pattern 332D, which is provided on the first polysilicon remaining pattern 16D. The first polysilicon remaining pattern 16D may be the same in material, conductivity type, and impurity concentration as the peripheral polysilicon pattern 16G. For example, the first polysilicon remaining pattern 16D and the peripheral polysilicon pattern 16G may be parts of a material layer which may be formed using the same deposition process. The first metal remaining pattern 332D may be formed of or include the same material as the bit-line metal-containing pattern 332. A first capping remaining pattern 337D may be disposed on the first metal remaining pattern 332D. Each of top and bottom surfaces of the first polysilicon remaining pattern 16D may be provided to have a stair shape. The first metal remaining pattern 332D and the first capping remaining pattern 337D may have a shape transcribed from the shape of the top surface of the first polysilicon remaining pattern 16D. A first buffer remaining pattern 10R and a lower buffer remaining pattern 12R may be interposed, in a vertical direction with respect to an upper surface of the device isolation pattern 302, between an end portion of the first polysilicon remaining pattern 16D and the upper surface of the device isolation pattern 302. In an embodiment, the first buffer remaining pattern 10R and the lower buffer remaining pattern 12R may have recessed side surfaces. The first buffer remaining pattern 10R may be formed of or include a material different from that of the lower buffer remaining pattern 12R. A side surface of the first metal remaining pattern 332D may be covered with the peripheral gate spacer 36. A portion of the first metal remaining pattern 332D may be interposed between the peripheral gate spacer 36 and the end portion of the first polysilicon remaining pattern 16D. In an example embodiment, the portion of the first metal remaining pattern 332D may be further interposed between the peripheral gate spacer 36 and the first buffer remaining pattern 10R and between the peripheral gate spacer 36 and the lower buffer remaining pattern 12R.

The second interfacial dummy pattern IDP2 may include a second polysilicon remaining pattern 330R and a second metal remaining pattern 332R which are sequentially stacked. The second polysilicon remaining pattern 330R may be the same as the bit-line polysilicon pattern 330 in terms of material, conductivity type, and doping concentration. For example, the second polysilicon remaining pattern 330R and the bit-line polysilicon pattern 330 may be parts of a material layer which may be formed using the same deposition process. The second metal remaining pattern 332R may be formed of or include the same material as the bit-line metal-containing pattern 332. For example, the second metal remaining pattern 332R and the bit-line metal-containing pattern 332 may be parts of a material layer which may be formed using the same deposition process. A second capping remaining pattern 337R may be disposed on the second metal remaining pattern 332R. A portion of the first buffer layer 10 and a second buffer remaining pattern 20R may be interposed between the second polysilicon remaining pattern 330R and the word-line capping pattern 310. The peripheral interlayer insulating layer 34 may be disposed between the first interfacial dummy pattern IDP1 and the second interfacial dummy pattern IDP2. The second capping layer 339L may be disposed on the first capping remaining pattern 337D and the second capping remaining pattern 337R. In the interface region INT, a peripheral interconnection line 341P may be disposed on the second capping layer 339L. Although not shown, the peripheral interconnection line 341P may be electrically connected to at least one of the peripheral transistors. The peripheral interconnection line 341P may be formed of or include the same material as the landing pad LP. For example, the peripheral interconnection line 341P and the landing pad LP may be parts of a material layer which may be formed using the same deposition process.

When viewed in the E-E' section of FIG. 1C, an alignment device isolation pattern 302a may be disposed in the alignment key region ALR or the substrate 301. A top surface of the alignment device isolation pattern 302a may be lower than the top surface of the substrate 301, and thus, a step difference may occur therebetween. The step difference may serve as a recognizable alignment key in a subsequent (e.g., exposure) process. A metal alignment pattern 332A, a first capping alignment pattern 337A, the second capping layer 339L, and an interconnection alignment pattern 341A may be sequentially stacked on the substrate 301.

FIGS. 2A, 7A, 8A, and 15A are plan views sequentially illustrating a process of fabricating the semiconductor memory device of FIG. 1A. FIGS. 2B, 3A, 4A, 5A, 6A, 7B, 8B, 9A, 10A, 13A, 14A, 15B, 16, and 17 are sectional views sequentially illustrating a process of fabricating the semiconductor memory device of FIG. 1B. FIGS. 2C, 3B, 4B, 5B, 6B, 7C, 9B, 10B, 11, 12, 13B, and 14B are sectional views sequentially illustrating a process of fabricating the semiconductor memory device of FIG. 1C.

Figure 2B:
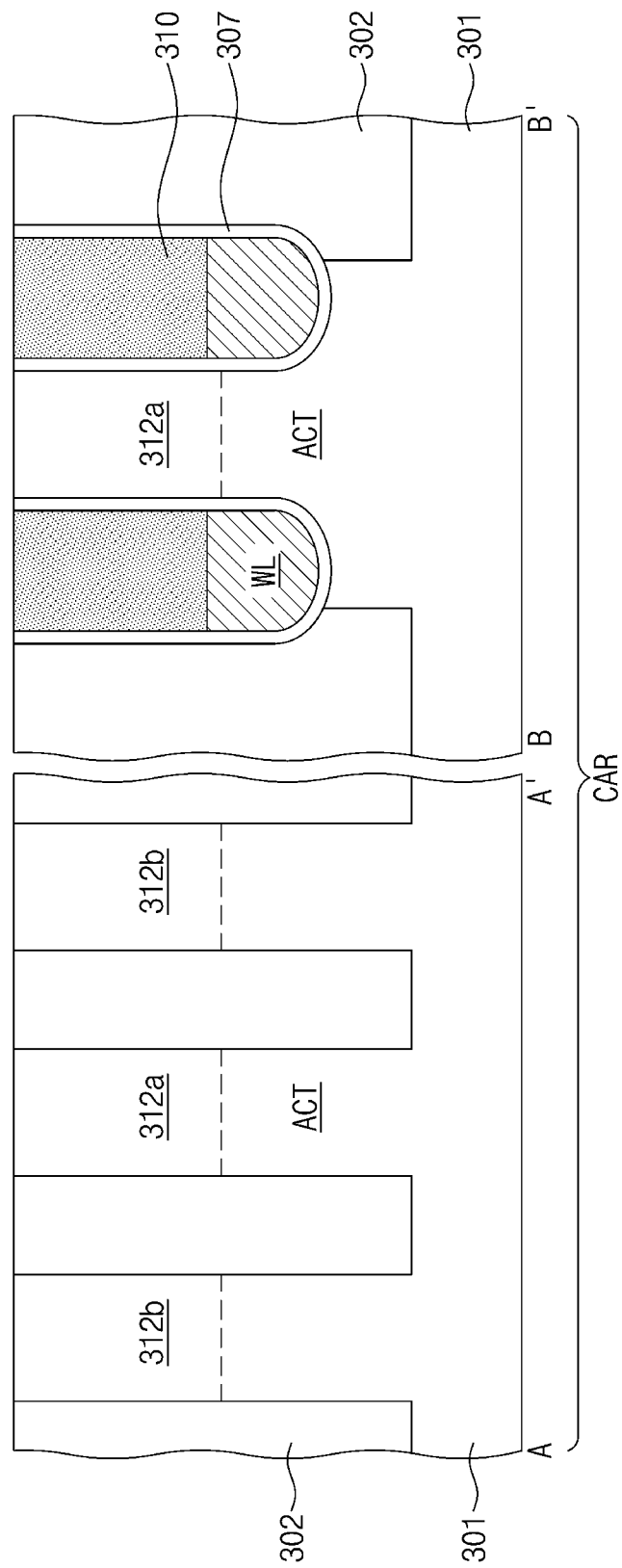
FIGS. 2B, 3A, 4A, 5A, 6A, 7B, 8B, 9A, 10A, 13A, 14A, 15B, 16, and 17 are sectional views sequentially illustrating a process of fabricating the semiconductor memory device of FIG. 1B.
Figure 2C:
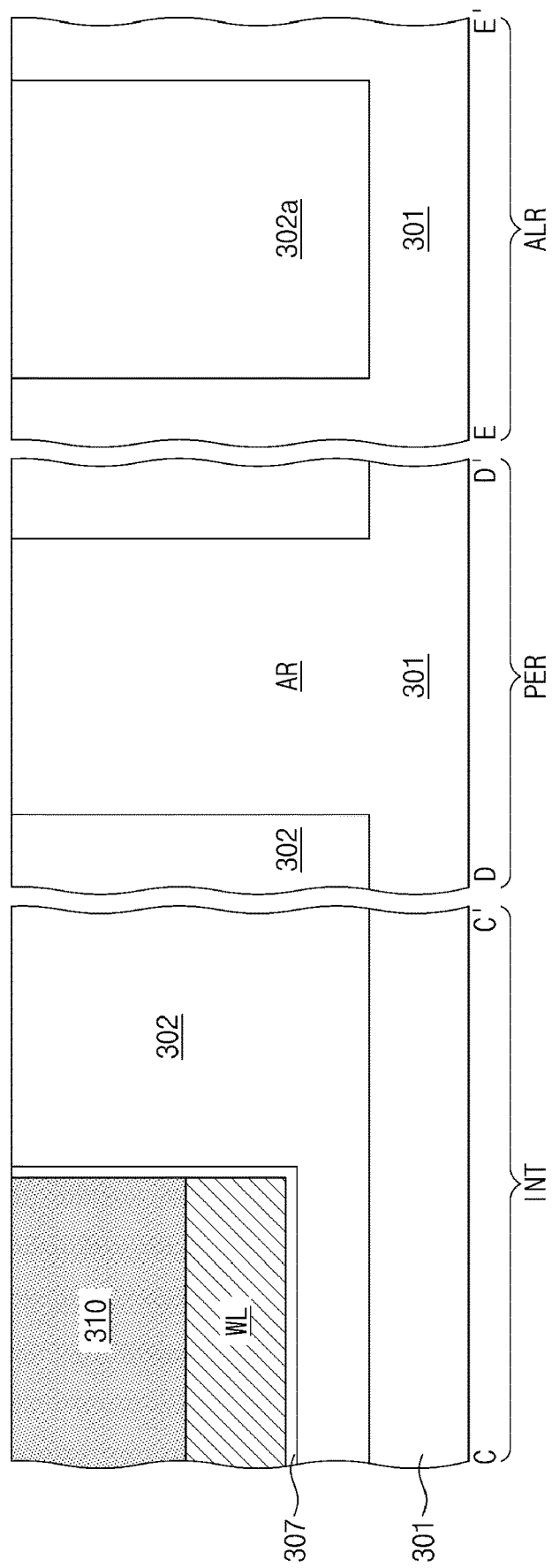

Referring to FIG. 2A to 2C, the device isolation patterns 302 may be formed in the substrate 301 including the cell array region CAR, the peripheral circuit region PER, the interface region INT, and the alignment key region ALR. Accordingly, the cell active portions ACT may be defined in the cell array region CAR, and the peripheral active portions AR may be defined in the peripheral circuit region PER. In addition, the alignment device isolation pattern 302a may be formed in the alignment key region ALR. A device isolation trench may be formed in the substrate 301, and the device isolation patterns 302 may be formed to fill the device isolation trench. The cell active portions ACT and the device isolation patterns 302 may be patterned to form grooves. In an example embodiment, the process condition for the process of etching the substrate 301 and the device isolation patterns 302 may be controlled such that an etch rate of the device isolation patterns 302 is greater than that of the substrate 301. For example, the etching process has etch selectivity of the device isolation patterns 302 with respect to the substrate 301. Accordingly, the grooves may be formed to have uneven bottom surfaces.

The word lines WL may be formed in the grooves, respectively. A pair of the word lines WL may be formed to cross each of the cell active portions ACT. With the pair of the word lines WL, each of the cell active portions ACT may be divided into three regions, as shown in FIG. 2A.

The cell gate dielectric layer 307 may be formed on inner surfaces of the grooves, before the formation of the word lines WL. The cell gate dielectric layer 307 may be formed by a thermal oxidation process, a chemical vapor deposition process, and/or an atomic layer deposition process. The formation of the word lines WL may include forming a gate conductive layer to fill the grooves and performing an etch-back process on the gate conductive layer. The top surfaces of the word lines WL may be recessed to be lower than the top surfaces of the cell active portions ACT. The word-line capping pattern 310 may be formed on the word lines WL, respectively, by stacking an insulating layer (e.g., a silicon nitride layer) on the substrate 301 to fill the grooves and etching the insulating layer. The first and second impurity regions 312a and 312b may be formed by injecting impurities into the cell active portions ACT using the word-line capping patterns 310 and the device isolation pattern 302 as a mask. Although not shown, at least the peripheral circuit region PER may be covered with a mask pattern (not shown), when the first and second impurity regions 312a and 312b are formed. Accordingly, the peripheral circuit region PER is not doped with the impurities.

Figure 3A:
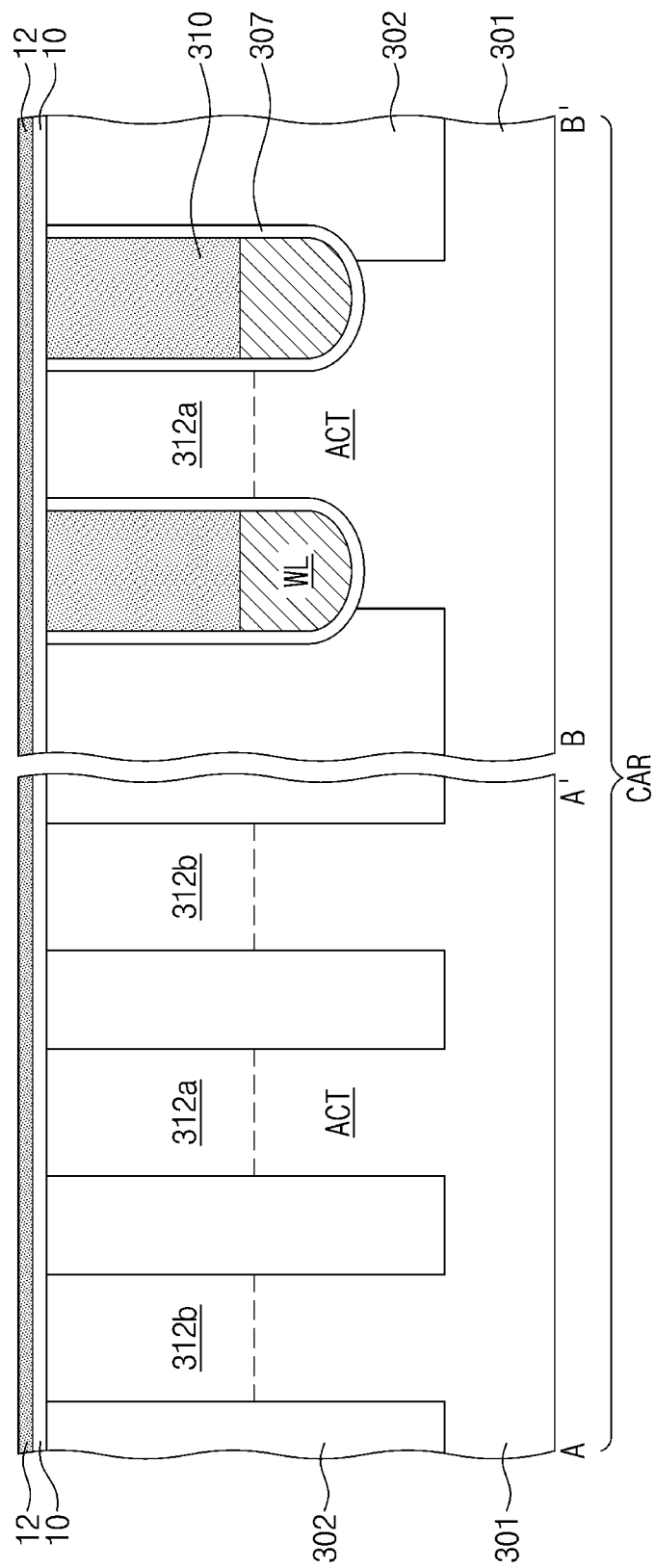
Figure 3B:
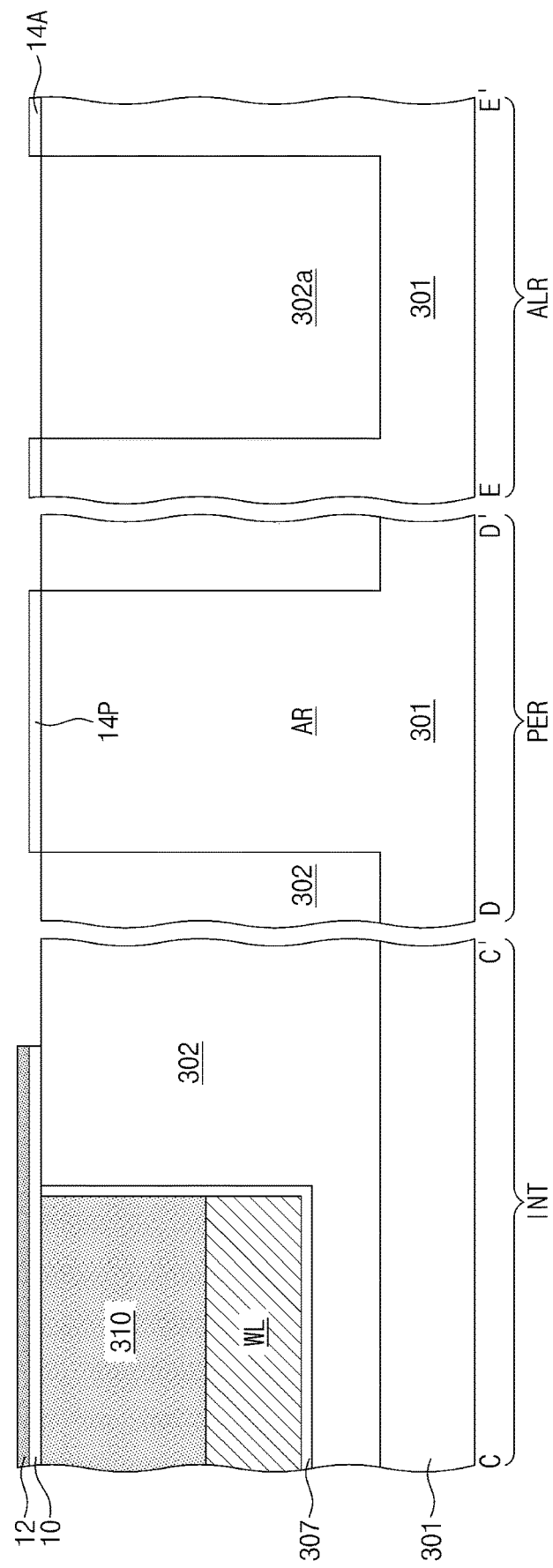

Referring to FIGS. 3A and 3B, the first buffer layer 10 and a lower buffer layer 12 may be sequentially stacked on the substrate 301 to cover the cell array region CAR and a portion of the interface region INT. The lower buffer layer 12 may be formed of or include a material different from the first buffer layer 10. The first buffer layer 10 and the lower buffer layer 12 may be formed to have end portions, which are overlapped with the device isolation pattern 302 in the interface region INT. In an embodiment, the first buffer layer 10 may be formed of or include silicon oxide. The lower buffer layer 12 may be formed of or include silicon nitride. A thermal oxidation process may be performed to form the peripheral gate dielectric layer 14P in the peripheral circuit region PER. Here, the lower buffer layer 12 may be used to block oxygen, and thus, it may be possible to prevent an upper portion of the cell array region CAR of the substrate 301 from being additionally oxidized. Here, an alignment oxide layer 14A may be formed on the alignment key region ALR of the substrate 301, when the peripheral gate dielectric layer 14P is formed.

Figure 4A:
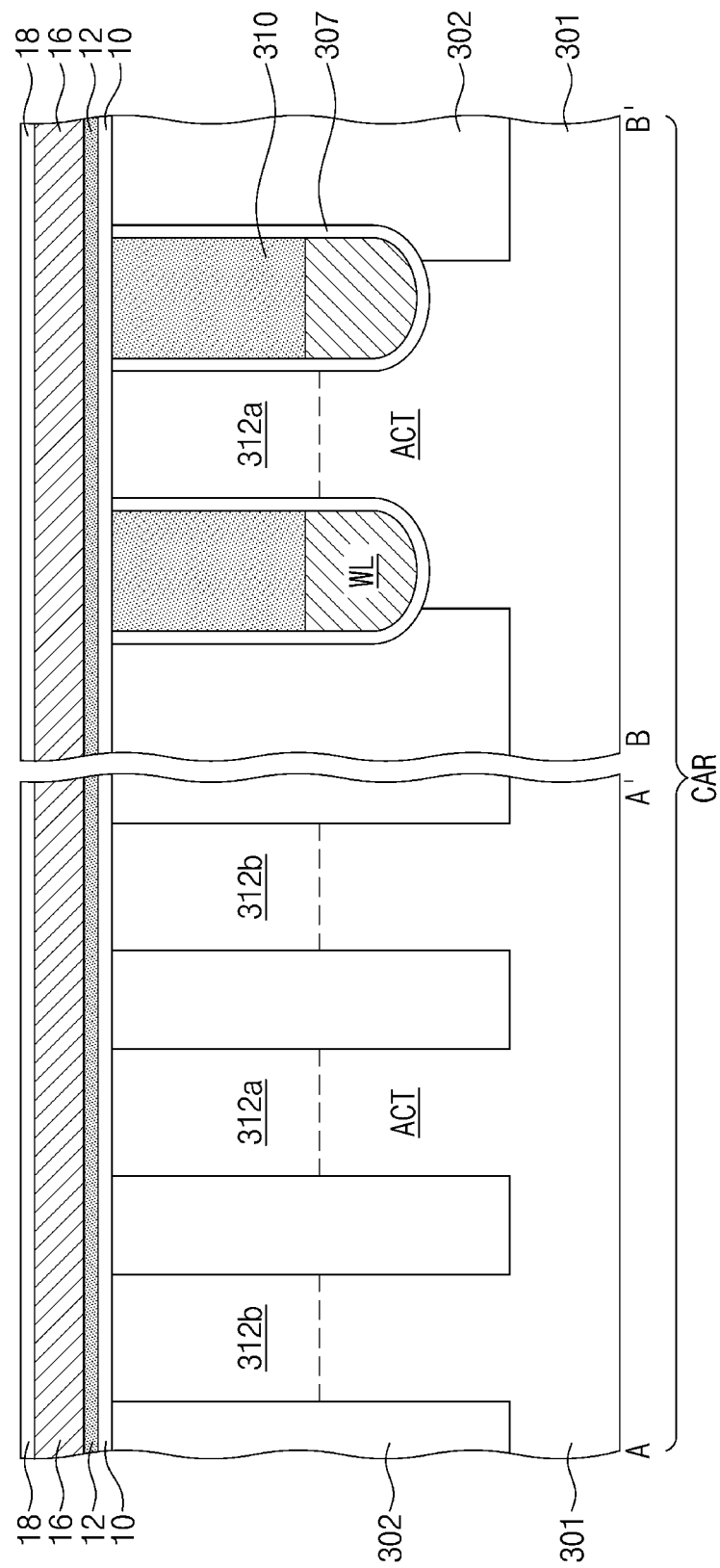
Figure 4B:
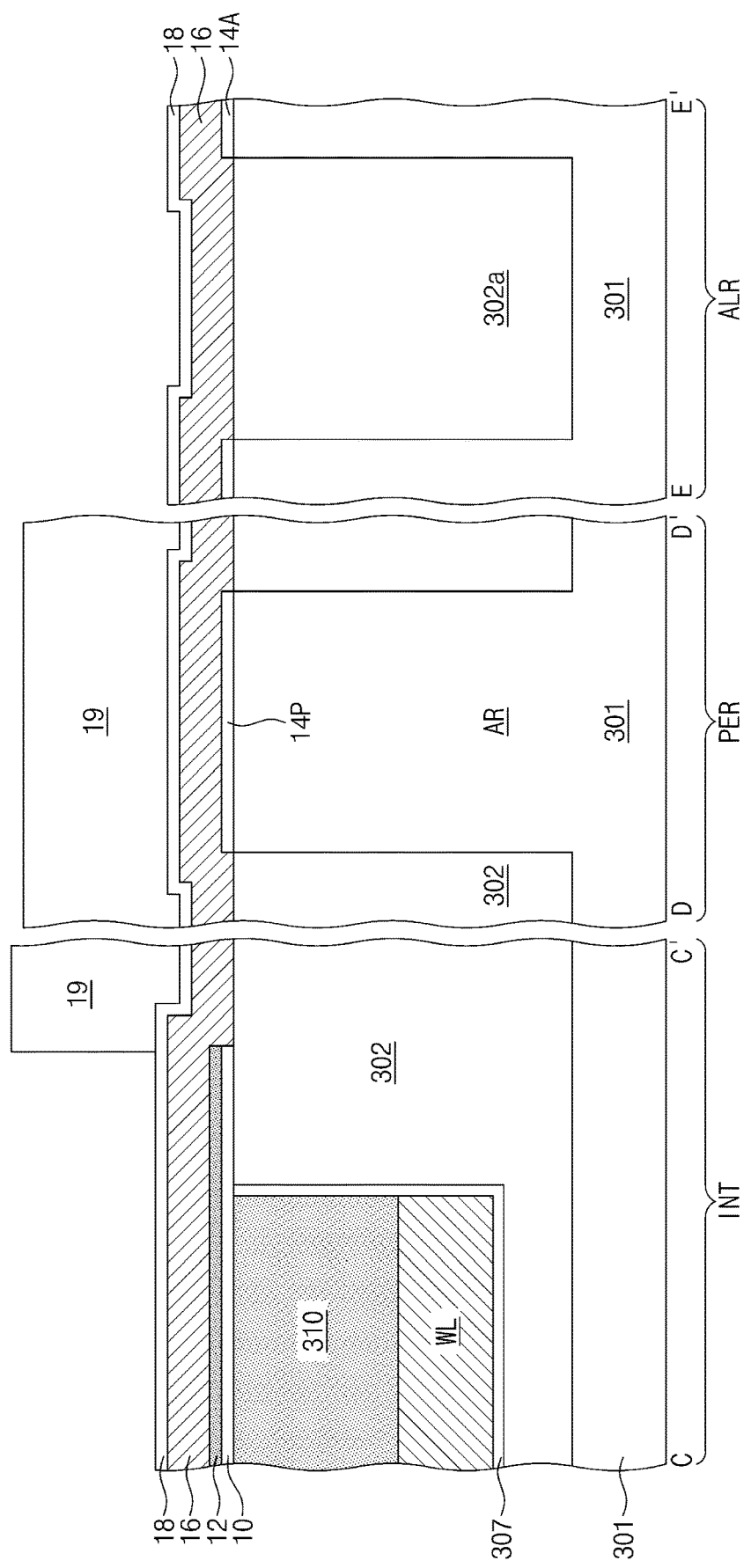

Referring to FIGS. 4A and 4B, a peripheral poly-silicon layer 16 and an infiltration prevention layer 18 may be sequentially stacked on the substrate 301. In an embodiment, the peripheral poly-silicon layer 16 is not doped with impurities to be in an undoped state. The infiltration prevention layer 18 may be formed of a material (e.g., silicon oxide) which is selected to have etch selectivity with respect to the peripheral poly-silicon layer 16. A first mask pattern 19 may be formed on the infiltration prevention layer 18 to cover the peripheral circuit region PER and a portion of the interface region INT. The first mask pattern 19 may be or include at least one of a photoresist pattern, a metal-containing layer, or a silicon nitride layer.

Referring to FIGS. 4A and 4B and FIGS. 5A and 5B, the infiltration prevention layer 18 and the peripheral poly-silicon layer 16 may be removed from the cell array region CAR, which is not covered with the first mask pattern 19, to expose a top surface of the lower buffer layer 12. Here, the infiltration prevention layer 18 and the peripheral poly-silicon layer 16 may be removed from the alignment key region ALR to expose top surfaces of the alignment oxide layer 14A and the alignment device isolation pattern 302a. In an embodiment, a cut side surface of the peripheral poly-silicon layer 16 may be partially recessed.

Referring to FIGS. 5A and 5B and FIGS. 6A and 6B, the first mask pattern 19 may be removed. Thereafter, the lower buffer layer 12 may be removed to expose the top surface of the first buffer layer 10. In the case where the lower buffer layer 12 is formed of a silicon nitride layer, it may be removed using phosphoric acid (e.g., by a phosphoric acid strip process). If the peripheral poly-silicon layer 16 is in a doped state, an apparatus may be contaminated by impurities, which are out-gassed from the peripheral poly-silicon layer 16 during the phosphoric acid strip process. However, according to an embodiment of the inventive concept, since the peripheral poly-silicon layer 16 is in an undoped state, it may be possible to prevent the apparatus contamination issue from occurring in the phosphoric acid strip process. In addition, since, during the phosphoric acid strip process, a top surface of the peripheral poly-silicon layer 16 of the peripheral circuit region PER is covered with the infiltration prevention layer 18, it may be possible to prevent phosphorus (P) atoms in the phosphoric acid from entering the peripheral poly-silicon layer 16. Accordingly, most part of the lower buffer layer 12 may be removed, and in the interface region INT, the lower buffer remaining pattern 12R may be left between the peripheral poly-silicon layer 16 and the first buffer layer 10.

Figure 6A:
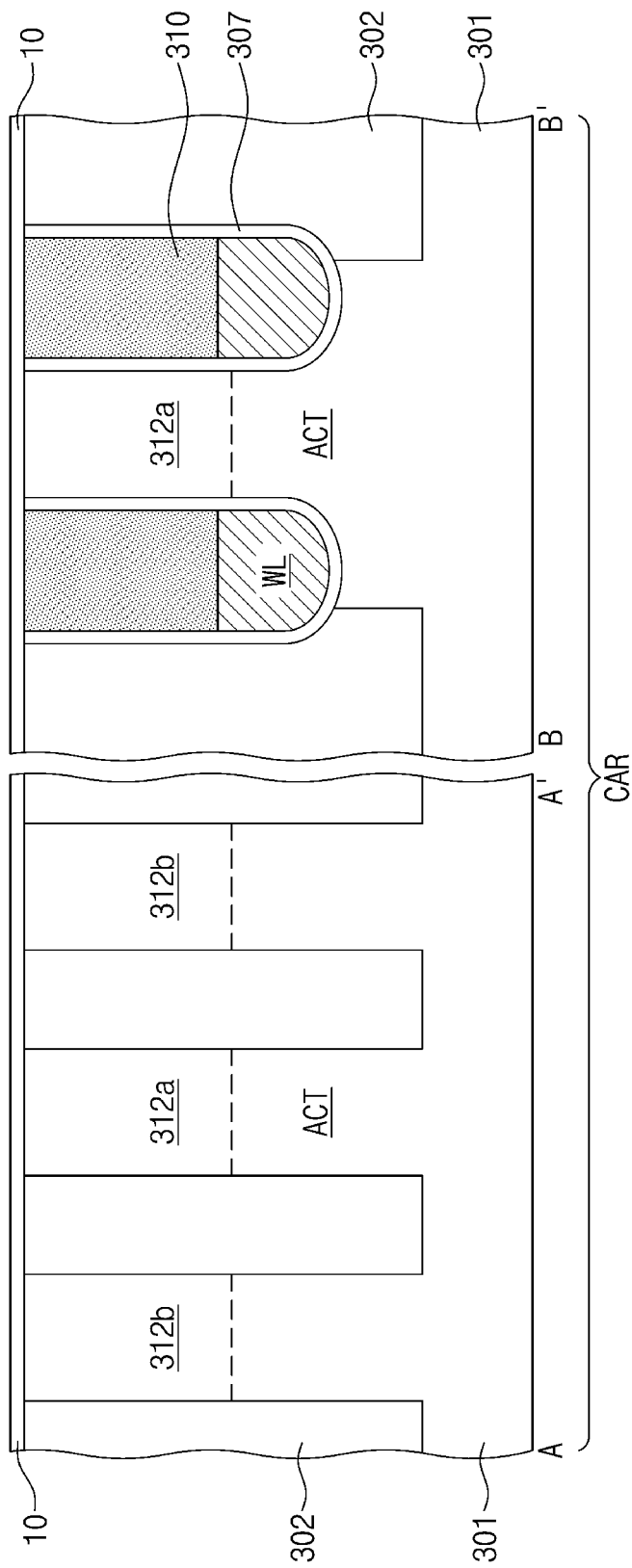
Figure 7A:
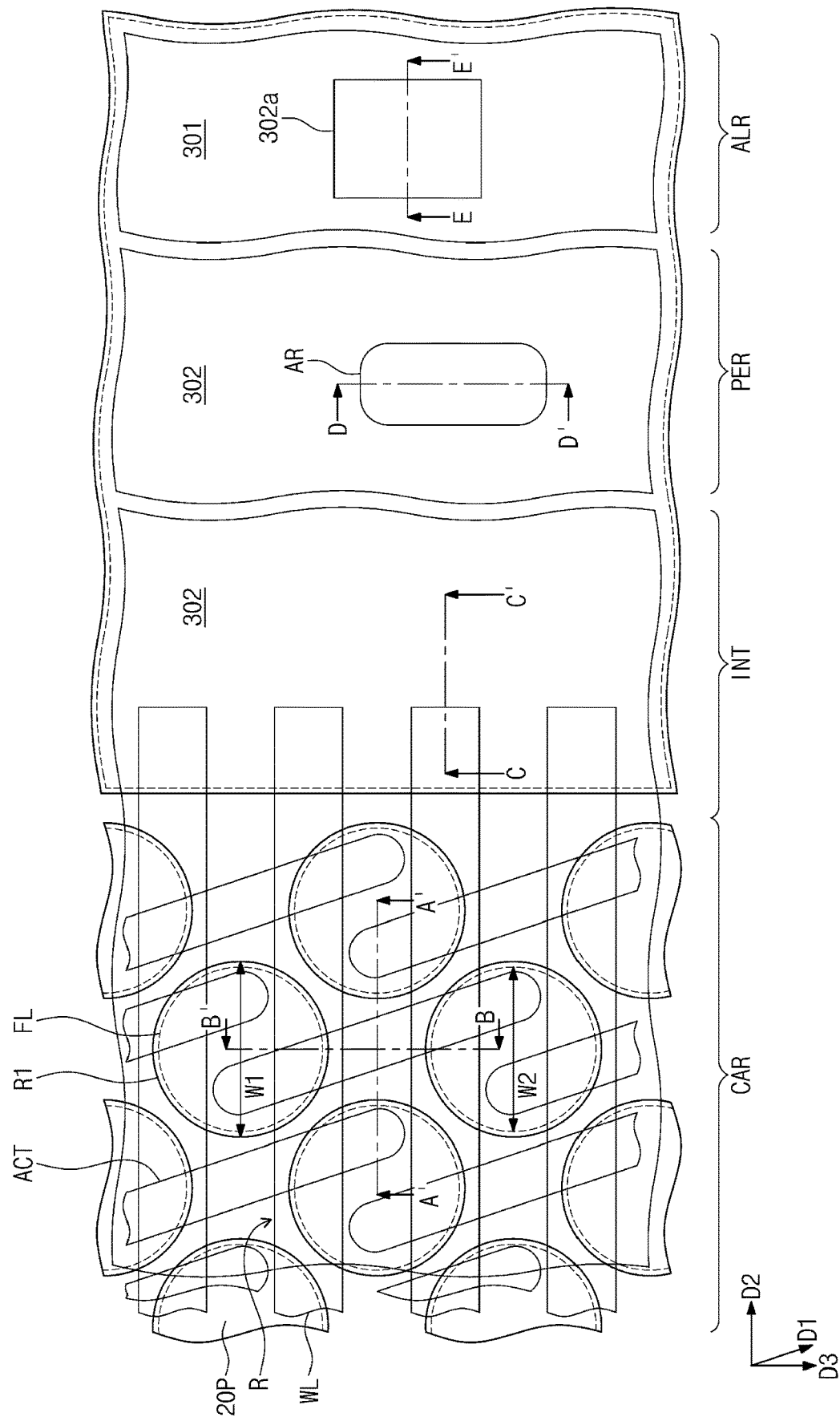

Referring to FIGS. 6A and 6B and FIGS. 7A to 7C, a second buffer layer 20L may be conformally formed on the first buffer layer 10. The second buffer layer 20L may be formed to cover the cell array region CAR, the interface region INT, the peripheral circuit region PER, and the alignment key region ALR. The second buffer layer 20L may be formed of or include the same material as the first buffer layer 10. The first recess region R1 and the second buffer patterns 20P may be formed by removing (e.g., anisotropically etching) the second buffer layer 20L, the first buffer layer 10, the device isolation pattern 302, and a portion of the substrate 301, in which the first impurity region 312*a* is formed, from the cell array region CAR using a mask pattern (not shown). The first recess region R1 may be referred to as a preliminary first recess region, which will be further recessed using an isotropic etching process to form the first recess region R1 of FIG. 8B. The second buffer patterns 20P may be island-shaped patterns, which are spaced apart from each other. As shown in FIG. 7A, the second buffer patterns 20P may have a first width W1, when measured in the second direction D2. When viewed in the A-A' section of FIG. 7B, the second buffer patterns 20P located at the topmost level of the first recess region R1 may be spaced apart from each other by a first distance DS1. The first distance DS1 may be referred to as a first upper width of the first recess region R1. During this step, upper portions of the word-line capping pattern 310 and the cell gate dielectric layer 307 may be partially removed. In an example embodiment, the preliminary first recess region may have a maximum width which may be smaller than the first width W1. In an example embodiment, the maximum width of the preliminary first recess region may be measured at the topmost level of the preliminary first recess region.

Referring to FIGS. 7A to 7C and FIGS. 8A and 8B, an isotropic etching process may be performed. In the case where all of the second buffer pattern 20P, the first buffer layer 10, the device isolation pattern 302, and the cell gate dielectric layer 307 are formed of the same material (e.g., silicon oxide), they may be removed by the same amount, regardless of position. Accordingly, the second buffer pattern 20P, the first buffer layer 10, the device isolation pattern 302, and the cell gate dielectric layer 307 may be conformally removed to have an etch profile, which is defined along a dashed line FL spaced apart from the top surfaces of the first recess region R1 and the second buffer pattern 20P by the same distance. Accordingly, the second buffer pattern 20P may have a second width W2, which is smaller than the first width W1. In addition, an inner width of the first recess region R1 may be increased. For example, at the topmost level of the first recess region R1, the second buffer patterns 20P may be spaced apart from each other by a second distance DS2, which is larger than the first distance DS1. Here, the upper side surface of the substrate 301 may be exposed to the outside through the bottom of the first recess region R1. When viewed in the B-B' section of FIG. 8B, the cell gate dielectric layer 307 may be selectively removed, without substantial etching of the word-line capping pattern 310 and the substrate 301, and thus, a groove may be formed to expose upper side surfaces of the word-line capping pattern 310 and the substrate 301. Furthermore, the top surface of the word-line capping pattern 310 may be partially exposed to the outside. The second distance DS2 may be referred to as a second upper width or inner width of the first recess region R1. As a result of the isotropic etching process, the second buffer layer 20L on the interface region INT, the peripheral circuit region PER, and the alignment key region ALR of FIG. 7C may also be removed or thinned by a specific thickness. In an example embodiment, the isotropic etching process may have etch selectivity of the device isolation pattern 302 (e.g., silicon oxide) with respect to the substrate 301 (e.g., silicon). In an example embodiment, the first recess region R1 may have a maximum width which is smaller than the second width W2. The maximum width of the preliminary first recess region of FIG. 7B may be smaller than that of the recess region R. The maximum width of the first recess region R1 may be measured at the topmost level of the first recess region R1.

Figure 7B:
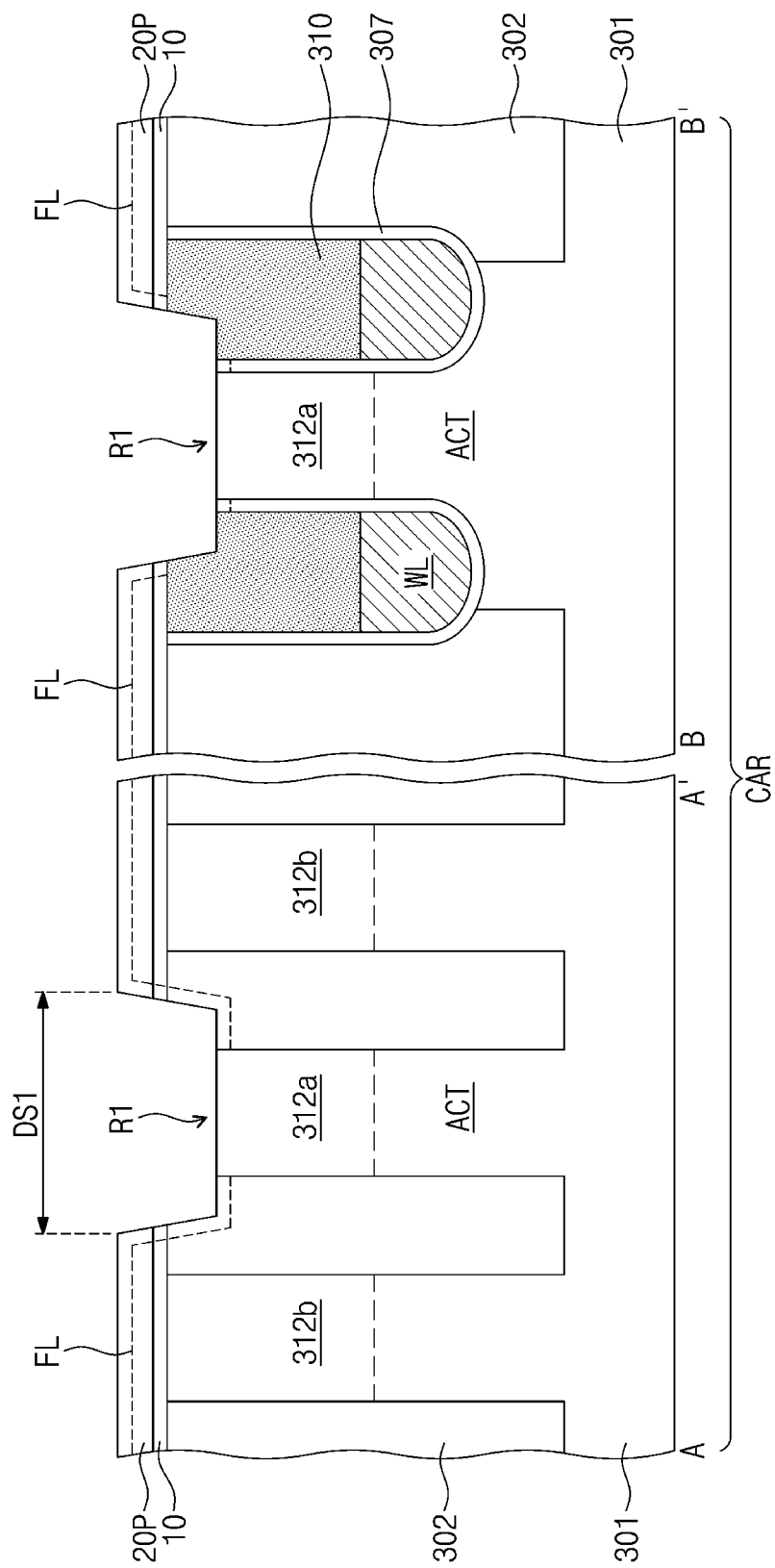
Figure 7C:
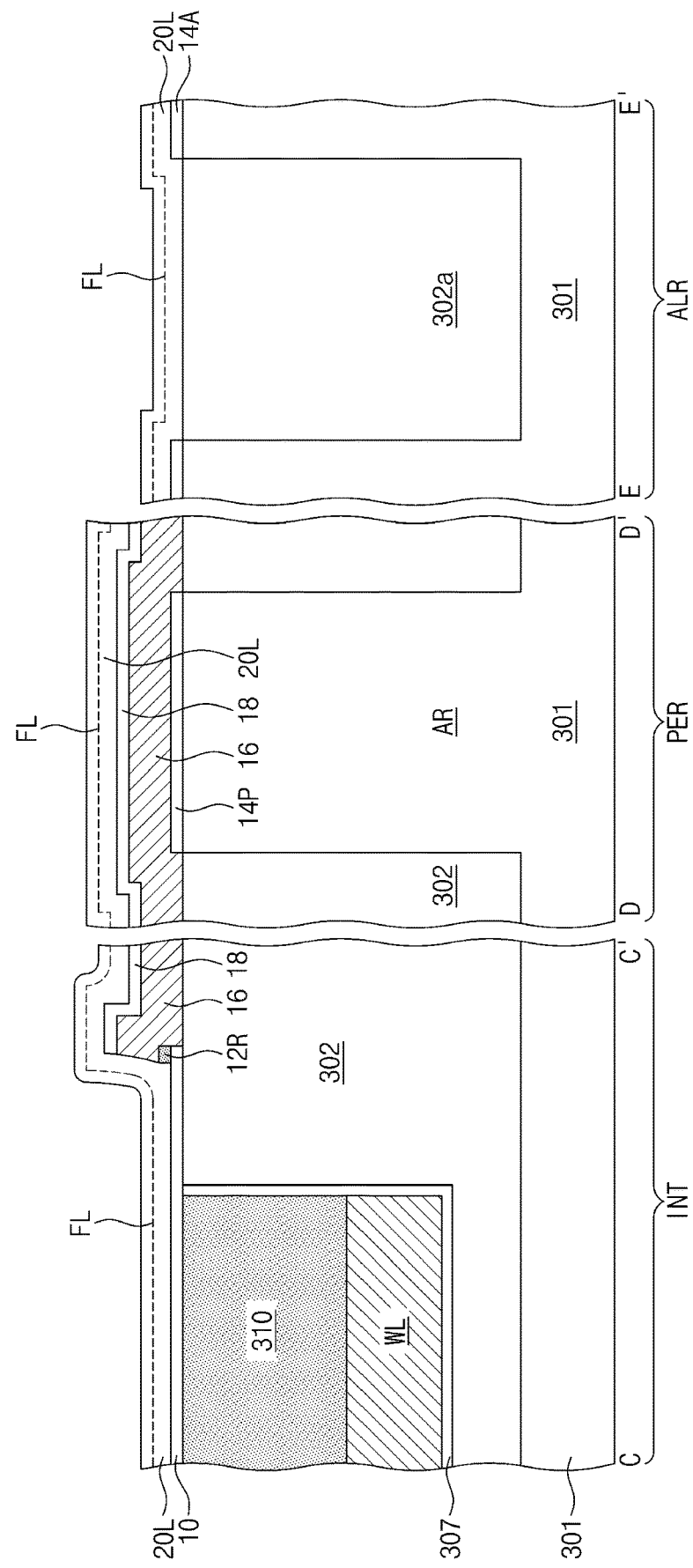
Figure 8A:
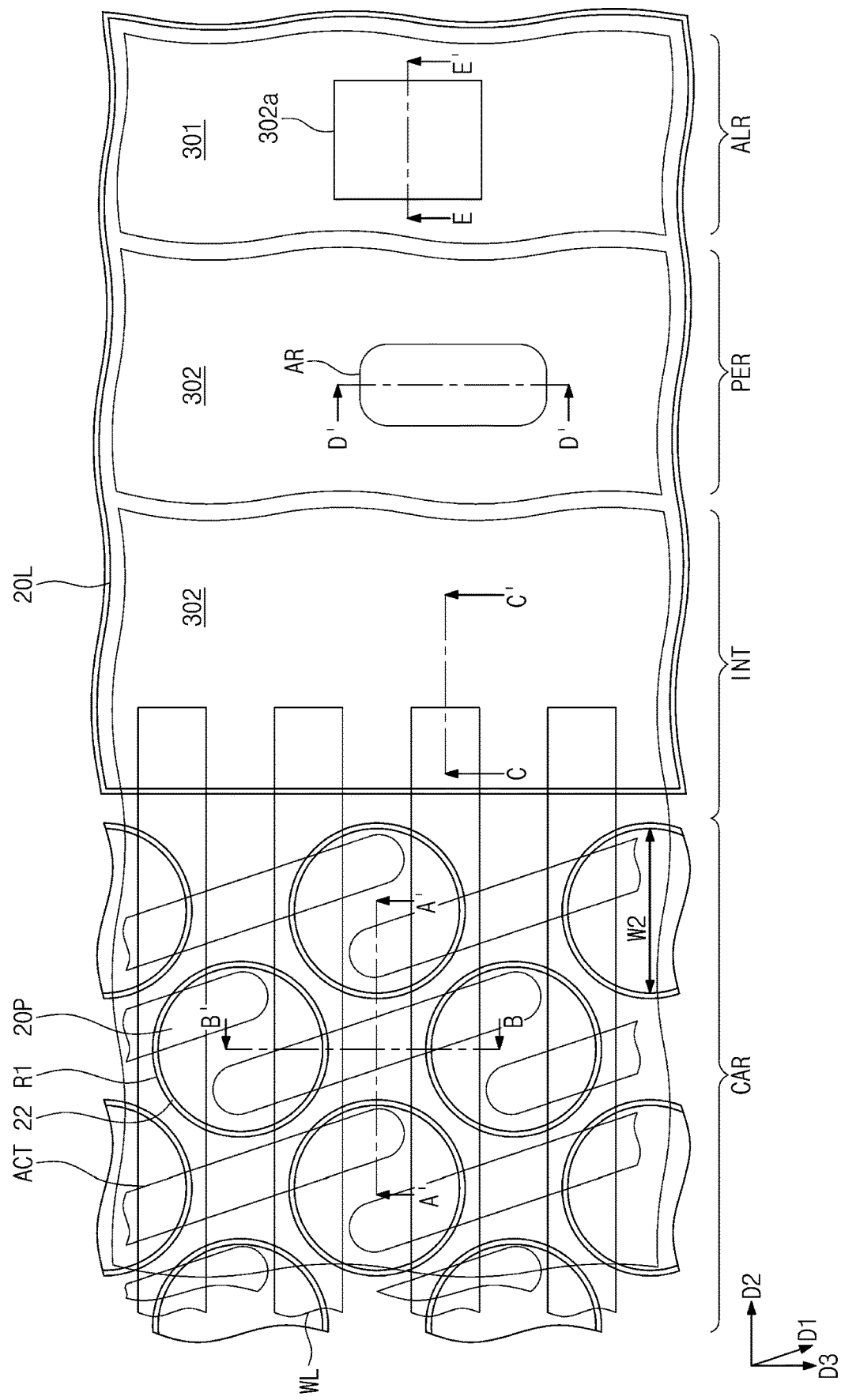
Figure 8B:
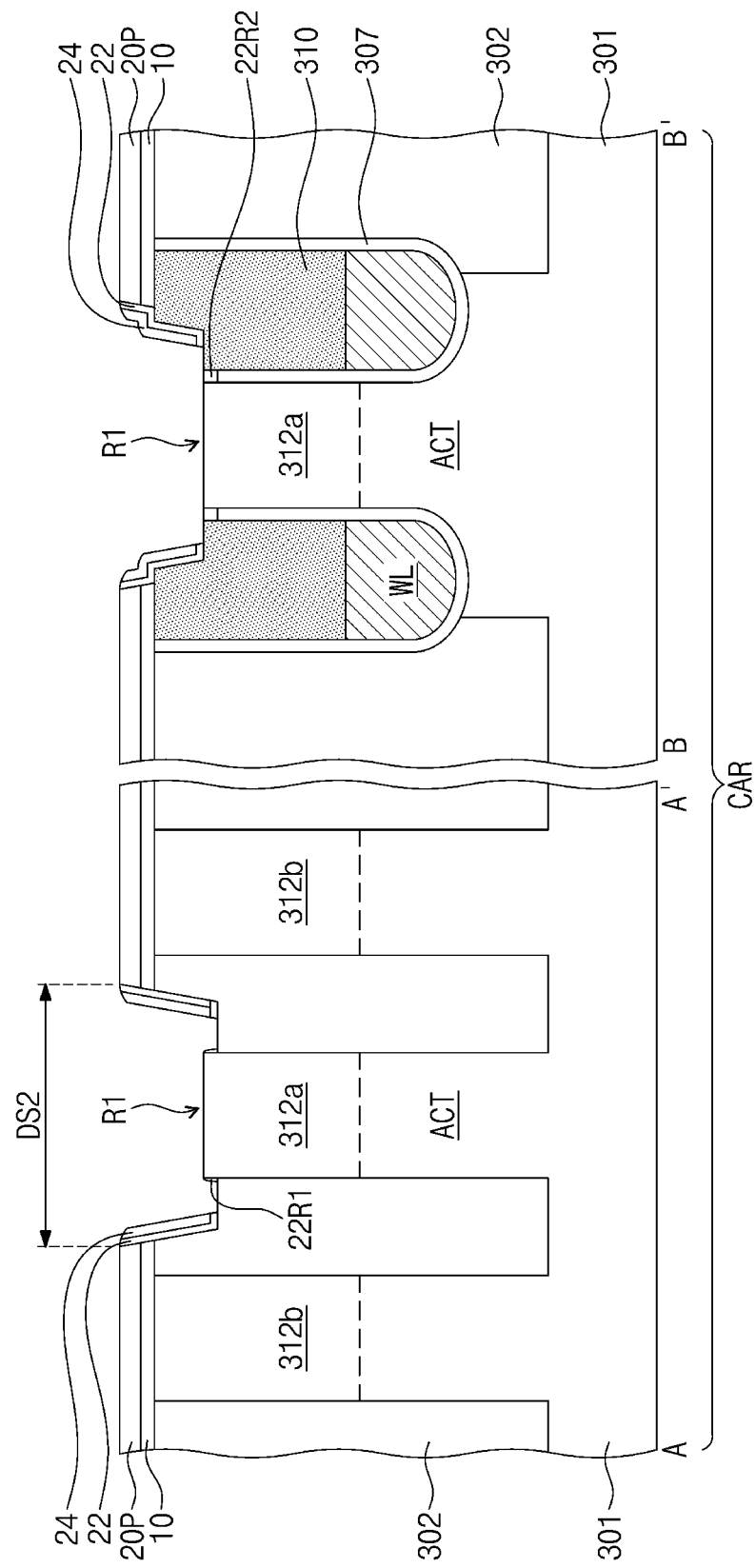

Referring to FIGS. 8A and 8B, a protection layer (not shown) and a poly-silicon layer (not shown) may be sequentially and conformally stacked on the substrate 301 and may be anisotropically etched to form the protection spacer 22 and the polysilicon spacer 24 covering the side surface of the first recess region R1. The protection spacer 22 may be formed to have a thickness that is smaller than a thickness of the second buffer pattern 20P or a thickness of the first buffer layer 10 in FIG. 7B. The thickness of the protection spacer 22 may be measured in a direction perpendicular to a side surface of the first recess region R1. In an embodiment, the protection spacer 22 may be formed of or include at least one of silicon oxide, silicon oxynitride, or silicon nitride. Here, when viewed in the A-A' section of FIG. 8B, the first protection remaining pattern 22R1 may be formed to cover the upper side surface of the substrate 301. In addition, when viewed in the B-B' section of FIG. 8B, the second protection remaining pattern 22R2 interposed between the upper side surface of the word-line capping pattern 310 and the substrate 301 may be formed.

Figure 9A:
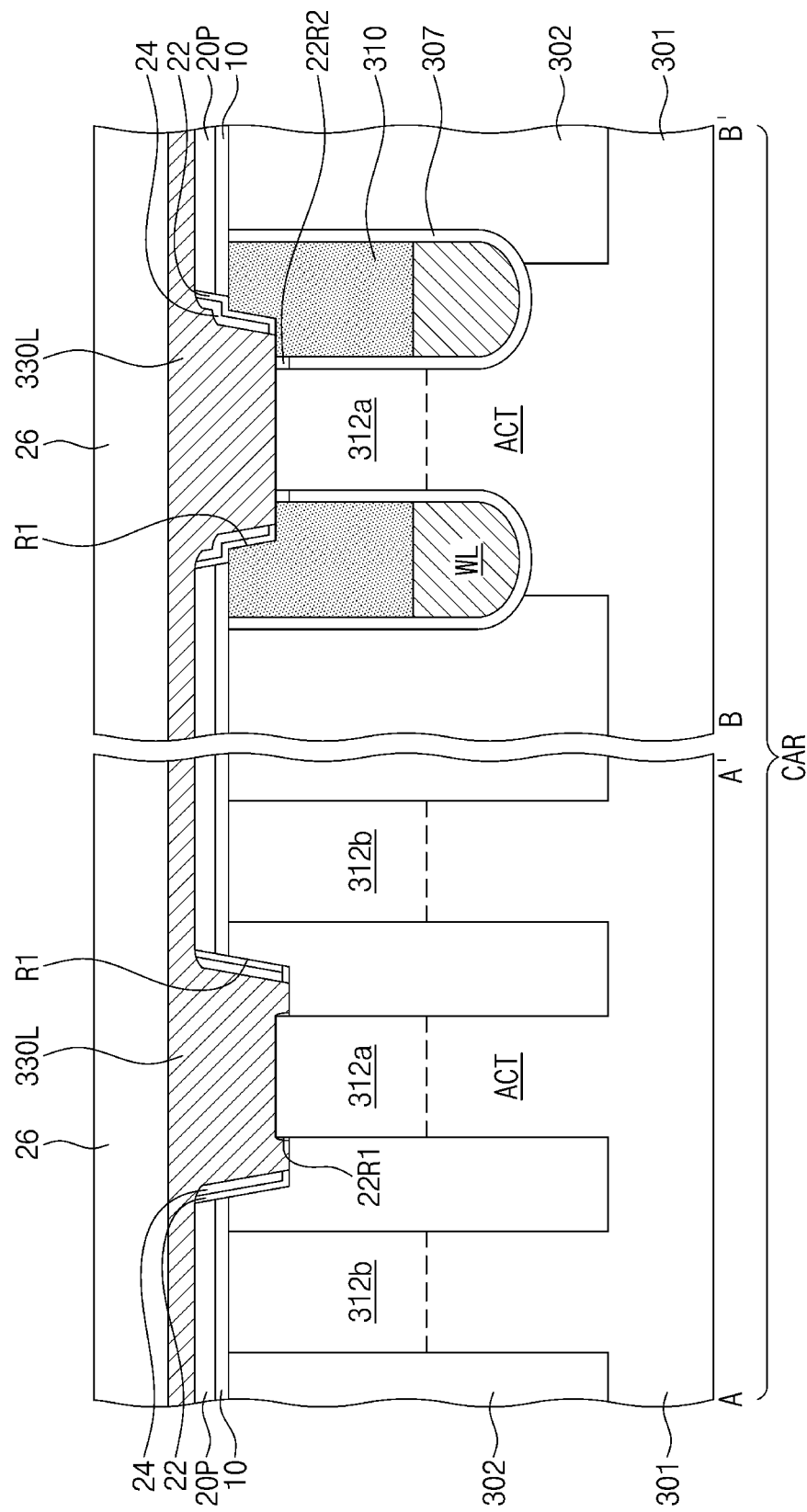
Figure 9B:
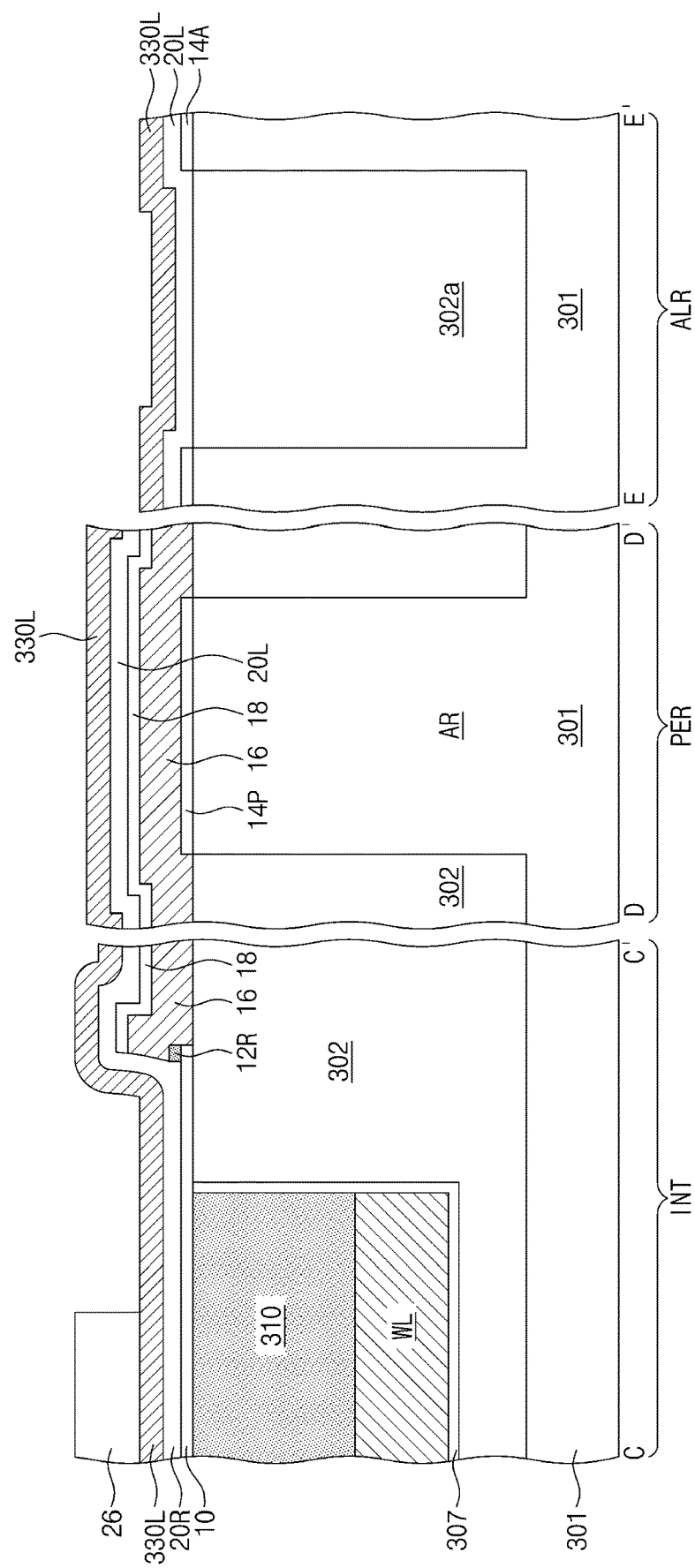
Figure 10A:
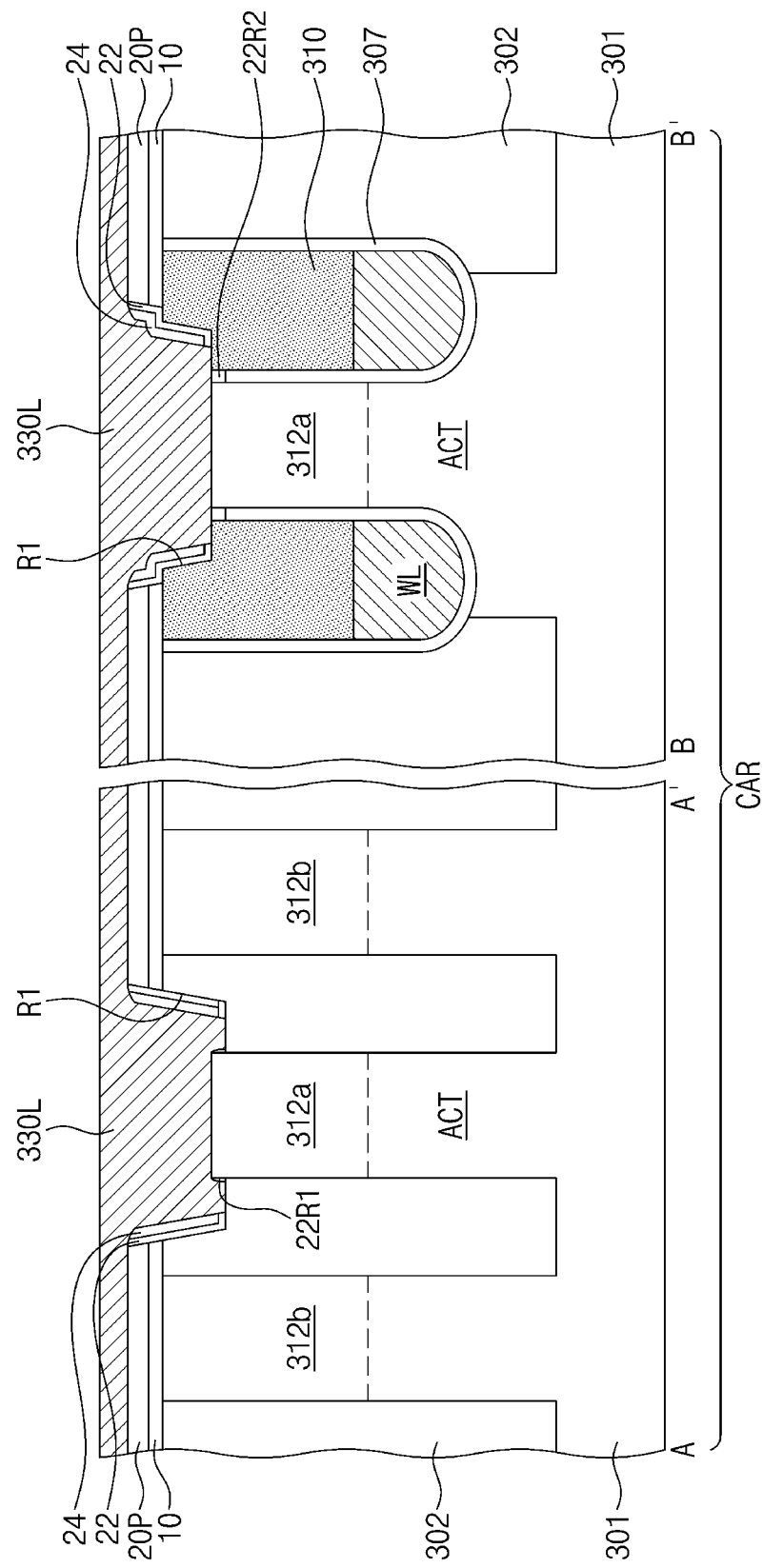
Figure 10B:
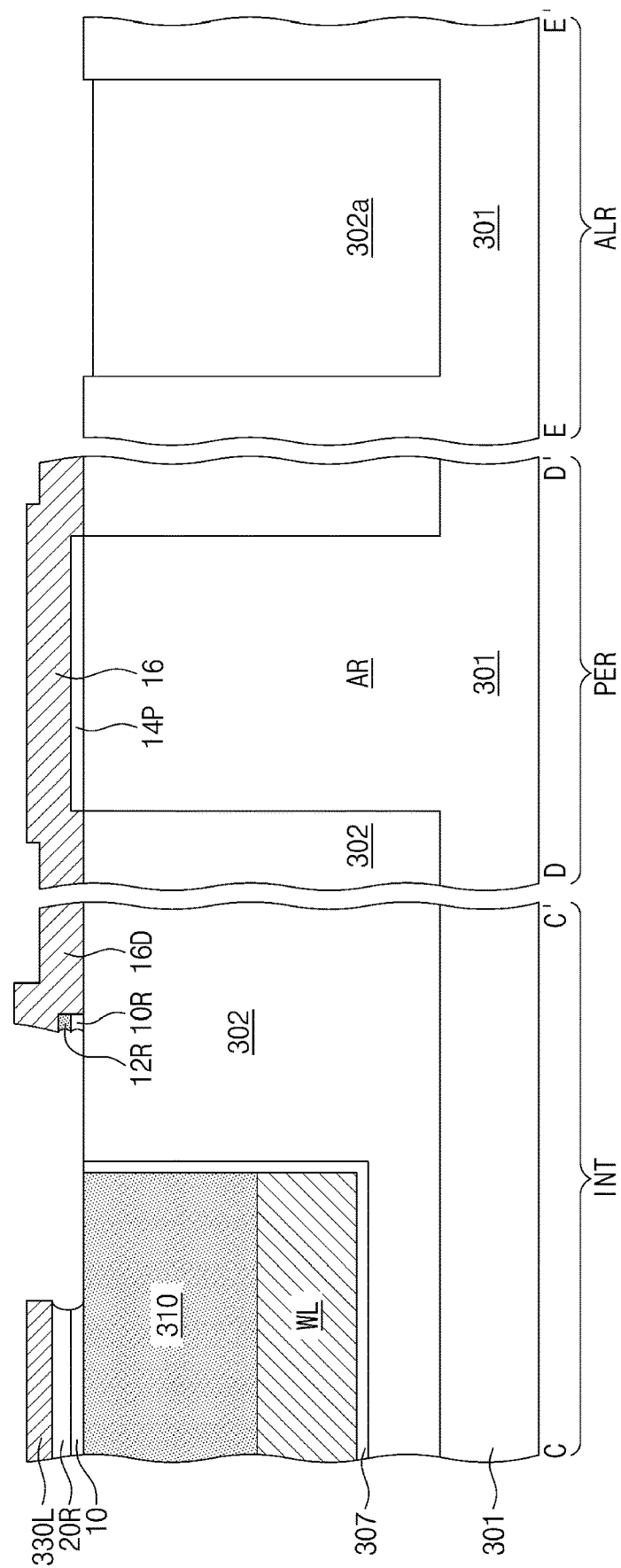

Referring to FIGS. 9A and 9B, a bit-line poly-silicon layer 330L may be formed on the substrate 301 to have a thickness sufficient to fill the first recess region R1. Thereafter, a blanket etch-back process may be performed on the bit-line poly-silicon layer 330L to leave the bit-line poly-silicon layer 330L, which has a specific thickness, on the second buffer pattern 20P. A second mask pattern 26 may be formed on the bit-line poly-silicon layer 330L to cover the cell array region CAR and a portion of the interface region INT. Here, in the interface region INT, an end portion of the second mask pattern 26 may be overlapped with the word line WL.

Referring to FIGS. 9A and 9B and FIGS. 10A and 10B, an anisotropic etching process may be performed to remove the bit-line poly-silicon layer 330L, the second buffer layer 20L, the infiltration prevention layer 18, the first buffer layer 10, and the alignment oxide layer 14A, which are not covered with the second mask pattern 26, from the interface region INT, the peripheral circuit region PER, and the alignment key region ALR. Here, the first buffer remaining pattern 10R may be left between the lower buffer remaining pattern 12R and the device isolation pattern 302 and in the interface region INT. The second buffer remaining pattern 20R may be left on the word-line capping pattern 310 in the interface region INT. The top surface of the device isolation pattern 302 and the top surface of the word-line capping pattern 310 may be exposed in the interface region INT. The top surface of the peripheral poly-silicon layer 16 may be exposed in the peripheral circuit region PER. The top surfaces of the alignment device isolation pattern 302a and the substrate 301 may be exposed in the alignment key region ALR.

Figure 11:
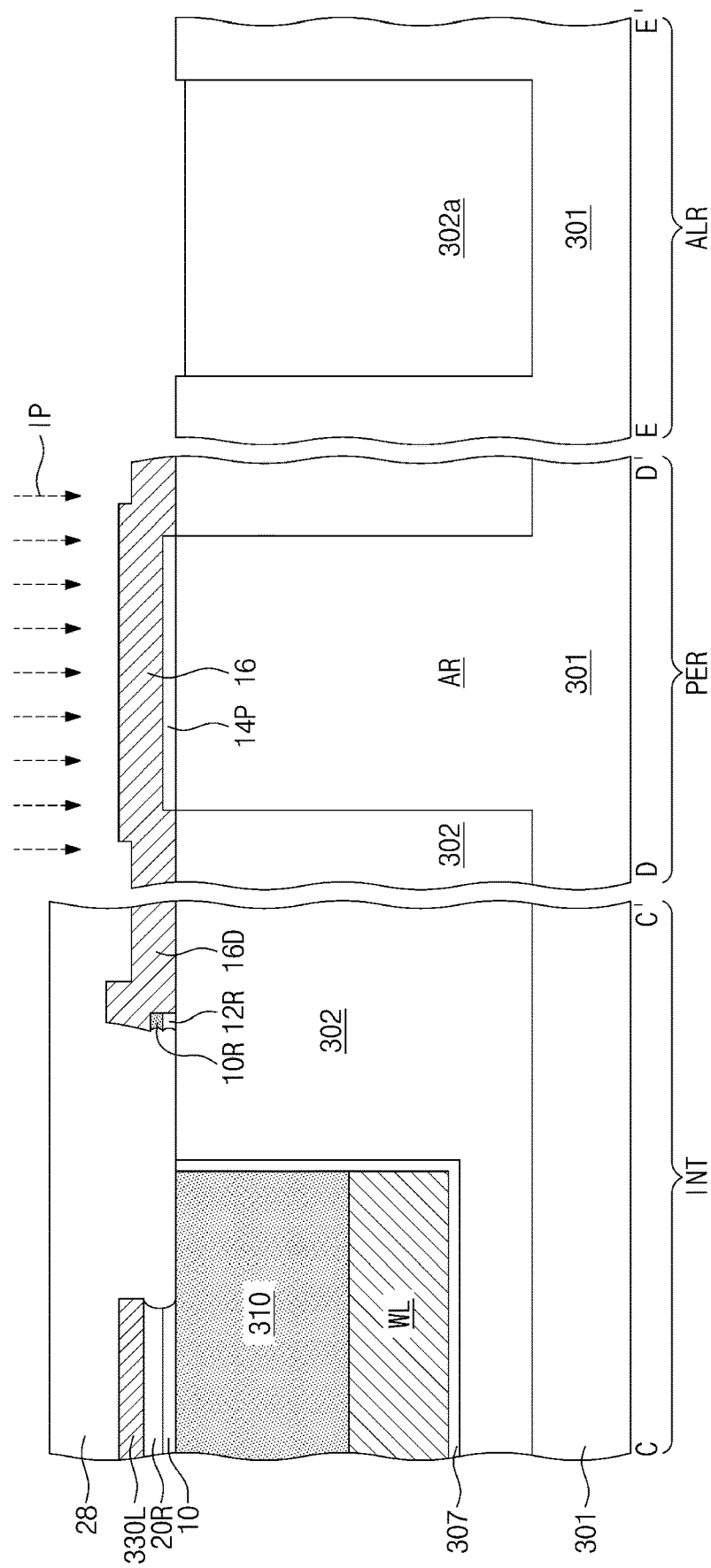

Referring to FIG. 11, a third mask pattern 28 may be formed on the substrate 301 to cover the interface region INT and to expose the peripheral circuit region PER and the alignment key region ALR. Although not shown, the third mask pattern 28 may be formed to cover the cell array region CAR, which is in the state shown in FIG. 10A. Thereafter, an ion implantation process IP may be performed to inject impurities into the peripheral poly-silicon layer 16. The third mask pattern 28 may be, for example, a photoresist pattern or may be formed of or include amorphous carbon layer (ACL) or spin-on-hardmask (SOH) materials.

Figure 12:
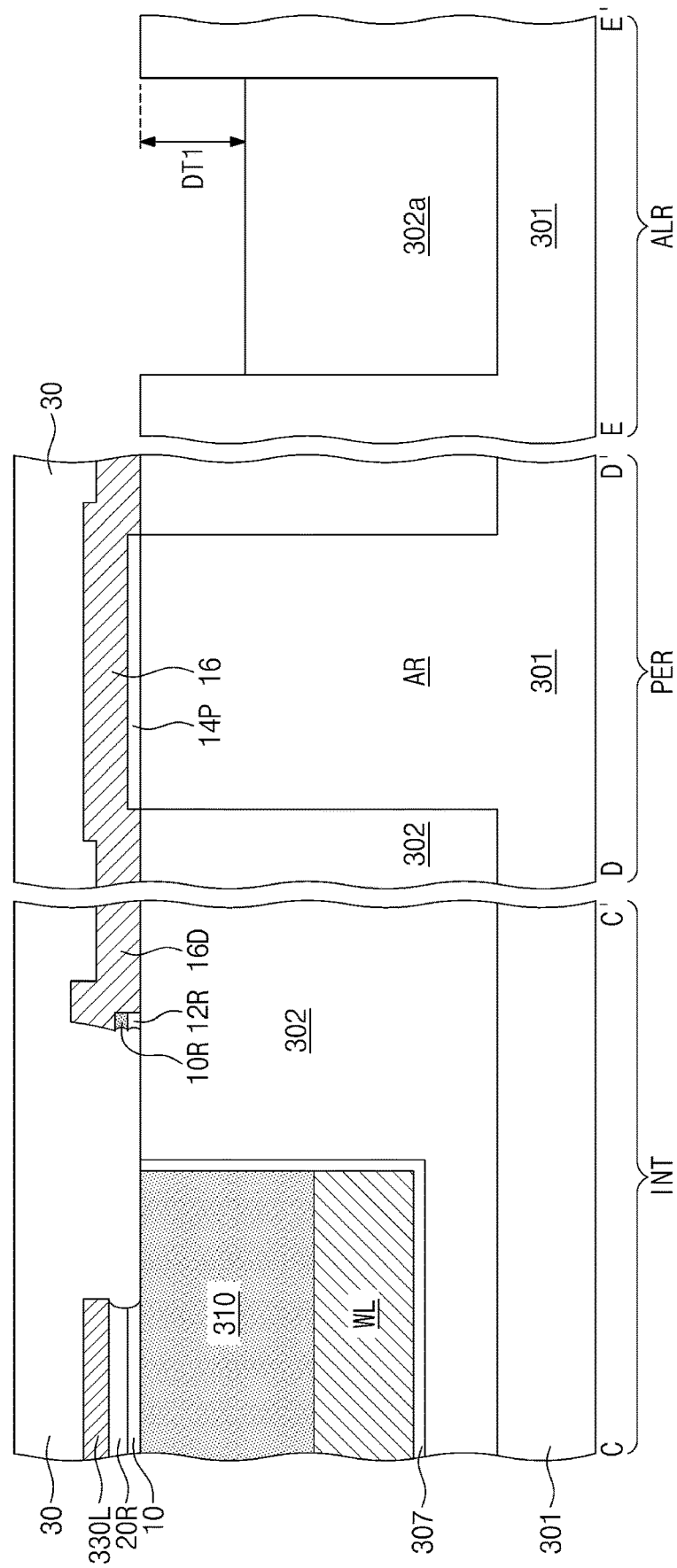

Referring to FIGS. 11 and 12, the third mask pattern 28 may be removed. Thereafter, a fourth mask pattern 30 may be formed on the substrate 301 to cover the interface region INT and the peripheral circuit region PER and to expose the alignment key region ALR. Although not shown, the fourth mask pattern 30 may be formed to cover the cell array region CAR, which is in the state shown in FIG. 10A. Next, an anisotropic etching process may be performed to remove an upper portion of the alignment device isolation pattern 302a, and thus, a staircase structure may be formed in the alignment key region ALR. Accordingly, the top surface of the alignment device isolation pattern 302a may be located at a level that is spaced apart from the top surface of the substrate 301 by a first depth DT1.

Figure 13A:
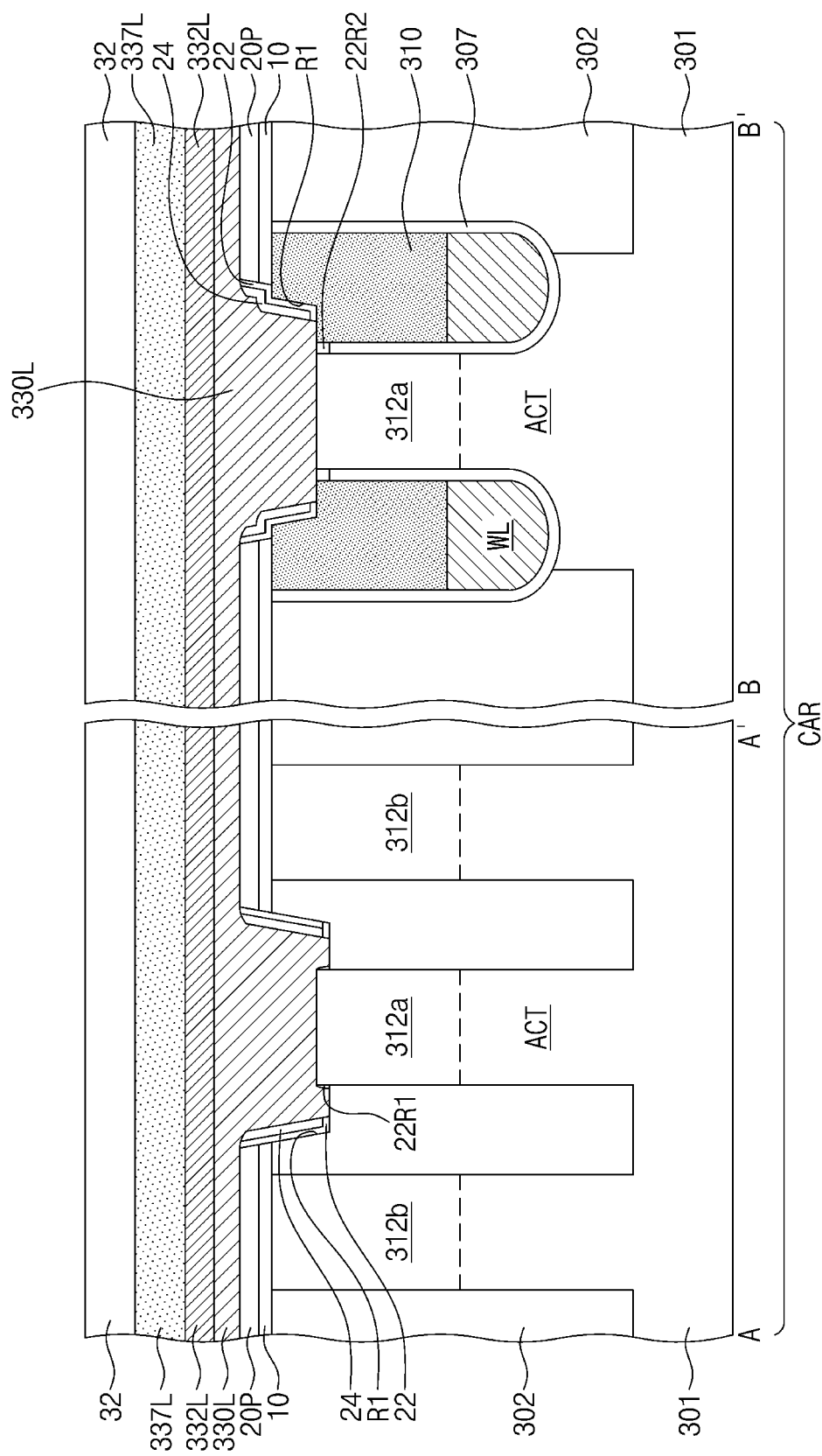
Figure 13B:
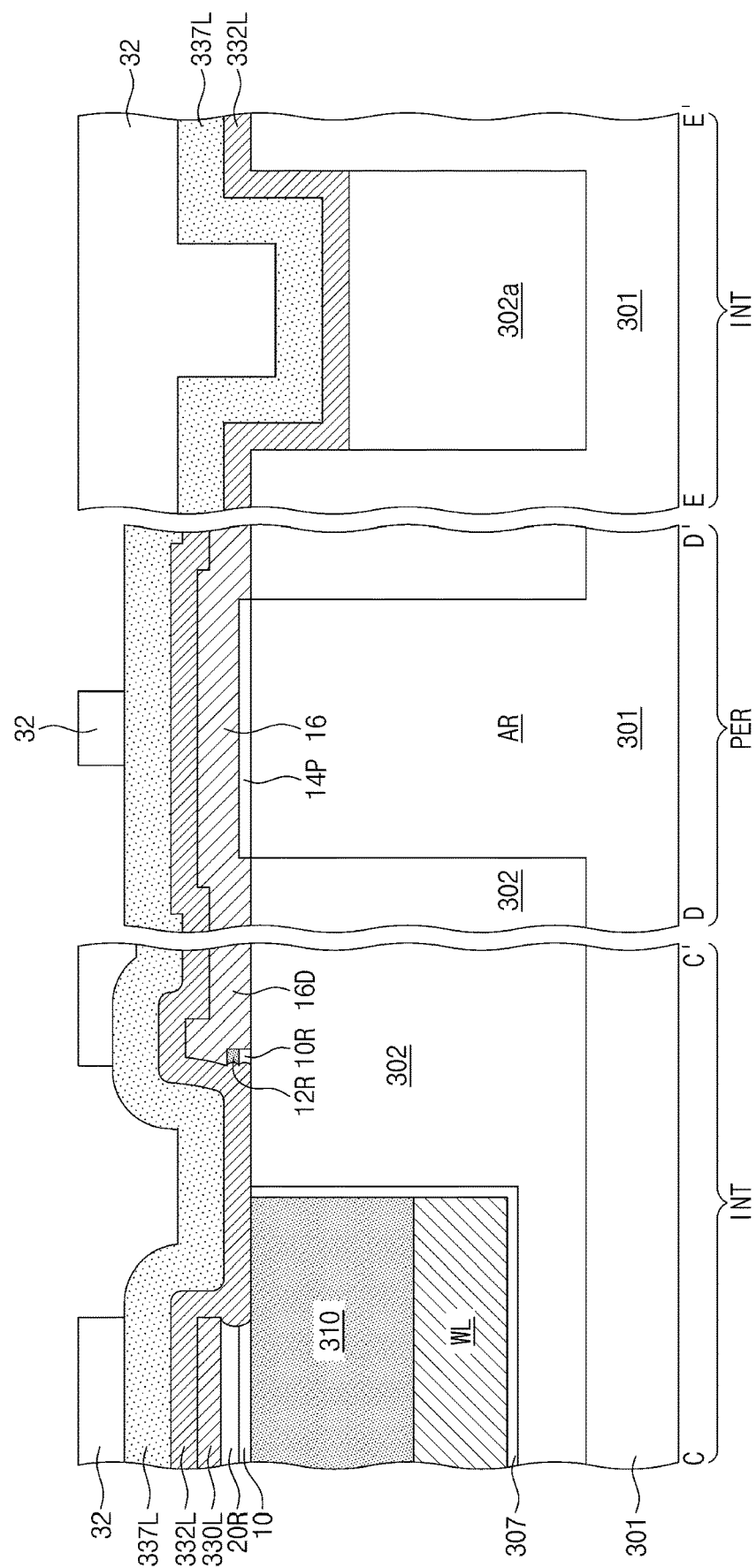

Referring to FIGS. 12, 13A, and 13B, the fourth mask pattern 30 may be removed to expose the bit-line poly-silicon layer 330L. A bit-line metal-containing layer 332L and a first capping layer 337L may be sequentially formed on the substrate 301 to cover the bit-line poly-silicon layer 330L. A fifth mask pattern 32 may be formed on the first capping layer 337L. The fifth mask pattern 32 may be formed to cover the cell array region CAR and the alignment key region ALR and to define a position and a shape of the peripheral gate electrode PGE in the peripheral circuit region PER. In addition, the fifth mask pattern 32 may be formed to define positions and shapes of the first and second interfacial dummy patterns IDP1 and IDP2 of FIG. 1A in the interface region INT.

Referring to FIGS. 13A and 13B and FIGS. 14A and 14B, the first capping layer 337L, the bit-line metal-containing layer 332L, the peripheral poly-silicon layer 16, and the peripheral gate dielectric layer 14P in the peripheral circuit region PER may be sequentially patterned using the fifth mask pattern 32 as an etch mask to expose the substrate 301. Accordingly, the peripheral gate electrode PGE may be formed. In addition, the first interfacial dummy pattern IDP1 and the second interfacial dummy pattern IDP2 may be formed on the interface region INT. The fifth mask pattern 32 may be removed. A spacer layer may be conformally formed on the substrate 301 and then may be anisotropically etched to form the peripheral gate spacer 36. An ion implantation process may be performed to form the peripheral source/drain regions 38. Thereafter, the peripheral interlayer insulating layer 34 may be formed to cover the substrate 301, and a planarization process may be performed on the peripheral interlayer insulating layer 34. Next, the second capping layer 339L may be formed on the peripheral interlayer insulating layer 34.

Referring to FIGS. 14A and 14B and FIGS. 15A and 15B, a sixth mask pattern 40 may be formed on the second capping layer 339L. The sixth mask pattern 40 may be formed to cover the interface region INT, the peripheral circuit region PER, and the alignment key region ALR and to define a position and shape of the bit line BL in the cell array region CAR. The bit line BL, the bit-line capping pattern BLC, and the bit-line contact DC may be formed in the cell array region CAR by successively etching the second capping layer 339L, the first capping layer 337L, the bit-line metal-containing layer 332L, and the bit-line poly-silicon layer 330L using the sixth mask pattern 40 as an etch mask. Here, when viewed in the A-A' section of FIG. 15B, the polysilicon spacer 24 may be etched, and thus, the protection spacer 22 and the first protection remaining pattern 22R1 may be exposed. In addition, the top surface of the second buffer pattern 20P may be exposed.

Figure 15A:
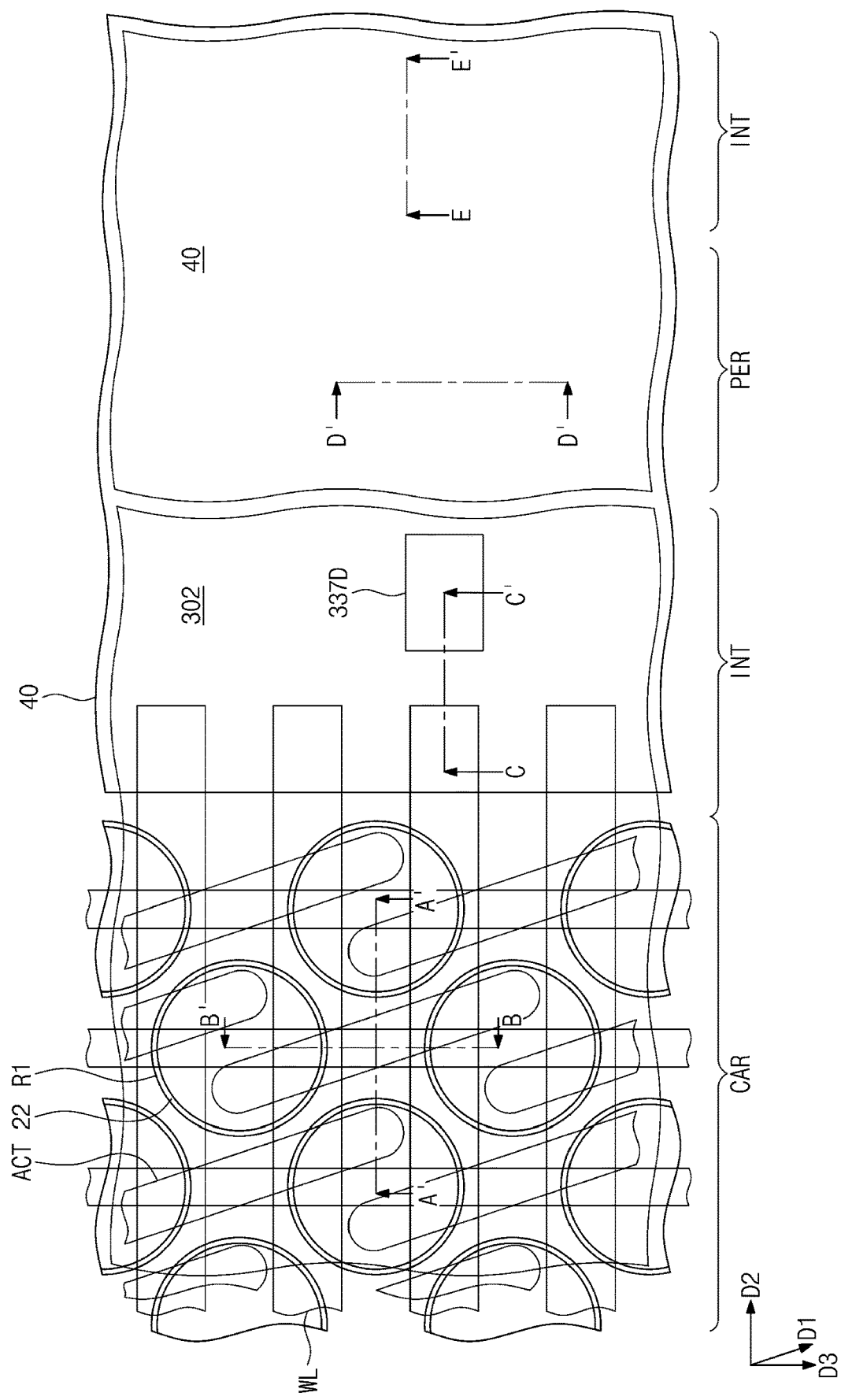
Figure 15B:
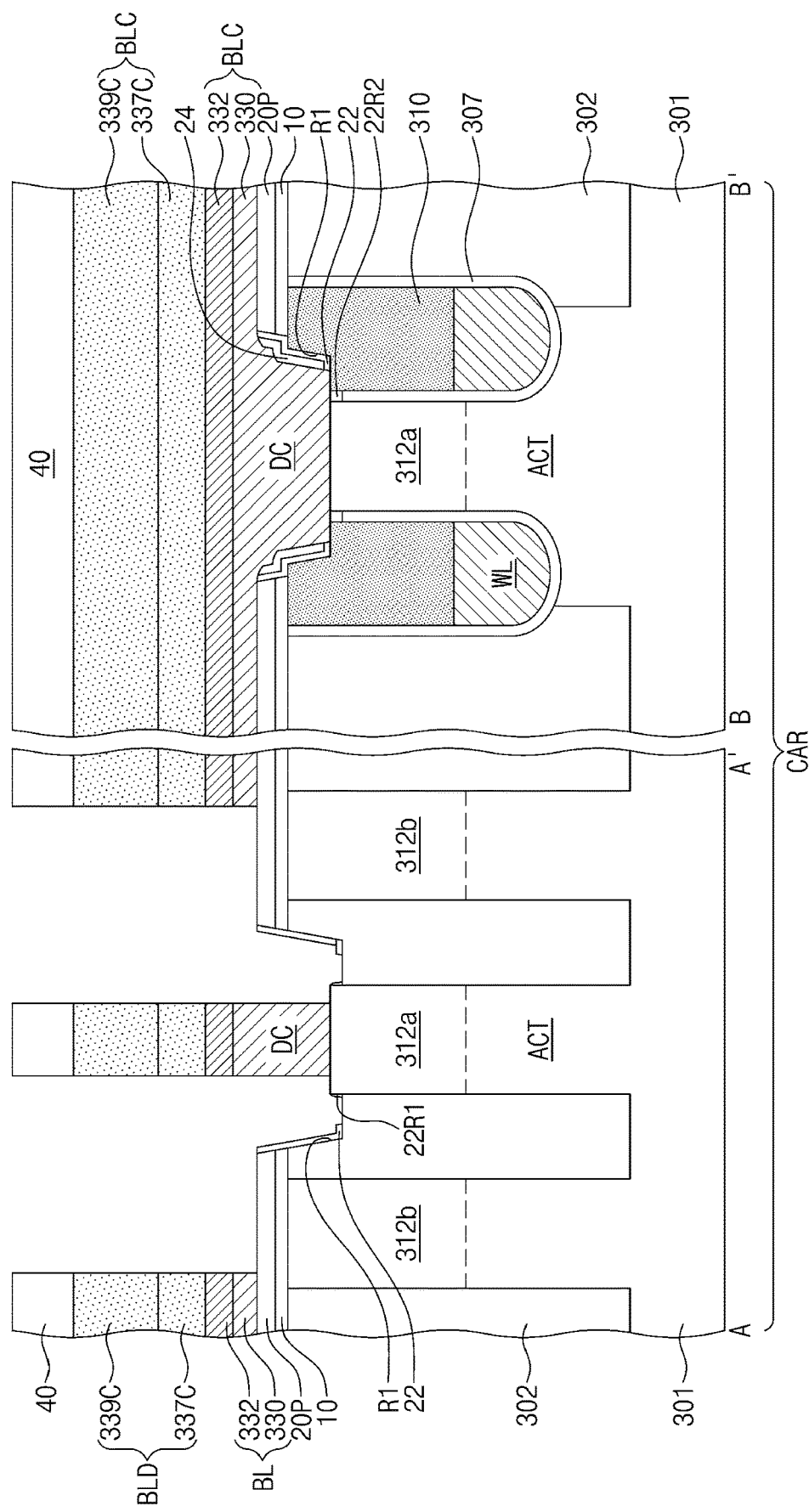
Figure 16:
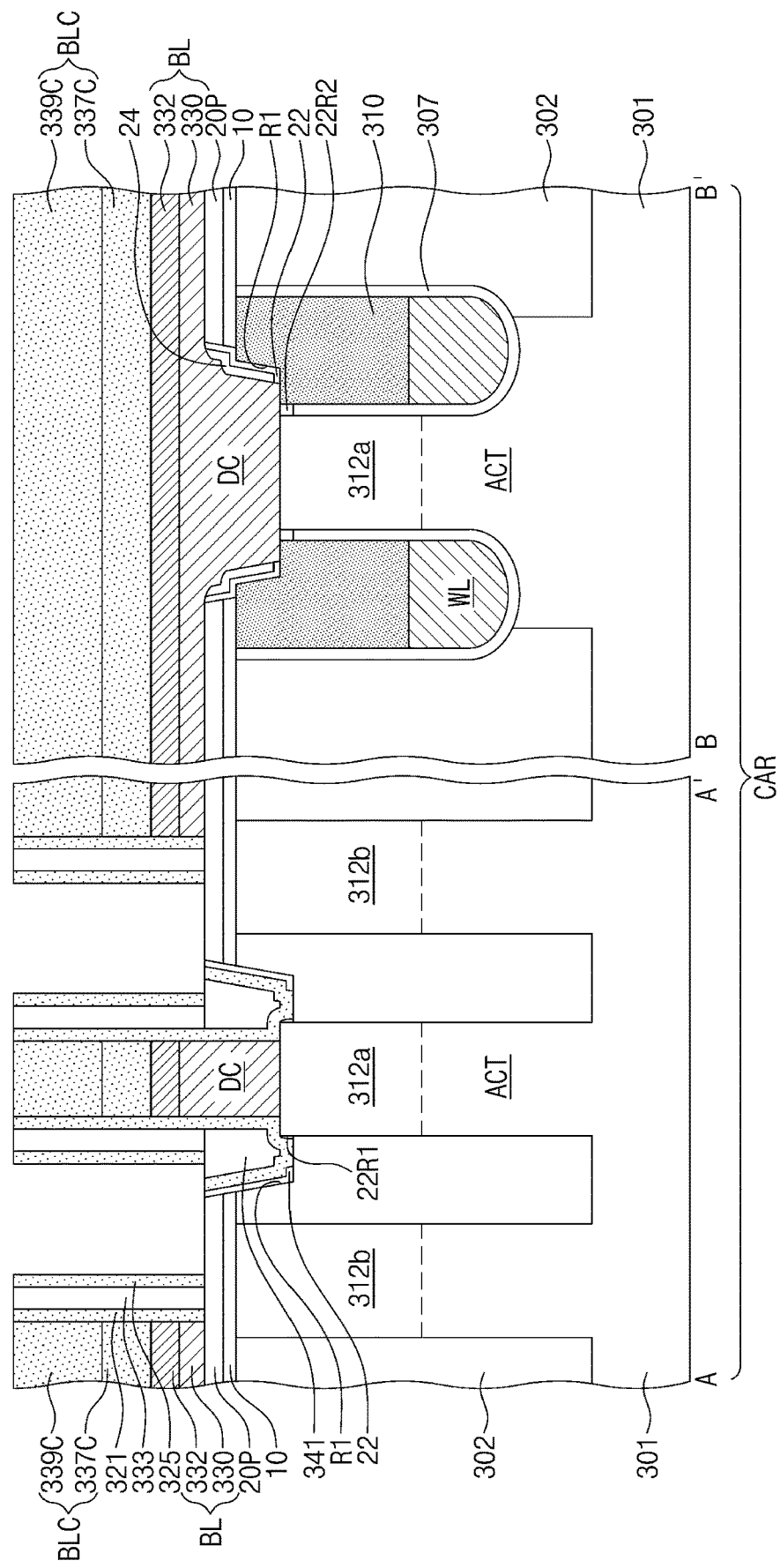

Referring to FIGS. 15A and 15B and FIG. 16, the sixth mask pattern 40 may be removed. A first sub-spacer layer (not shown) may be conformally stacked on the substrate 301. A lower insulating gap-fill layer may be formed on the first sub-spacer layer to fill the first recess region R1. An etch-back process may be performed on the lower insulating gap-fill layer to leave the lower gap-fill insulating pattern 341 filling the first recess region R1 and to expose a side surface of the first sub-spacer layer. The first sub-spacer layer may be etched to form the first sub-spacer 321 and to expose the top surface of the second buffer pattern 20P and the top surface of the bit-line capping pattern BLC. A sacrificial spacer layer may be conformally formed on the substrate 301 and may be anisotropically etched to form a sacrificial spacer 333. Thereafter, the second sub-spacer 325 may be formed to cover a side surface of the sacrificial spacer 333. The sacrificial spacer 333 may be formed of or include a material having etch selectivity with respect to the first and second sub-spacers 321 and 325.

Figure 17:
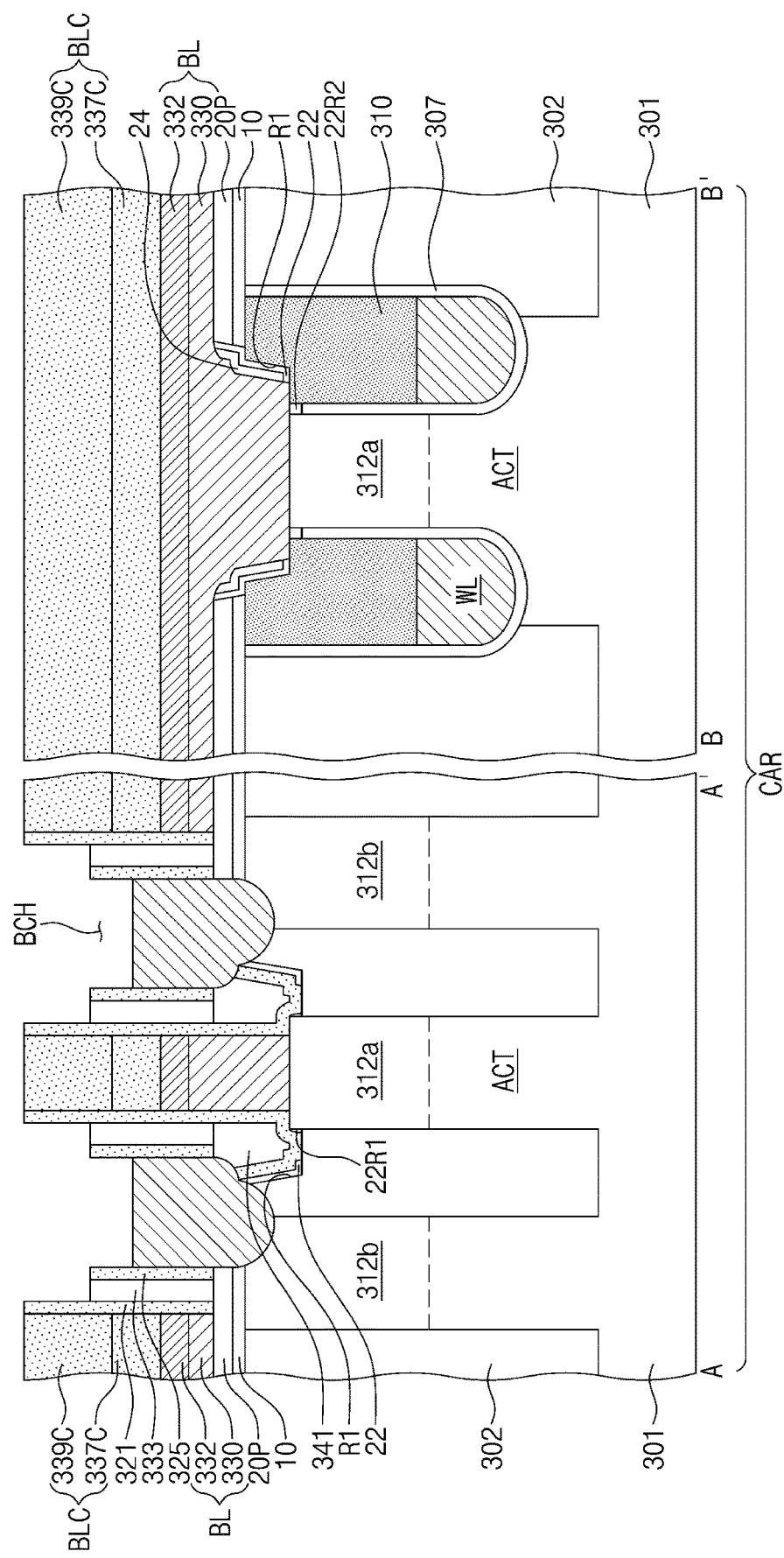

Referring to FIGS. 16 and 17, the second buffer pattern 20P and the first buffer layer 10 between the bit lines BL may be etched by an anisotropic etching process using the bit-line capping pattern BLC, the first sub-spacer 321, the sacrificial spacer 333, the second sub-spacer 325 as an etch mask, and thus, a storage node hole BCH exposing the second impurity region 312b may be formed. Here, the lower gap-fill insulating pattern 341, the protection spacer 22, and the first sub-spacer 321 interposed therebetween may be partially etched. The storage node contact BC may be formed by forming a storage node contact layer on the substrate 301 to fill the storage node hole BCH and anisotropically etching the storage node contact layer. Although not shown, a plurality of the storage node contacts BC may be formed between adjacent ones of the bit lines BL, and separation insulating patterns may be interposed between the storage node contacts BC. The storage node contact BC may be formed to expose an upper side surface of the second sub-spacer 325. An anisotropic etching process may be performed to remove an upper portion of the second sub-spacer 325 and an upper portion of the sacrificial spacer 333 and to expose an upper side surface of the first sub-spacer 321.

Referring to FIG. 17 and FIGS. 1A to 1C, a landing pad layer may be formed on the substrate 301 and may be patterned to form the landing pads LP. Here, a portion of the upper portion of the bit-line capping pattern BLC may also be removed. The second recess region R2 may be formed in the upper portion of the bit-line capping pattern BLC. The sacrificial spacer 333 may be exposed through the bottom of the second recess region R2. The sacrificial spacer 333 may be removed, via the second recess region R2, to form the air gap region AG. The landing pad separation pattern 42 may be formed to fill the second recess region R2. Thereafter, the data storage pattern DSP may be formed on the landing pad LP.

Figure 18:
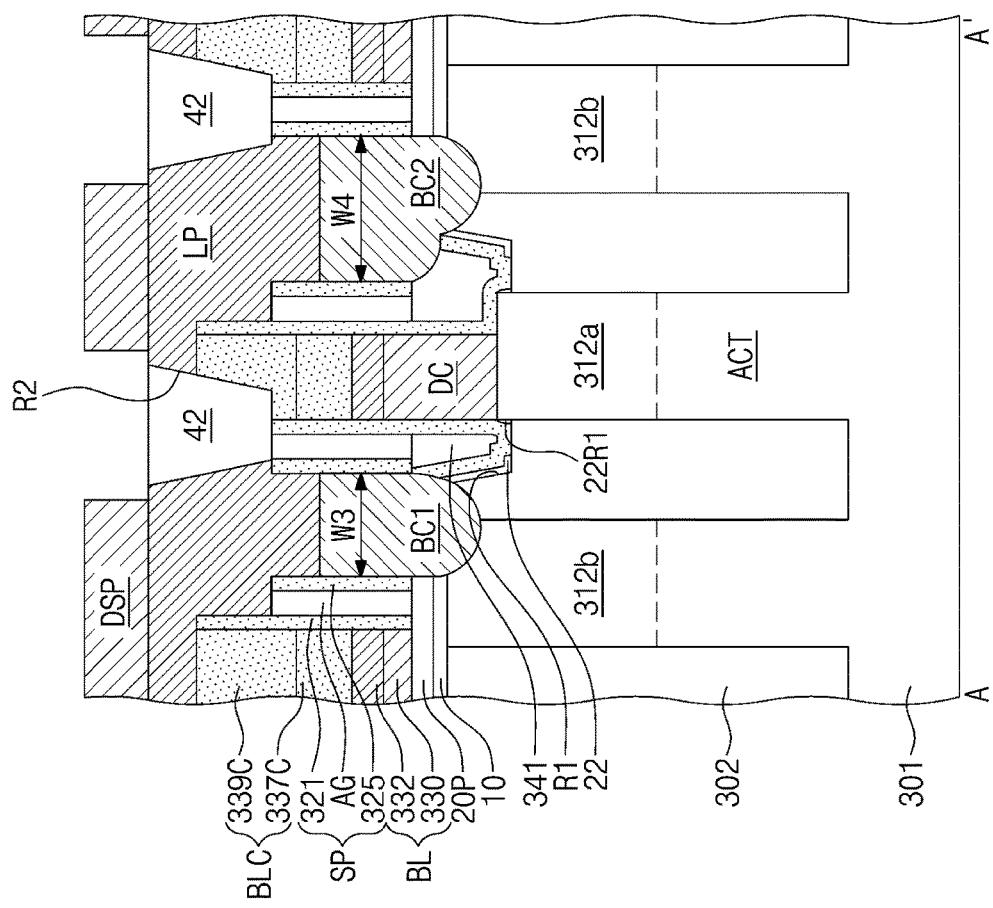
FIG. 18 is a sectional view taken along the line A-A' of FIG. 1A.

FIG. 18 is a sectional view taken along the line A-A' of FIG. 1A.

In a semiconductor memory device according to the present embodiment, a center portion of the bit line disposed on the first impurity region 312a may be misaligned to the center of the first impurity region 312a, as shown in FIG. 18. This structure may be formed when there is misalignment in position of the sixth mask pattern 40 in the step of FIGS. 15A and 15B. This may lead to a variation in distance between adjacent ones of the bit lines BL, in a subsequent step. In this case, widths of the resultant storage node contacts may also be changed. For example, a first storage node contact BC1 is disposed near one side of the bit-line contact DC, and a second storage node contact BC2 is disposed near an opposite side of the bit-line contact DC. Here, the first storage node contact BC1 may have a third width W3, and the second storage node contact BC2 may have a fourth width W4. The fourth width W4 may be greater than the third width W3. Except for the afore-described features, the device according to the present embodiment may have substantially the same features as that described with reference to FIGS. 1A to 1C.

Figure 14A:
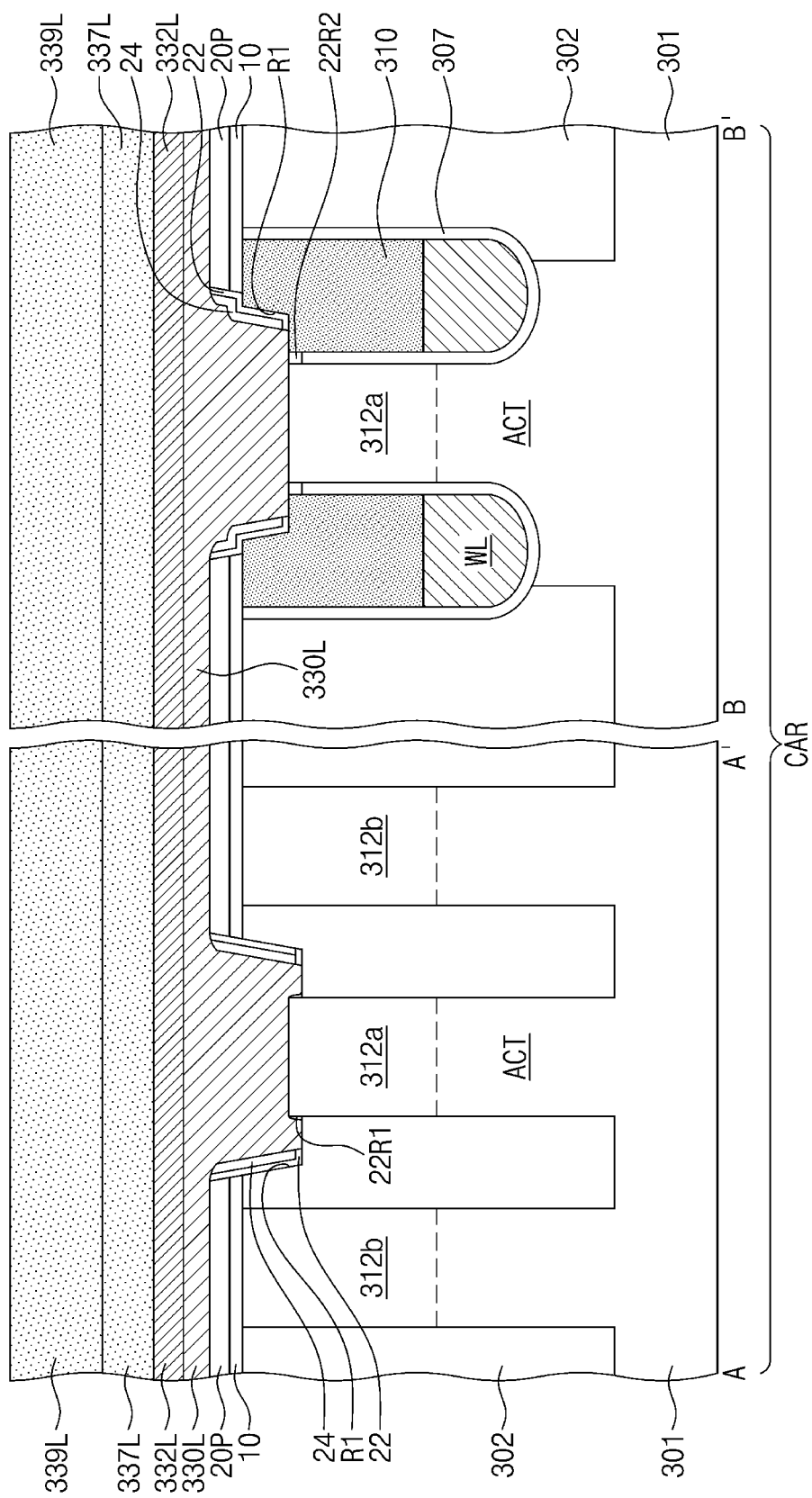
Figure 14B:
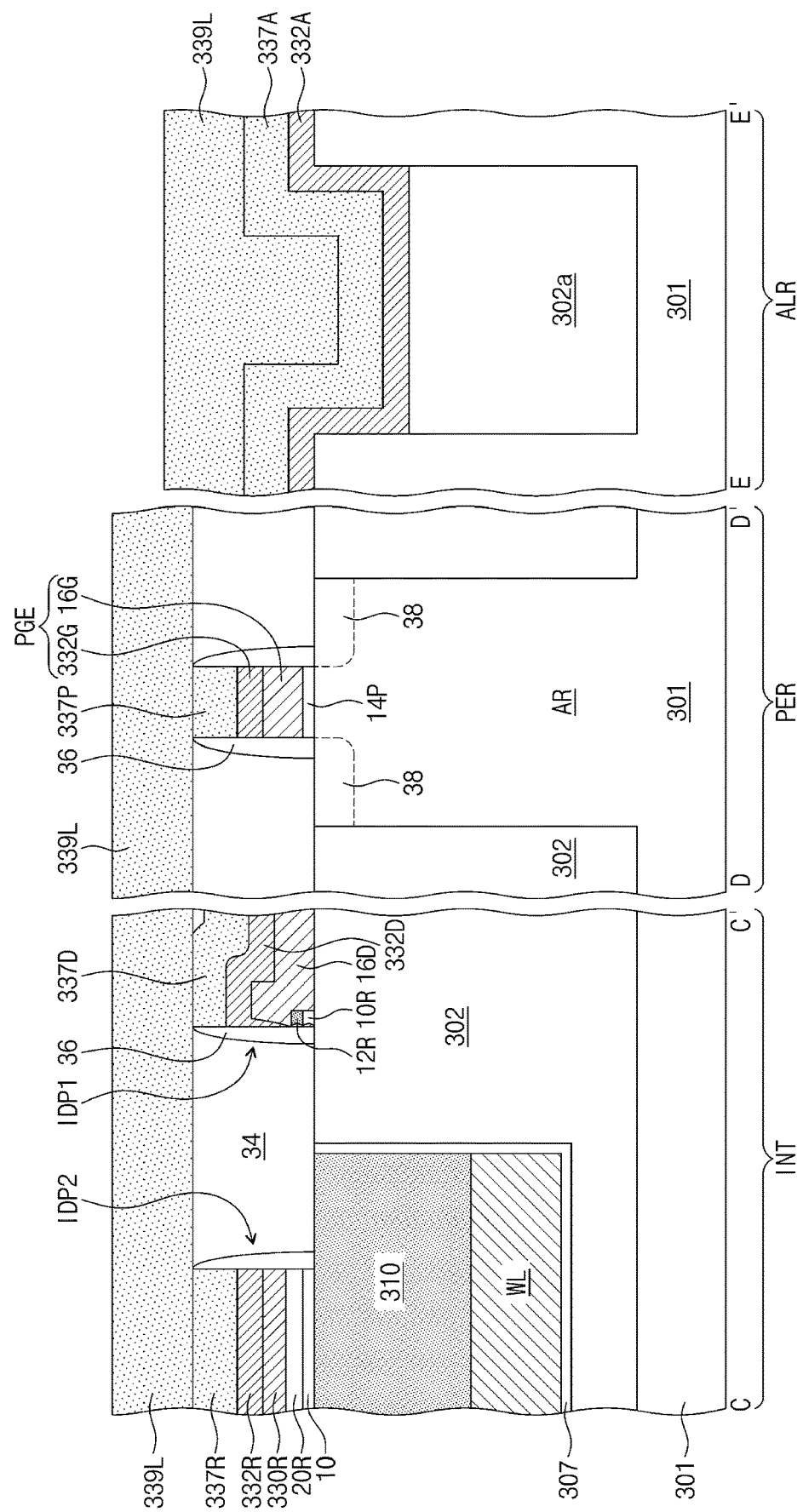

In the case where, as shown in FIG. 18, there is the misalignment in position of the bit line BL and the first recess region R1 has a small inner width, a distance between an inner side surface of the first recess region R1 and the bit-line contact DC may be reduced. Accordingly, when, to form the bit-line contact DC, the bit-line poly-silicon layer 330L is removed from the first recess region R1 as shown in FIGS. 14A and 15B, it may be difficult to supply an etchant into the first recess region R1, due to the small width of the first recess region R1. Thus, the bit-line poly-silicon layer 330L is not fully removed from the first recess region R1, and a portion of the bit-line poly-silicon layer 330L may be left on the side surface of the first recess region R1, thereby causing a bridge failure. As shown in FIGS. 14A and 15B, during a time when the bit-line poly-silicon layer 330L may be patterned to form the bit-line contact DC, a gap between a side surface of the first recess region R1 and a side surface of the bit-line contact DC is reduced such that etchant supply is limited and the portion of the bit-line poly-silicon layer 330L may remain on the side surface of the first recess region R1. In this case, a short circuit may be formed between the storage node contact BC and the bit-line contact DC in a subsequent step. According to an embodiment of the inventive concept, the isotropic etching process may be performed to increase the inner width of the first recess region R1, as described with reference to FIGS. 7A to 7C and FIGS. 8A and 8B, and in this case, it may be possible to prevent the bridge failure.

Figure 19:
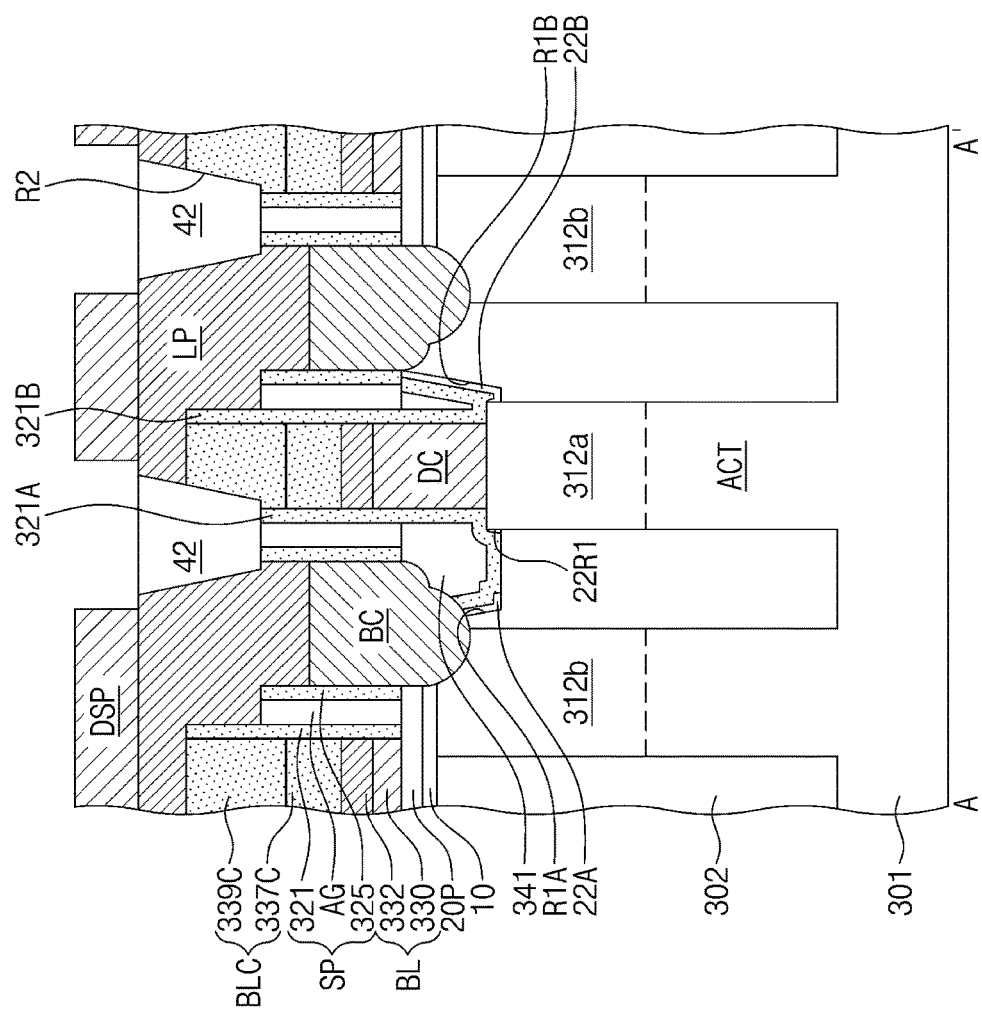
FIG. 19 is a sectional view taken along the line A-A' of FIG. 1A.

FIG. 19 is a sectional view taken along the line A-A' of FIG. 1A.

Referring to FIG. 19, in a semiconductor memory device according to the present embodiment, lower gap-fill insulating patterns, which are located at opposite sides of the bit-line contact DC, may have different shapes. The center of the first recess region R1 may be misaligned to the center of the first impurity region 312a. In other words, the first recess region R1 may have a first inner side surface R1A and a second inner side surface R1B which are opposite to each other. The second inner side surface R1B may be closer to the bit-line contact DC than the first inner side surface R1A. A first protection spacer 22A may cover the first inner side surface R1A. A second protection spacer 22B may cover the second inner side surface R1B. The first protection spacer 22A may have an 'L'-shaped section. The upper side surface of the substrate 301 may be exposed through the bottom of the first recess region R1. The first protection remaining pattern 22R1 may be provided to cover a portion of the upper side surface of the substrate 301. The second protection spacer 22B may have a shape different from the first protection spacer 22A. The second protection spacer 22B may be extended to cover another portion of the upper side surface of the substrate 301. One of the side surfaces of the bit-line contact DC may be covered with a (1A)-th sub-spacer 321A, and another of the side surfaces of the bit-line contact DC may be covered with a (1B)-th sub-spacer 321B. The (1A)-th sub-spacer 321A may have a different shape from the (1B)-th sub-spacer 321B. For example, the (1A)-th sub-spacer 321A and the (1B)-th sub-spacer 321B may correspond to the first sub-spacer 321 of FIG. 1B, for example, but due to the misalignment, the first sub-spacer 321 may be formed differently on opposite side surfaces of the bit-line contact DC. Except for the afore-described features, the device according to the present embodiment may have substantially the same features as that described with reference to FIGS. 1A to 1C.

Figure 20A:
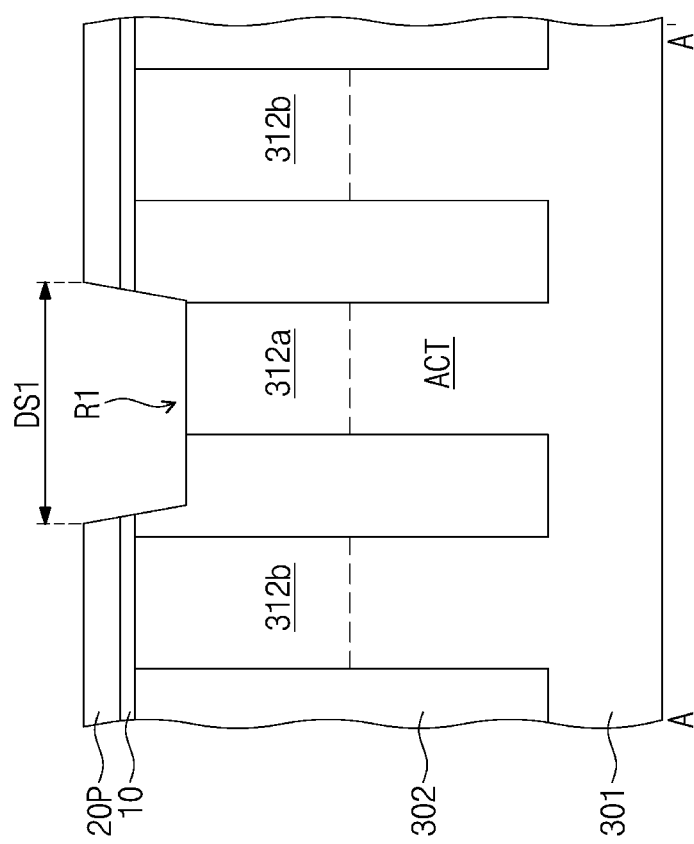
FIGS. 20A and 20B are sectional views sequentially illustrating a process of fabricating the semiconductor memory device of FIG. 19.
Figure 20B:
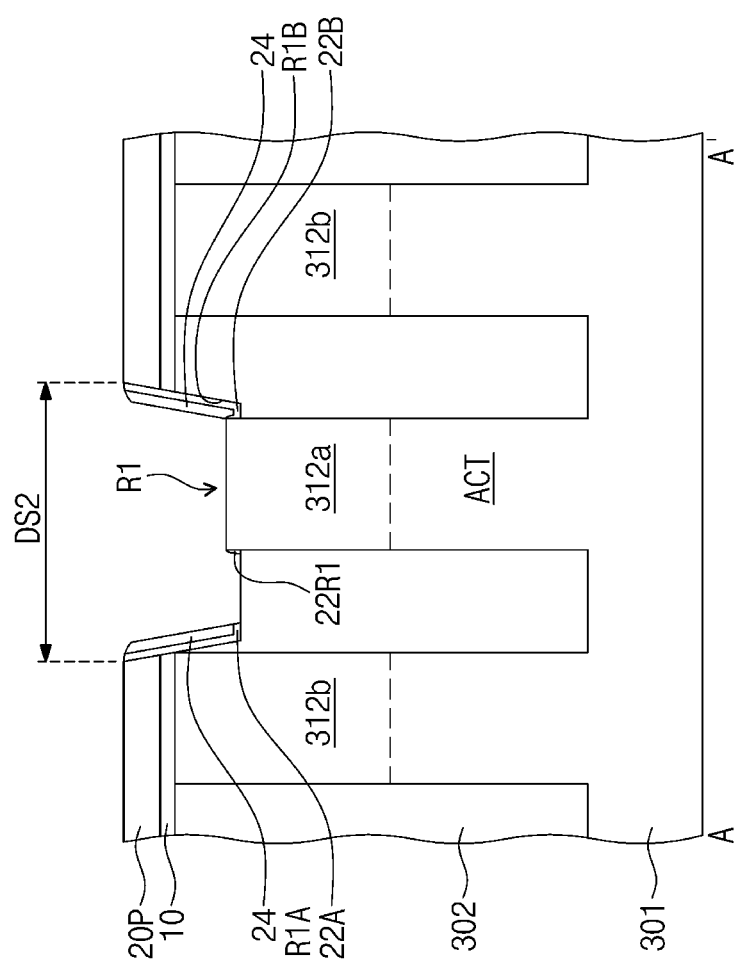

FIGS. 20A and 20B are sectional views sequentially illustrating a process of fabricating the semiconductor memory device of FIG. 19.

Referring to FIG. 20A, a misalignment issue may occur when, in the step of FIG. 7B, the anisotropic etching process is performed to form the first recess region R1. For example, the first recess region R1 may be shifted in the second direction D2 (e.g., in a left direction in the sectional view of FIG. 20A) relative to the first impurity region 312a. Accordingly, one of inner side surfaces of the first recess region R1 may be formed closer to the second impurity region 312b, compared to when such misalignment does not occur.

Referring to FIG. 20B, if the isotropic process of FIG. 7B is performed, the width of the first recess region R1 may be increased from DS1 to DS2. The first recess region R1 may include the first inner side surface R1A and the second inner side surface R1B, which are opposite to each other. A distance between the second inner side surface R1B and the first impurity region 312a may be smaller than a distance between the first inner side surface R1A and the first impurity region 312a. In this case, the device isolation pattern 302 near the first inner side surface R1A may be partially removed to expose the top portion of the substrate 301 provided with the second impurity region 312b.

Referring to FIG. 20B, the protection spacer 22 and the polysilicon spacer 24 may be formed, as shown in FIG. 8B. The protection spacer 22 may include the first protection spacer 22A covering the first inner side surface R1A and the second protection spacer 22B covering the second inner side surface R1B. The first protection spacer 22A may be in contact with the top end portion of the substrate 301, in which the second impurity region 312b is formed. The second protection spacer 22B may be in contact with a side surface of the top portion of the substrate 301, in which the first impurity region 312a is formed. Thereafter, the semiconductor memory device of FIG. 19 may be fabricated by performing the processes described with reference to FIGS. 9A to 17. If the first protection spacer 22A is not provided, the polysilicon spacer 24 may be in contact with the top portion of the substrate 301, and a process failure, in which not only the polysilicon spacer 24 but also the top portion of the substrate 301 are etched, may occur, when the bit-line poly-silicon layer 330L is etched by the process described with reference to FIGS. 15A and 15B. In this case, the second impurity region 312b may be reduced, and the reliability of the semiconductor memory device may be deteriorated. However, according to an embodiment of the inventive concept, the width of the first recess region R1 may be increased to prevent a bridge issue and the first protection spacer 22A may prevent the top portion of the substrate 301 from being etched. Thus, it may be possible to improve the reliability of the semiconductor memory device, to prevent the process failure, and to improve the production yield of the semiconductor memory device.

Figure 21:
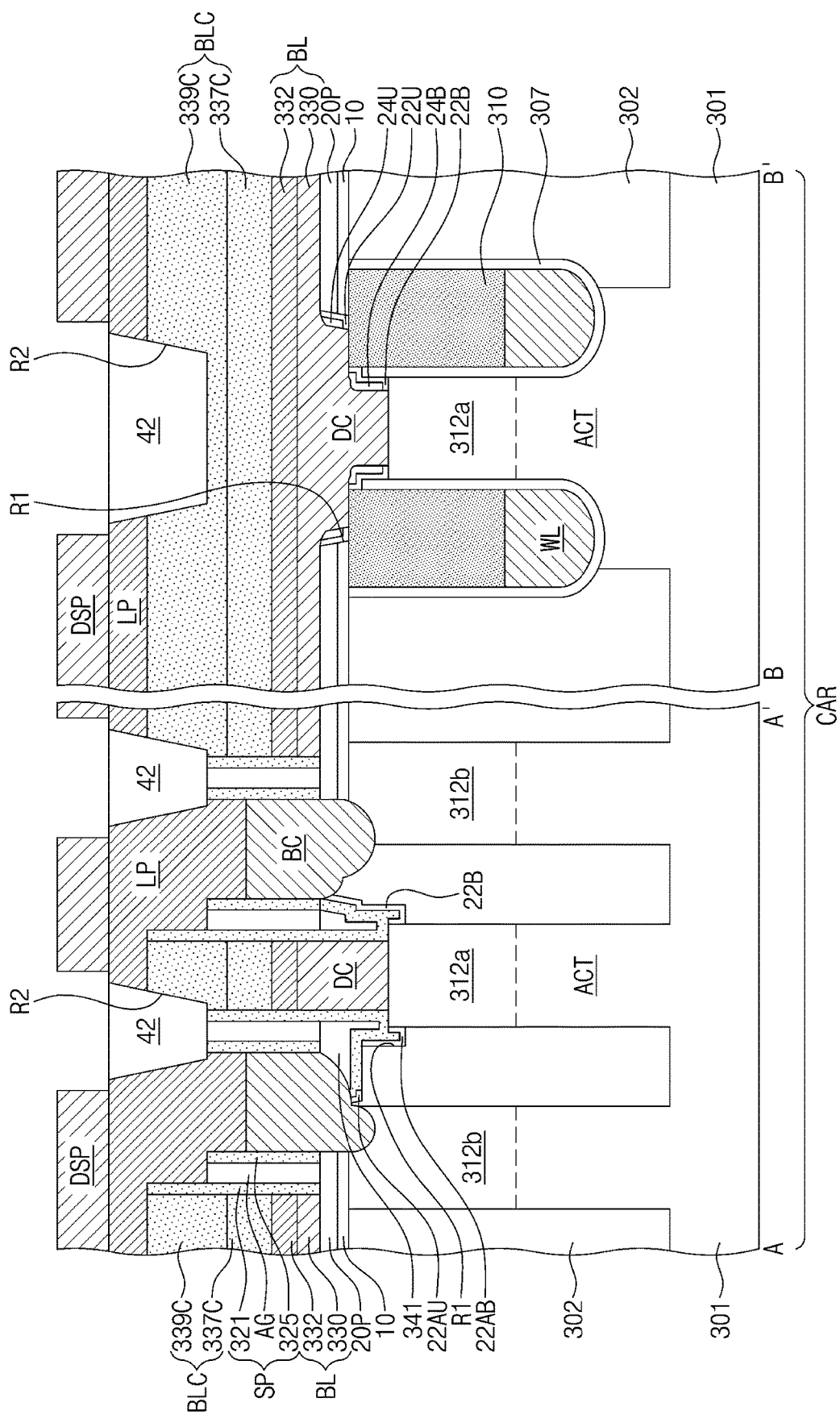
FIG. 21 is a sectional view taken along the lines A-A' and B-B' of FIG. 1A.

FIG. 21 is a sectional view taken along the lines A-A' and B-B' of FIG. 1A.

Referring to FIG. 21, the first recess region R1 may have an asymmetric structure about the first impurity region 312a. When viewed in the A-A' section of FIG. 21, the first recess region R1 may include the first and second inner side surfaces R1A and R1B (e.g., see FIG. 20B), which are opposite to each other. A first upper protection spacer 22AU and a first lower protection spacer 22AB, which are spaced apart from each other, may be placed on the first inner side surface R1A. The second protection spacer 22B may be placed on the second inner side surface R1B. The first upper protection spacer 22AU, the first lower protection spacer 22AB, and the second protection spacer 22B may have different shapes from each other. The first lower protection spacer 22AB may have a 'J'-shaped section. The top surface of the device isolation pattern 302 may be exposed between the first upper protection spacer 22AU and the first lower protection spacer 22AB.

When viewed in the B-B' section of FIG. 21, the first recess region R1 is not formed on the word-line capping pattern 310. In other words, the top and side surfaces of the word-line capping pattern 310, which is exposed in the first recess region R1, may meet at a substantially right angle. The cell gate dielectric layer 307 in the first recess region R1 may be partially removed to expose the upper side surface of the word-line capping pattern 310. The side surfaces of the second buffer pattern 20P and the first buffer layer 10 may be covered with an upper protection spacer 22U. The upper protection spacer 22U may have an 'L'-shaped section. The side and top surfaces of the cell gate dielectric layer 307, a portion of the top surface of the substrate 301, and the upper side surface of the word-line capping pattern 310 may be covered with the lower protection spacer 22B. The lower protection spacer 22B may have a staircase section. The upper protection spacer 22U may be covered with the upper polysilicon spacer 24U, and the lower protection spacer 22B may be covered with a lower polysilicon spacer 24B. The upper protection spacer 22U may be spaced apart from the lower protection spacer 22B, and the upper polysilicon spacer 24U may be spaced apart from the lower polysilicon spacer 24B.

Figure 22A:
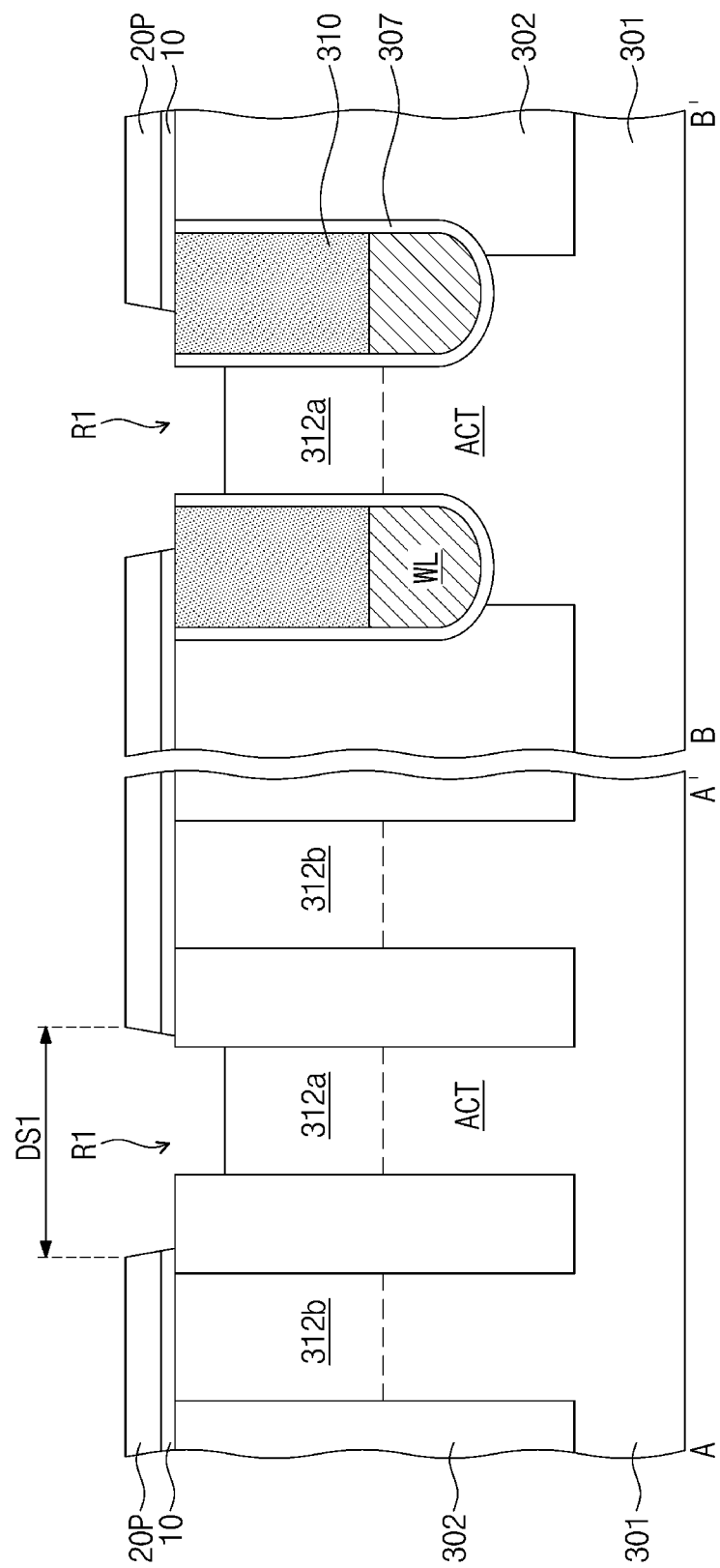
FIGS. 22A to 22C are sectional views sequentially illustrating a process of fabricating the semiconductor memory device of FIG. 21.
Figure 22B:
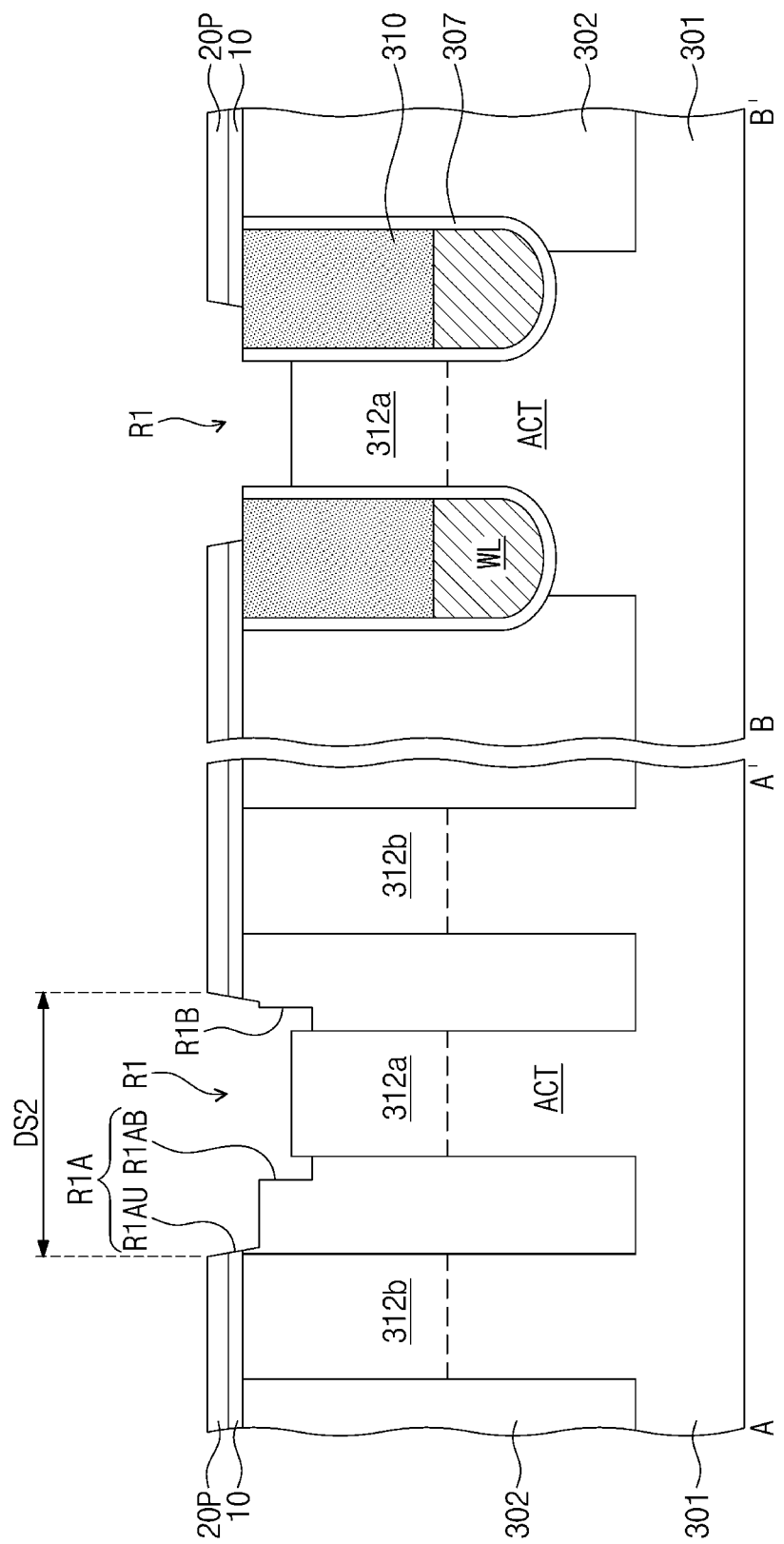
Figure 22C:
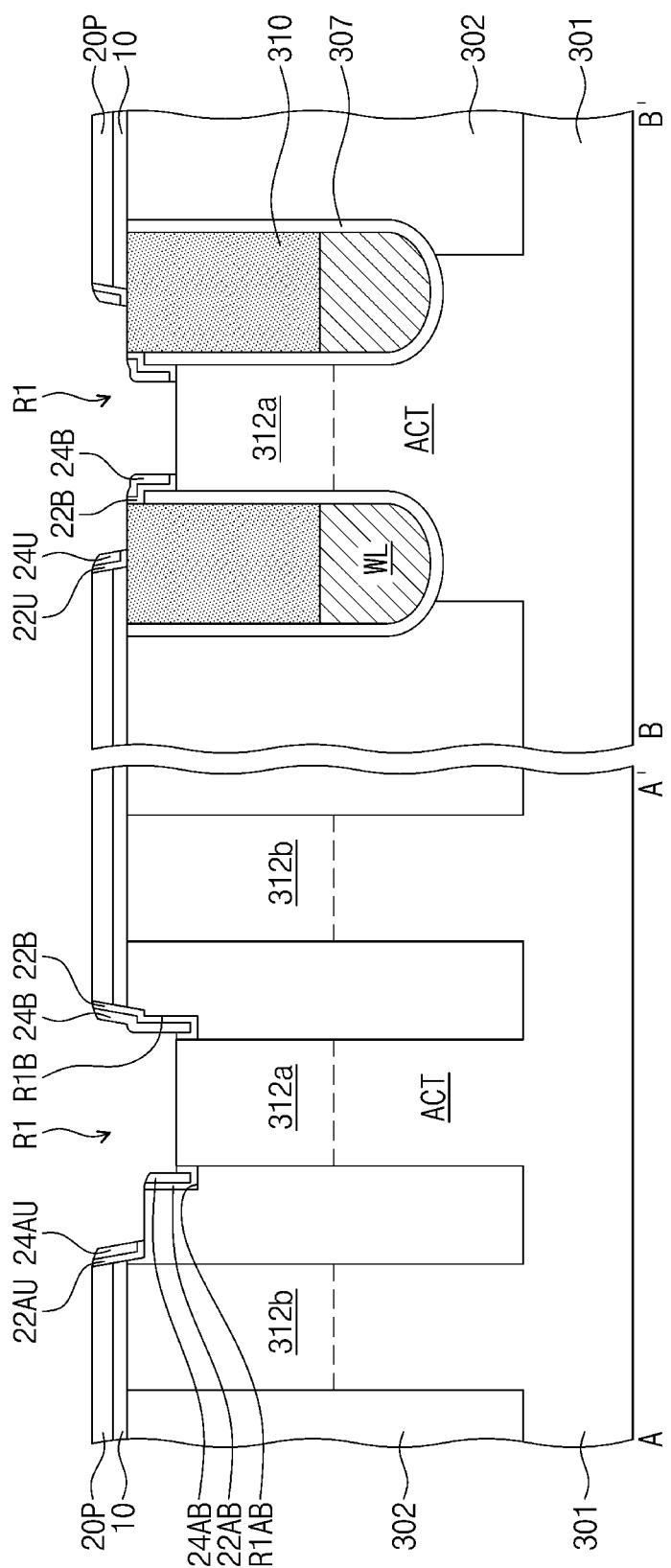

FIGS. 22A to 22C are sectional views sequentially illustrating a process of fabricating the semiconductor memory device of FIG. 21.

Referring to FIG. 22A, the second buffer layer 20L may be formed to conformally cover the entire top surface of the substrate 301, in the step of FIGS. 6A and 6B, and then, the second buffer layer 20L and the first buffer layer 10 may be patterned to form the first recess region R1 exposing the top surfaces of the substrate 301 and the device isolation pattern 302. Here, the first recess region R1 may be slightly misaligned relative to the center of the first impurity region 312a. An anisotropic process may be performed to selectively remove the exposed portion of the substrate 301 and thereby to expose a side surface of the device isolation pattern 302 which was in contact with the first impurity region 312a. The device isolation pattern 302, the cell gate dielectric layer 307, and the word-line capping pattern 310 are not substantially etched during the anisotropic process.

Referring to FIG. 22B, if the isotropic process of FIG. 7B is performed, the width of the first recess region R1 may be increased from DS1 to DS2. When viewed in the A-A' section of FIG. 22B, the first recess region R1 may include the first inner side surface R1A and the second inner side surface R1B facing each other. The first inner side surface R1A may include a first upper inner side surface R1AU and a first lower inner side surface R1AB.

The first inner side surface R1A may have a different profile from that of the second inner side surface R1B. A distance between the second inner side surface R1B and the first impurity region 312a may be smaller than a distance between the first inner side surface R1A and the first impurity region 312a. In this case, the device isolation pattern 302 near the first inner side surface R1A may be partially removed to expose the top portion of the substrate 301 provided with the second impurity region 312b. The substrate 301 may protrude relative to the bottom of the first recess region R1. When viewed in the B-B' section of FIG. 22B, an upper portion of the cell gate dielectric layer 307 may be partially removed to expose the upper side surface of the word-line capping pattern 310. An upper portion of the second inner side surface R1B may have a side surface which is not parallel to a side surface of a lower portion of the second inner side surface R1B.

Referring to FIG. 22C, the protection spacer 22 and the polysilicon spacer 24 may be formed, as shown in FIG. 8B. When viewed in the A-A' section of FIG. 22C, the first upper inner side surface R1AU may be covered with the first upper protection spacer 22AU, and the first lower inner side surface R1AB may be covered with the first lower protection spacer 22AB. The second protection spacer 22B may be placed on the second inner side surface R1B. An upper side surface of the second protection spacer 22B may have a side surface which is not parallel to a side surface of a lower side surface of the second protection spacer 22B. A first upper polysilicon spacer 24AU, a first lower polysilicon spacer 24AB, the lower polysilicon spacer 24B may be spaced apart from each other to cover the first upper protection spacer 22AU, the first lower protection spacer 22AB, and the second protection spacer 22B, respectively. When viewed in the B-B' section of FIG. 22C, the side and top surfaces of the cell gate dielectric layer 307, a portion of the top surface of the substrate 301, and the upper side surface of the word-line capping pattern 310 may be covered with the lower protection spacer 22B. The lower protection spacer 22B may have a staircase section. The upper protection spacer 22U may be covered with the upper polysilicon spacer 24U, and the lower protection spacer 22B may be covered with the lower polysilicon spacer 24B. Thereafter, the processes described with reference to FIGS. 9A to 17 may be performed to fabricate the semiconductor memory device of FIG. 21. Similar to the afore-described embodiments, the first upper protection spacer 22AU may prevent an upper portion of the substrate 301 from being etched when the bit line BL and the bit-line contact DC are formed.

Figure 23A:
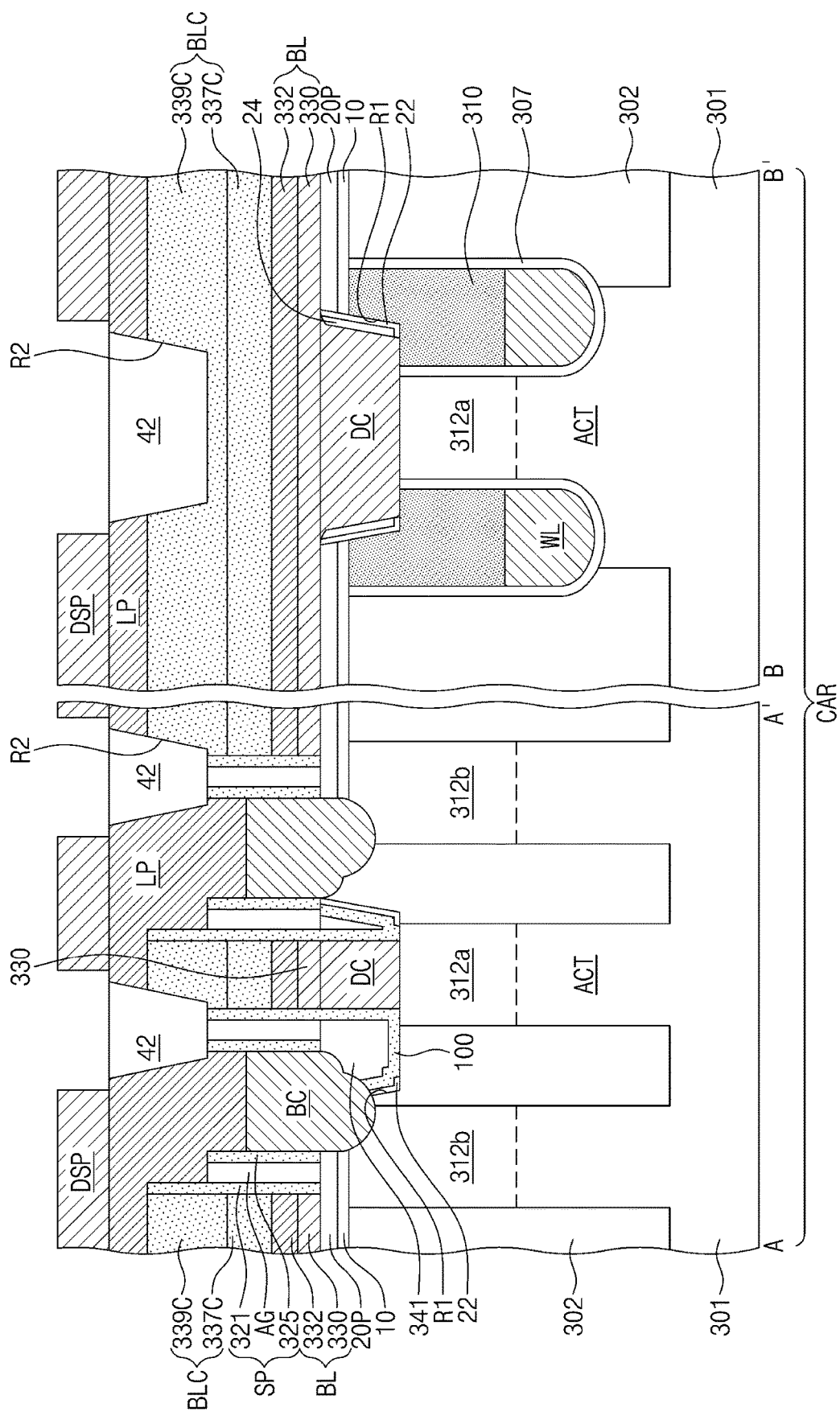
FIG. 23A is a sectional view taken along the lines A-A' and B-B' of FIG. 1A.
Figure 23B:
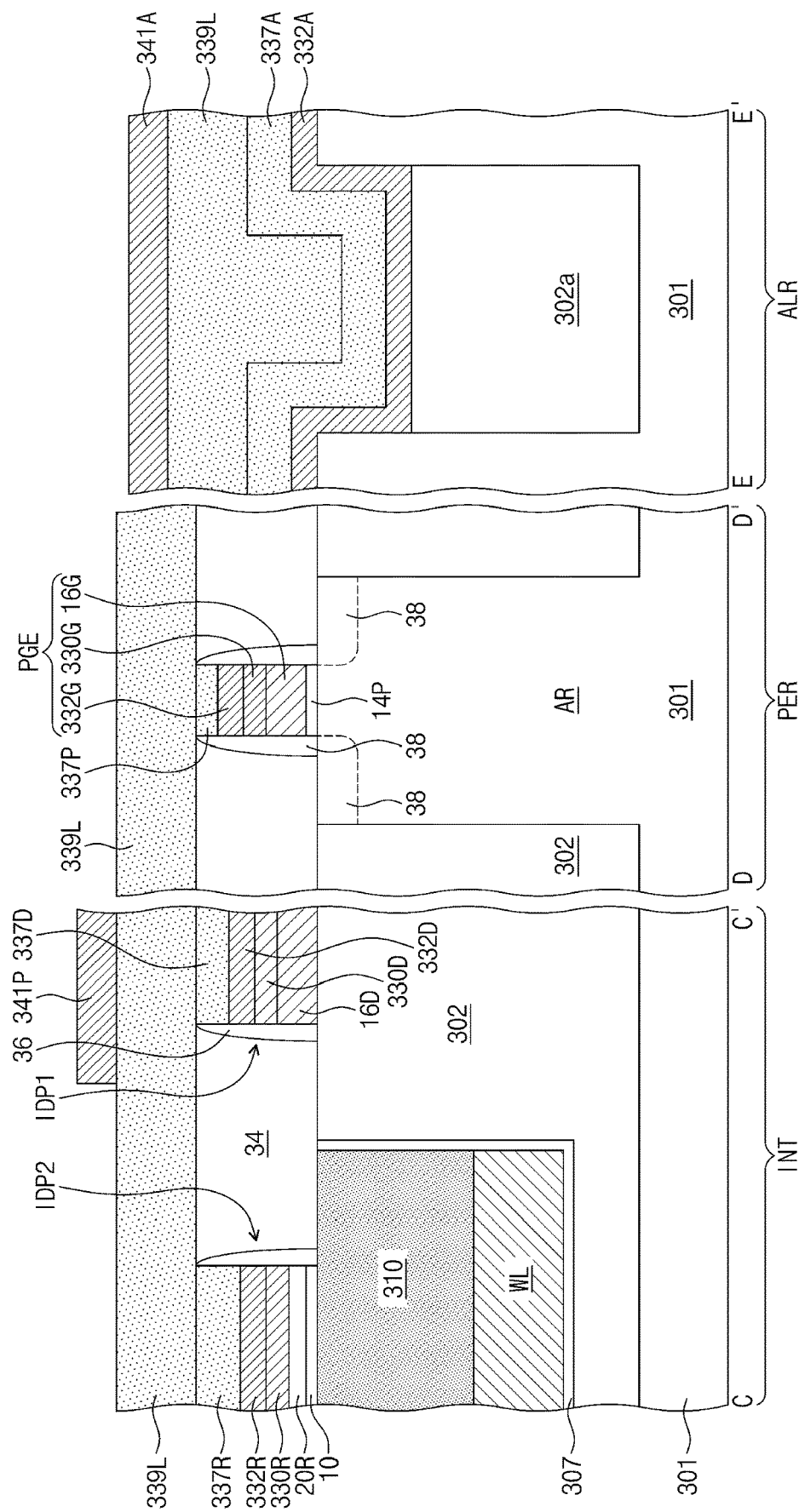
FIG. 23B is a sectional view taken along the lines C-C', D-D', and E-E' of FIG. 1A.

FIG. 23A is a sectional view taken along the lines A-A' and B-B' of FIG. 1A. FIG. 23B is a sectional view taken along the lines C-C', D-D', and E-E' of FIG. 1A.

Referring to FIG. 23A, the bit-line contact DC is not a part of the bit-line polysilicon pattern 330. For example, there may be an interface between the bit-line contact DC and the bit-line polysilicon pattern 330.

Referring to FIG. 23B, the peripheral gate electrode PGE may include the peripheral polysilicon pattern 16G (i.e., a first peripheral polysilicon pattern), a second peripheral polysilicon pattern 330G, and the peripheral metal pattern 332G. The first interfacial dummy pattern IDP1 may include the first polysilicon remaining pattern 16D and a second polysilicon remaining pattern 330D, which are sequentially stacked. The first polysilicon remaining pattern 16D may be in contact with the top surface of the device isolation pattern 302. The first interfacial dummy pattern IDP1 does not include the first buffer remaining pattern 10R and the lower buffer remaining pattern 12R. This structure may be formed by adjusting the position of the first mask pattern 19 of FIG. 4B or a patterning position of the peripheral poly-silicon layer 16. Except for the afore-described features, the device according to the present embodiment may have substantially the same features as that described with reference to FIG. 19.

Figure 26A:
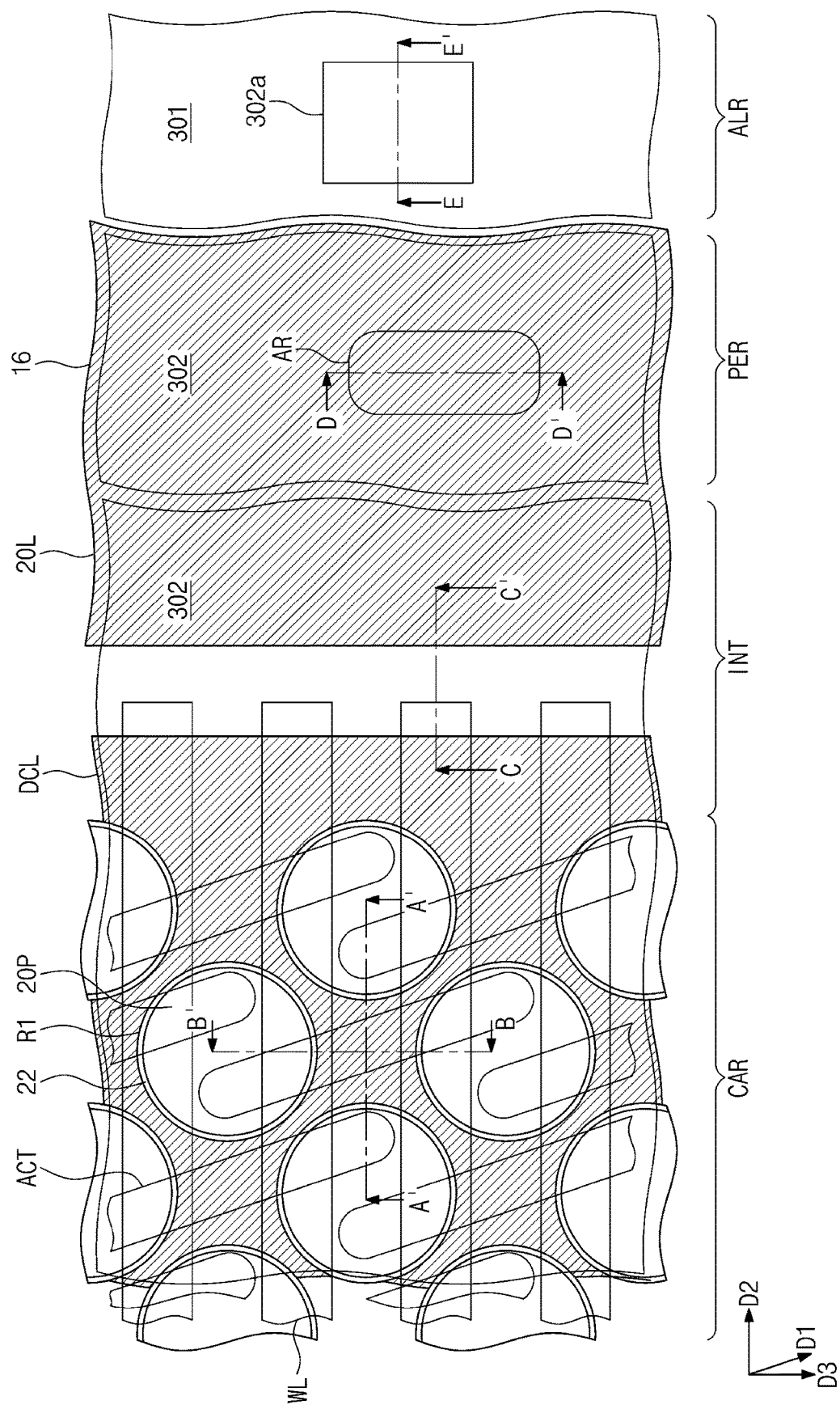
FIG. 26A is a plan view illustrating a process of fabricating the semiconductor memory device of FIG. 1A.
Figure 26B:
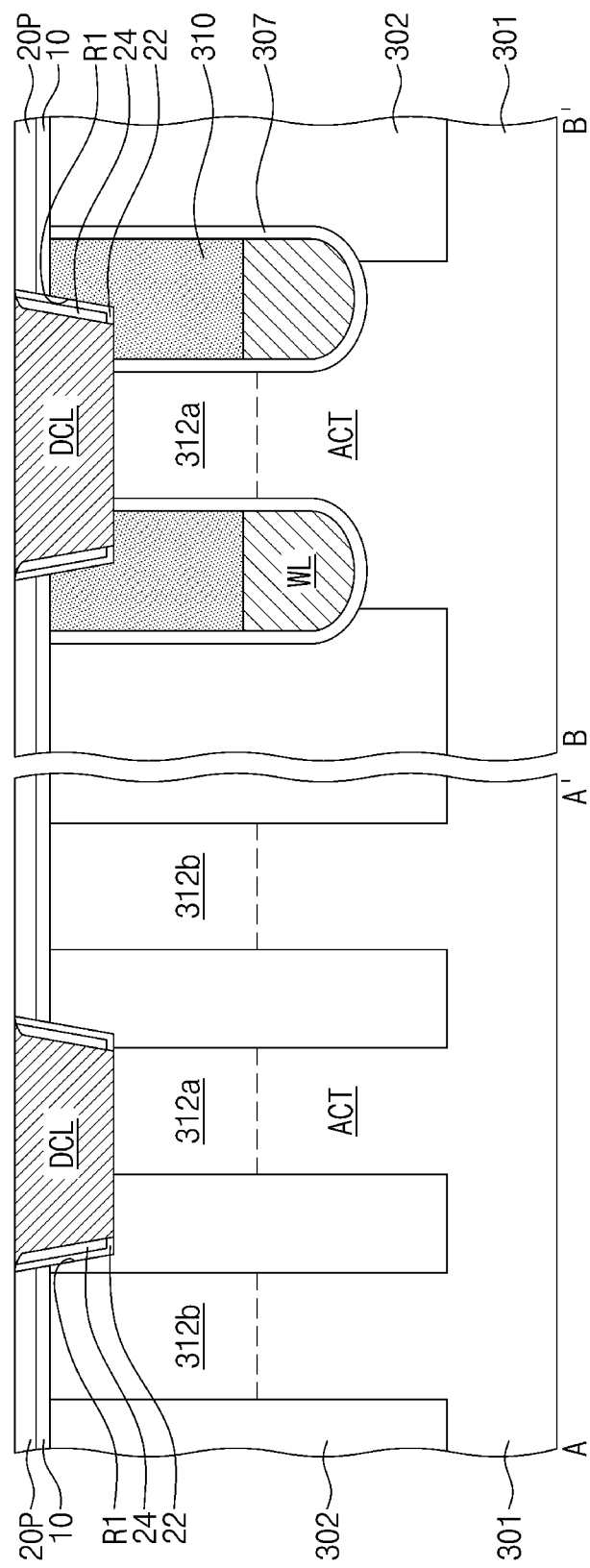

FIGS. 24A, 25A, 26B, and 28A are sectional views sequentially illustrating a process of fabricating the semiconductor memory device having the section of FIG. 23A. FIG. 26A is a plan view illustrating a process of fabricating the semiconductor memory device of FIG. 1A. FIGS. 24B, 25B, 27, and 28B are sectional views sequentially illustrating a process of fabricating the semiconductor memory device having the section of FIG. 23B.

Figure 24A:
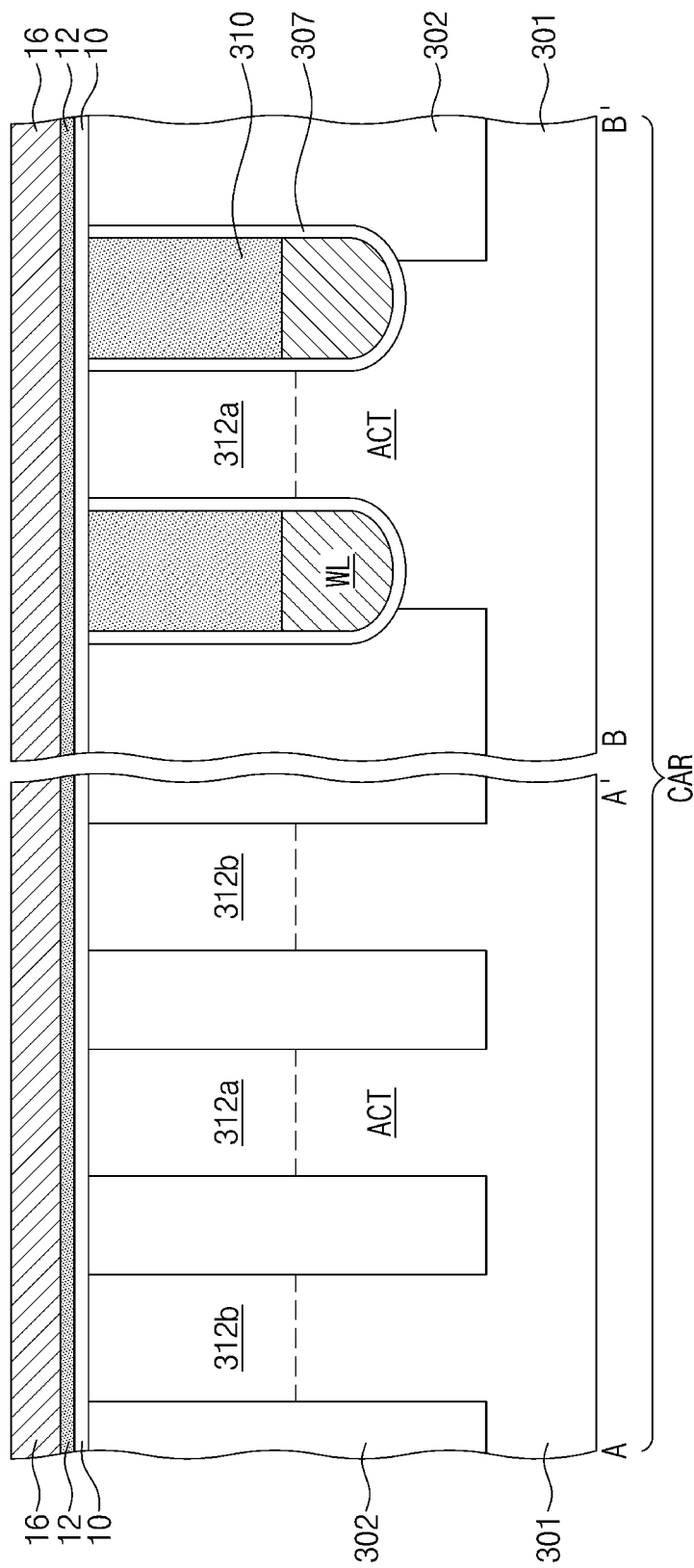
FIGS. 24A, 25A, 26B, and 28A are sectional views sequentially illustrating a process of fabricating the semiconductor memory device having the section of FIG. 23A.
Figure 24B:
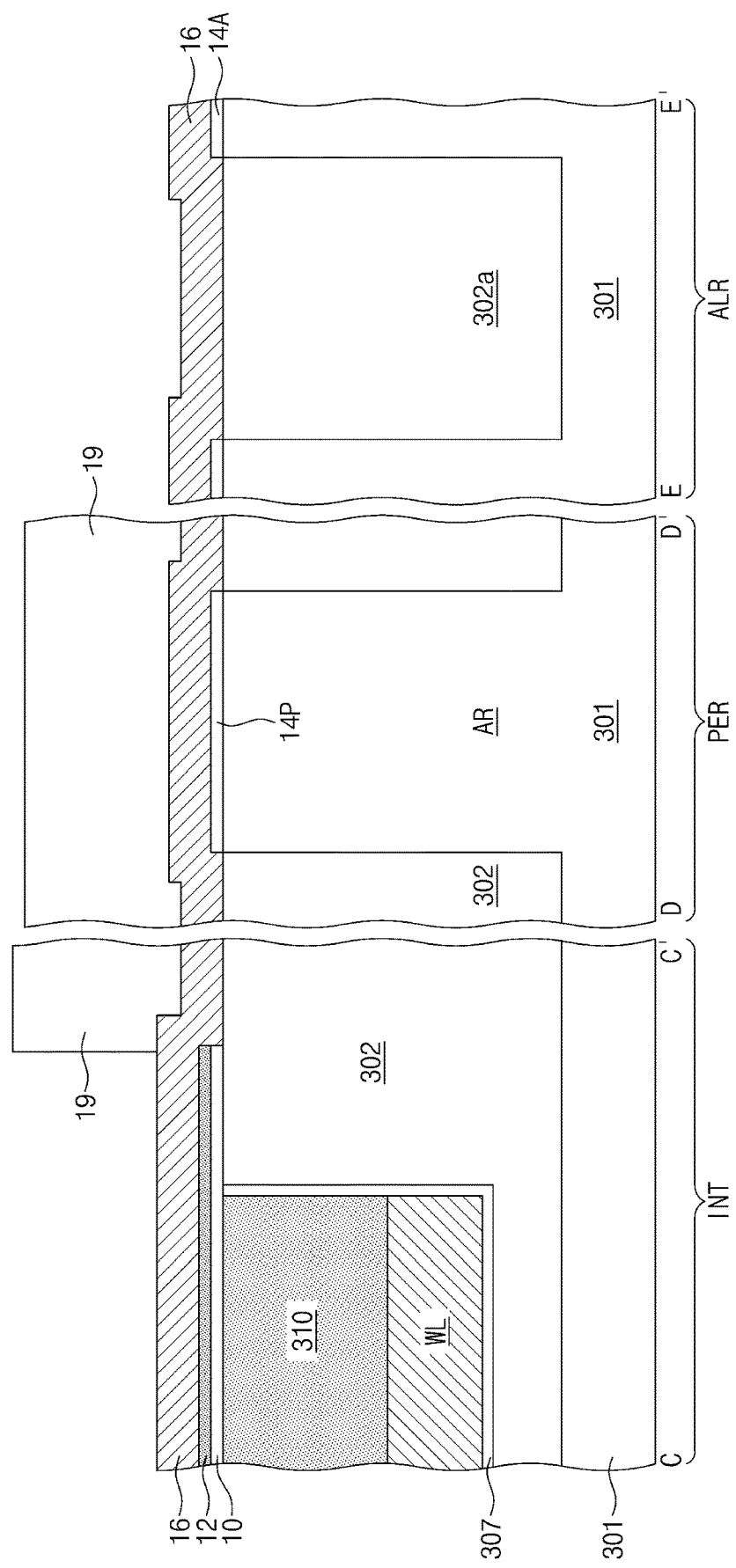
FIGS. 24B, 25B, 27, and 28B are sectional views sequentially illustrating a process of fabricating the semiconductor memory device having the section of FIG. 23B.
Figure 25A:
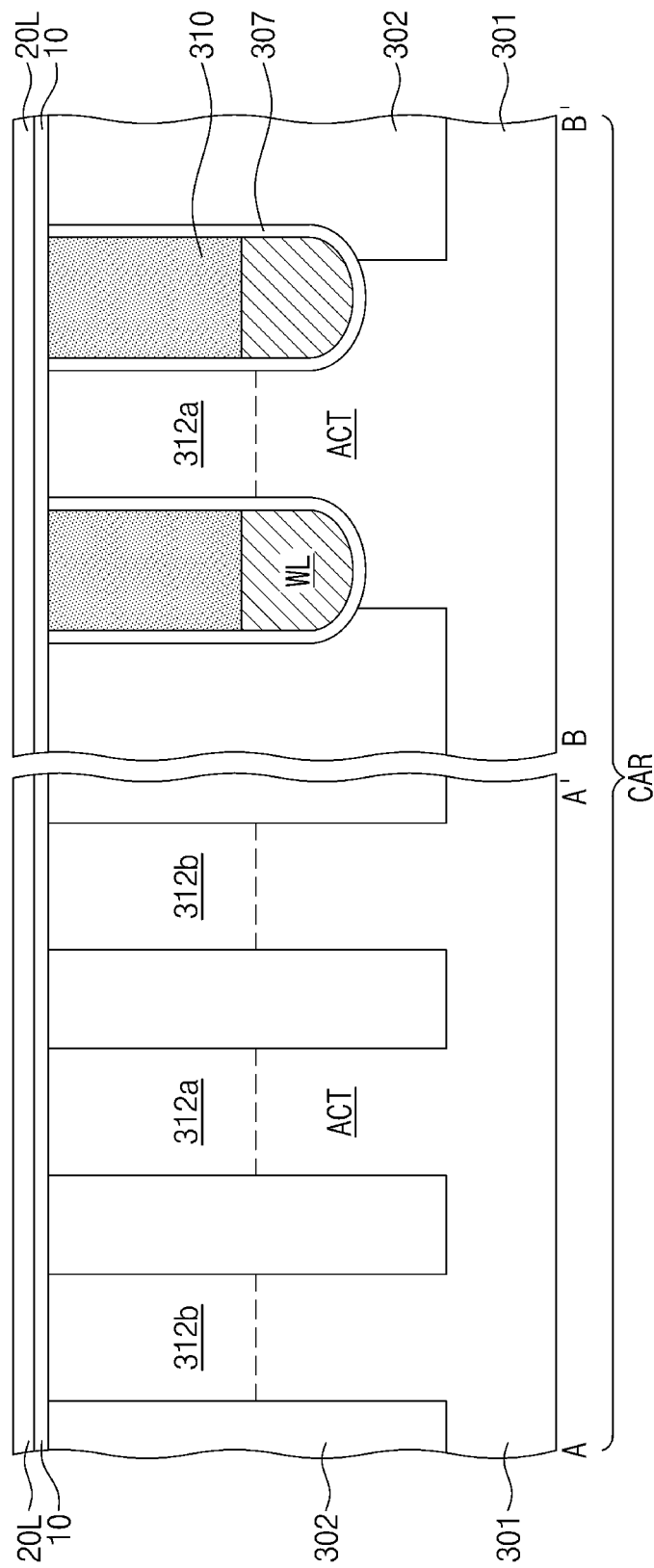
Figure 25B:
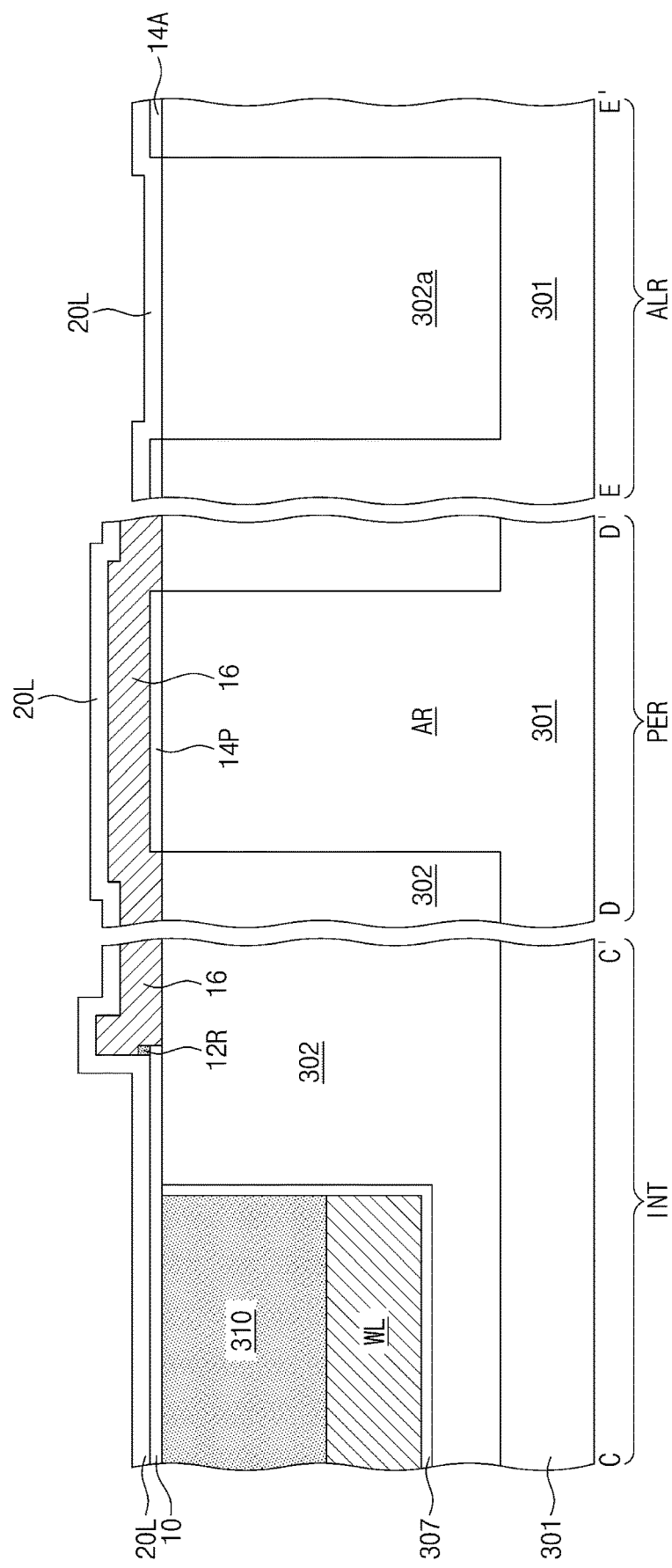

Referring to FIGS. 24A and 24B, the peripheral poly-silicon layer 16 may be formed to conformally cover the entire top surface of the substrate 301, which is in the state shown in FIGS. 3A and 3B. Here, the peripheral poly-silicon layer 16 is not doped with impurities to be in an undoped state. The first mask pattern 19 may be formed on the peripheral poly-silicon layer 16 to cover the peripheral circuit region PER and a portion of the interface region INT and to expose the cell array region CAR, the alignment key region ALR, and another portion of the interface region INT. The first mask pattern 19 may be a photoresist pattern. In an embodiment, the first mask pattern 19 may be overlapped with an end portion of the lower buffer layer 12.

Referring to FIGS. 24A and 24B and FIGS. 25A and 25B, the top surface of the lower buffer layer 12 may be exposed by removing the peripheral poly-silicon layer 16 from the cell array region CAR, which is not covered by the first mask pattern 19. Furthermore, the top surface of the alignment device isolation pattern 302a and the top surface of the alignment oxide layer 14A may be exposed in the alignment key region ALR. An anisotropic etching process may be performed to remove the lower buffer layer 12. At this time, the lower buffer remaining pattern 12R may be left. The first mask pattern 19 may be removed. Alternatively, the lower buffer layer 12 may be removed by an isotropic process (e.g., by a phosphoric acid strip process), as described with reference to FIGS. 5A and 5B. Thereafter, the second buffer layer 20L may be formed to conformally cover the entire top surface of the substrate 301. The second buffer layer 20L may be formed of or include the same material (e.g., silicon oxide) as the first buffer layer 10 and the device isolation pattern 302.

Referring to FIGS. 25A and 25B and FIGS. 26A and 26B, an anisotropic etching process may be performed to form the first recess region R1, as described with reference to FIGS. 7A and 7B. In this case, as shown in the A-A' section of FIG. 26B, the first recess region R1 may be shifted in the second direction D2 (e.g., in a left direction in the sectional view of FIG. 26B) relative to the first impurity region 312a, due to misalignment in position of the first recess region R1. At this time, an additional isotropic etching process to increase the width of the first recess region R1 is not performed. In the anisotropic etching process for forming the first recess region R1, the first recess region R1 may be formed to have a desired width (e.g., DS2 of FIG. 8B). The protection spacer 22 and the polysilicon spacer 24 may be formed to cover an inner side surface of the first recess region R1, as described with reference to FIG. 8B. Here, the first and second protection remaining patterns 22R1 and 22R2 of FIG. 8B are not formed. Thereafter, a bit-line contact layer DCL may be formed on the substrate 301, and then, a blanket etch-back process may be performed on the bit-line contact layer DCL to expose the top surface of the second buffer pattern 20P and to leave the bit-line contact layer DCL in the first recess region R1. In the cell array region CAR of FIG. 26A, the bit-line contact layer DCL may be formed to have a mesh shape. Sections taken along lines C-C', D-D', and E-E' of FIG. 26A may be the same as those in FIG. 25B.

Figure 27:
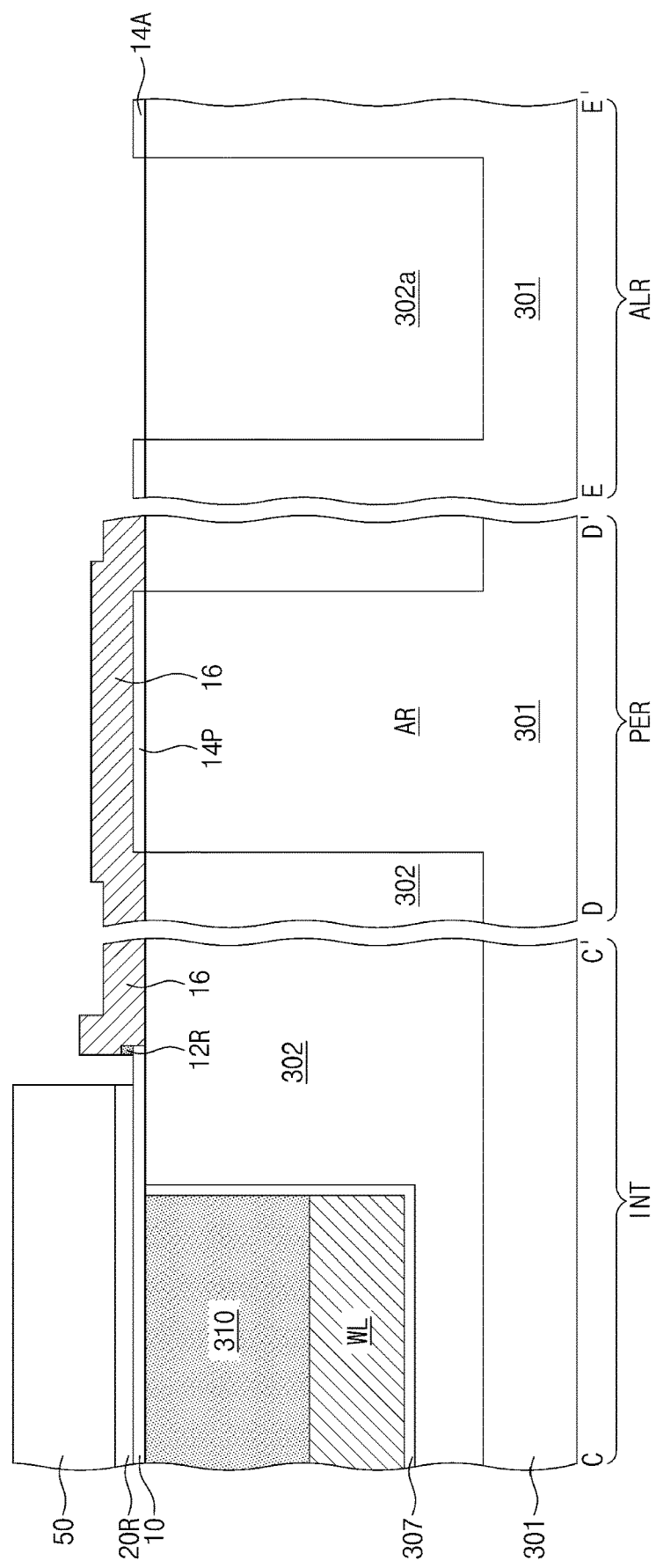

Referring to FIG. 27, a seventh mask pattern 50 may be formed on the substrate 301. The seventh mask pattern 50 may be formed to cover a portion of the interface region INT and to expose the peripheral circuit region PER, the alignment key region ALR, and another portion of the interface region INT. Although not shown, the seventh mask pattern 50 may cover the cell array region CAR, which is in the state shown in FIG. 25A. An anisotropic etching process using the seventh mask pattern 50 as an etch mask may be performed to remove the second buffer layer 20L from the peripheral circuit region PER, and thus, the peripheral poly-silicon layer 16 may be exposed. In an embodiment, the second buffer layer 20L may also be removed from the alignment key region ALR. Furthermore, in the interface region INT, a portion of the second buffer layer 20L may be removed to form the second buffer remaining pattern 20R.

Figure 28A:
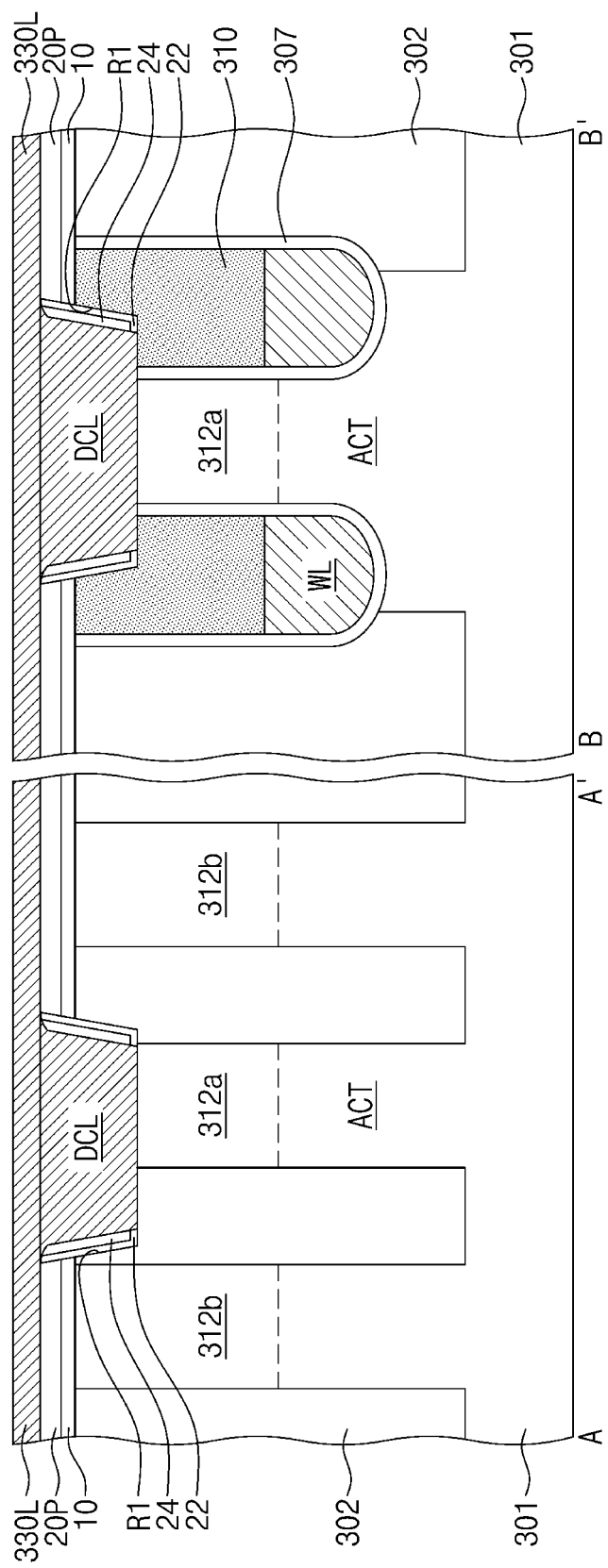
Figure 28B:
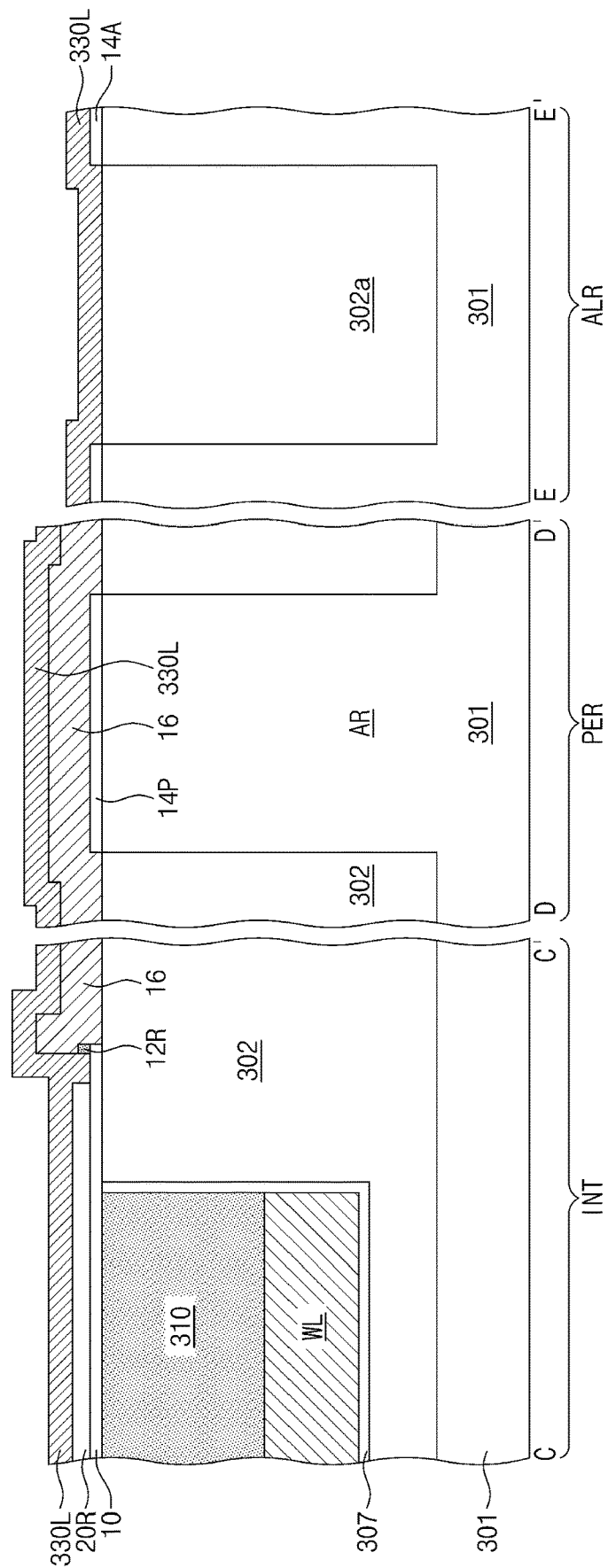

Referring to FIGS. 27 and 28A and FIG. 28B, the seventh mask pattern 50 may be removed. The bit-line poly-silicon layer 330L may be conformally formed on the substrate 301. The subsequent process may be performed in the same or similar manner as described with reference to FIGS. 9A to 17 to fabricate the semiconductor memory device of FIGS. 23A and 23B.

Figure 29A:
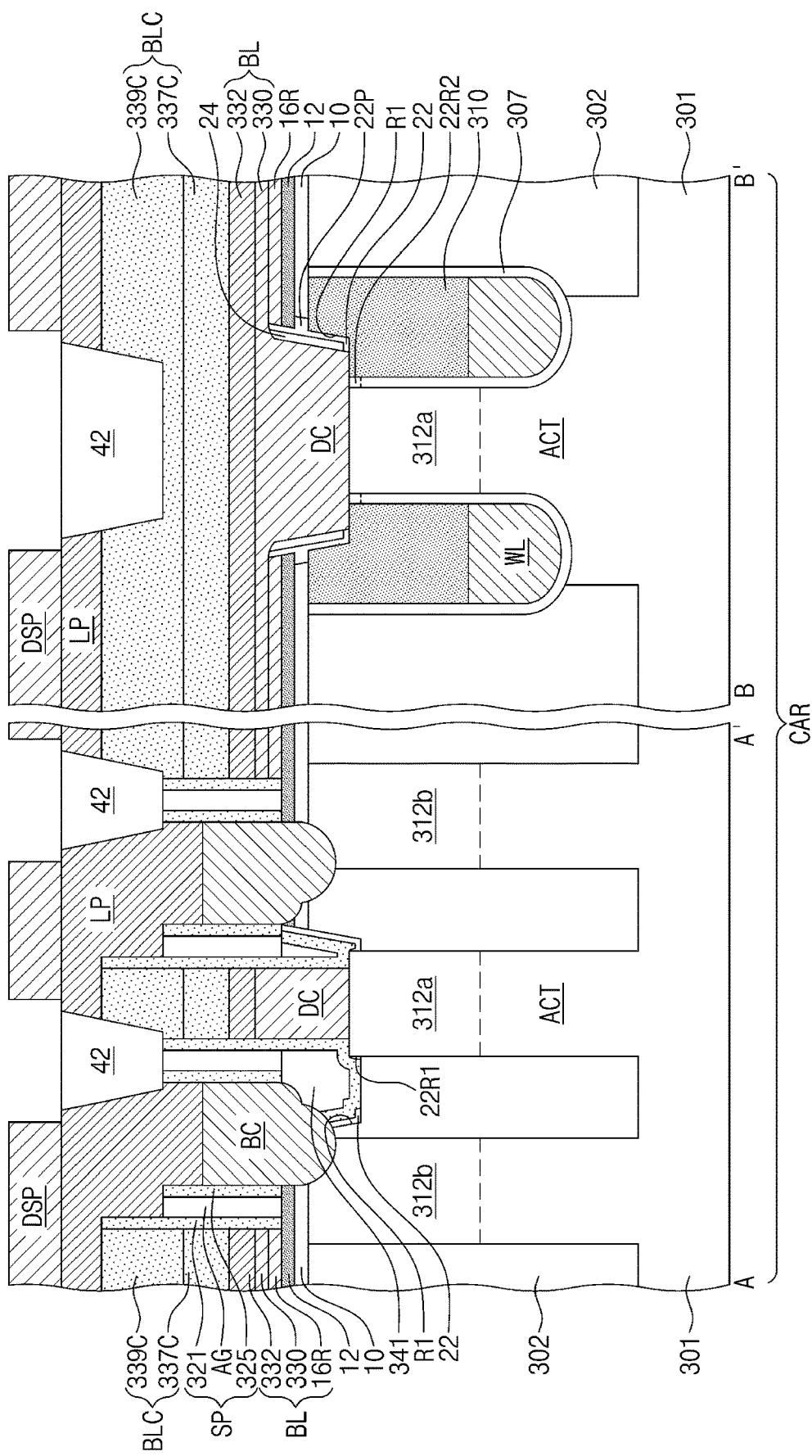
FIG. 29A is a sectional view taken along the lines A-A' and B-B' of FIG. 1A.
Figure 29B:
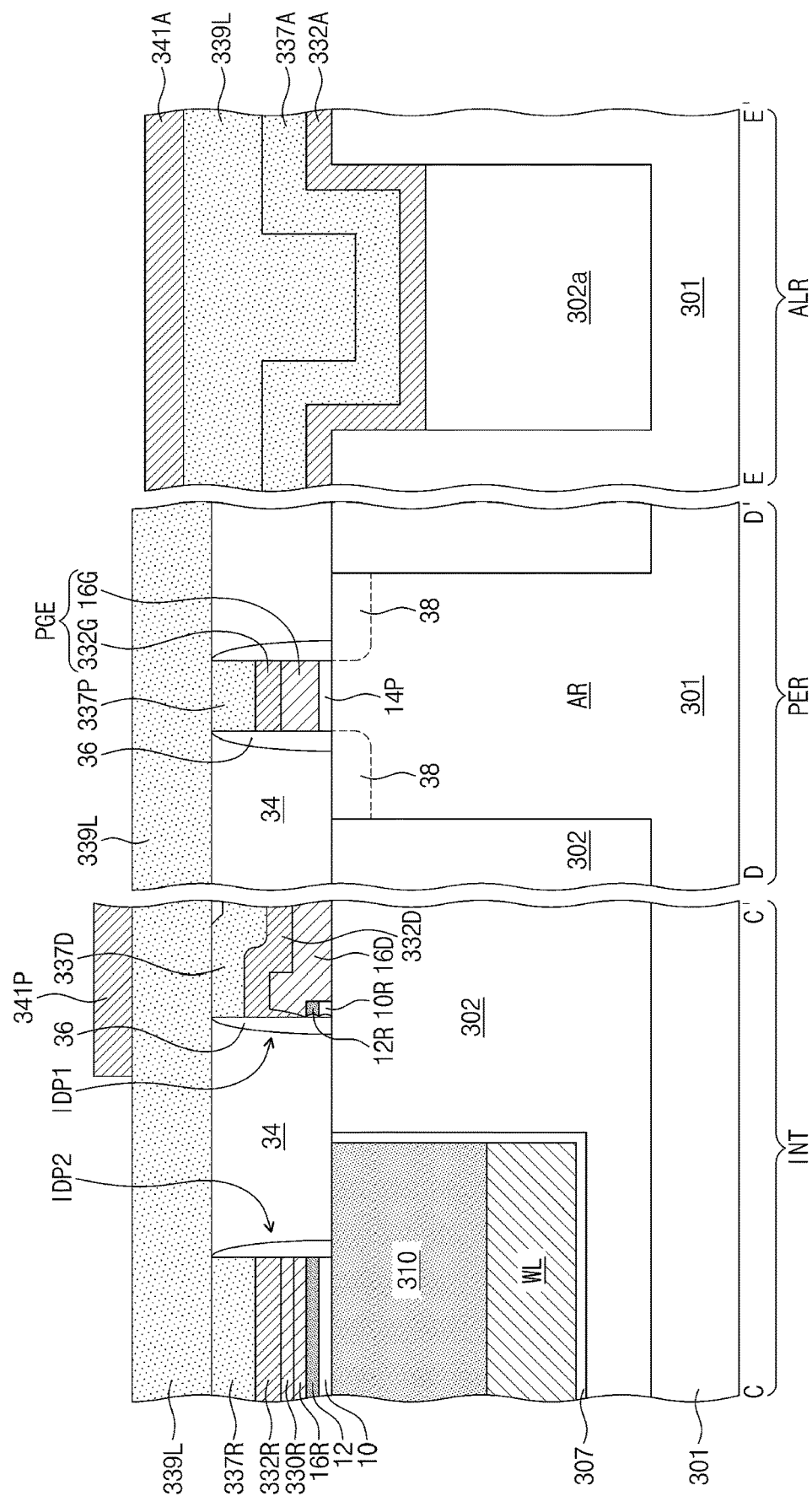
FIG. 29B is a sectional view taken along the lines C-C', D-D', and E-E' of FIG. 1A.

FIG. 29A is a sectional view taken along the lines A-A' and B-B' of FIG. 1A. FIG. 29B is a sectional view taken along the lines C-C', D-D', and E-E' of FIG. 1A.

Referring to FIG. 29A, the bit line BL may include a peripheral polysilicon remaining layer 16R, the bit-line polysilicon pattern 330, and the bit-line metal-containing pattern 332, which are sequentially stacked when viewed in the A-A' section of FIG. 29A. The first buffer layer 10 and the lower buffer layer 12 may be interposed between the bit line BL and the substrate 301. The bit line BL may be in contact with the lower buffer layer 12. The lower buffer layer 12 may be formed of or include a material different from the first buffer layer 10. The storage node contact BC may be provided to penetrate the lower buffer layer 12 and the first buffer layer 10 and to be in contact with the second impurity region 312b.

When viewed in the B-B' section of FIG. 29A, the bit-line contact DC may be composed of a portion of the bit-line polysilicon pattern 330. In a region beside the bit-line contact DC, the peripheral polysilicon remaining layer 16R may be interposed between the bit-line polysilicon pattern 330 and the device isolation pattern 302. The first buffer layer 10 and the lower buffer layer 12 may be interposed between the peripheral polysilicon remaining layer 16R and the device isolation pattern 302. The side surface of the first buffer layer 10 is not aligned to the side surface of the lower buffer layer 12. The side surface of the lower buffer layer 12 may protrude toward the bit-line contact DC, relative to the first buffer layer 10. The protection spacer 22 may cover an inner side surface of the first recess region R1. The protection spacer 22 may further include a protection spacer protruding portion 22P inserted into a region between the lower buffer layer 12 and the word-line capping pattern 310. An upper portion of the protection spacer 22 may cover a side surface of the peripheral polysilicon remaining layer 16R. Thus, the upper portion of the protection spacer 22 may protrude above the top surface of the lower buffer layer 12. In addition, an upper portion of the polysilicon spacer 24 may also protrude above the top surface of the lower buffer layer 12. Except for the afore-described features, the device according to the present embodiment may have substantially the same features as that described with reference to FIG. 21.

Referring to FIG. 29B, the second interfacial dummy pattern IDP2 may include the first buffer layer 10, the lower buffer layer 12, the peripheral polysilicon remaining layer 16R, the second polysilicon remaining pattern 330R, the second metal remaining pattern 332R, and the second capping remaining pattern 337R, which are sequentially stacked on the word-line capping pattern 310. Except for the afore-described features, the device according to the present embodiment may have substantially the same features as that described with reference to FIG. 1C.

FIGS. 30A and 31 to 33 are sectional views sequentially illustrating a process of fabricating the semiconductor memory device of FIG. 29A. FIG. 30B is a sectional view sequentially illustrating a process of fabricating the semiconductor memory device of FIG. 29B.

Figure 30A:
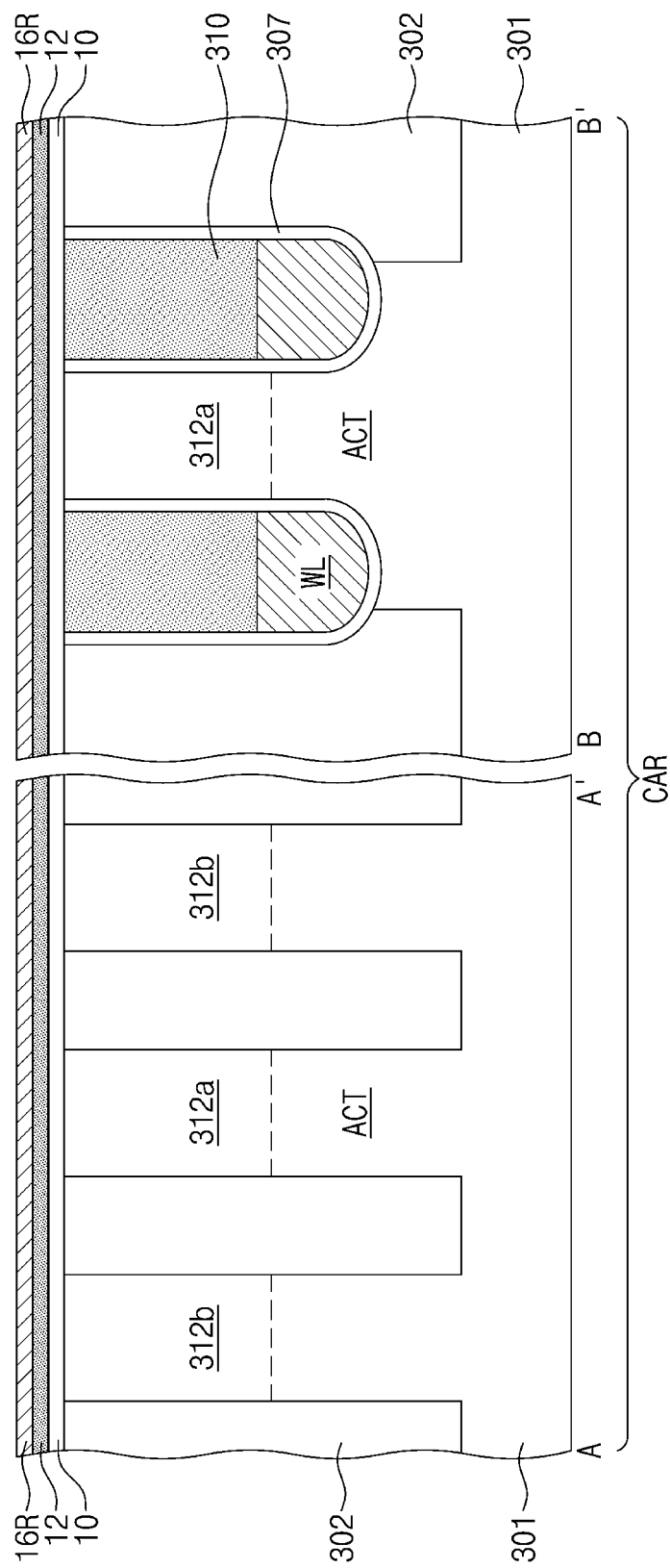
FIGS. 30A and 31 to 33 are sectional views sequentially illustrating a process of fabricating the semiconductor memory device of FIG. 29A.
Figure 30B:
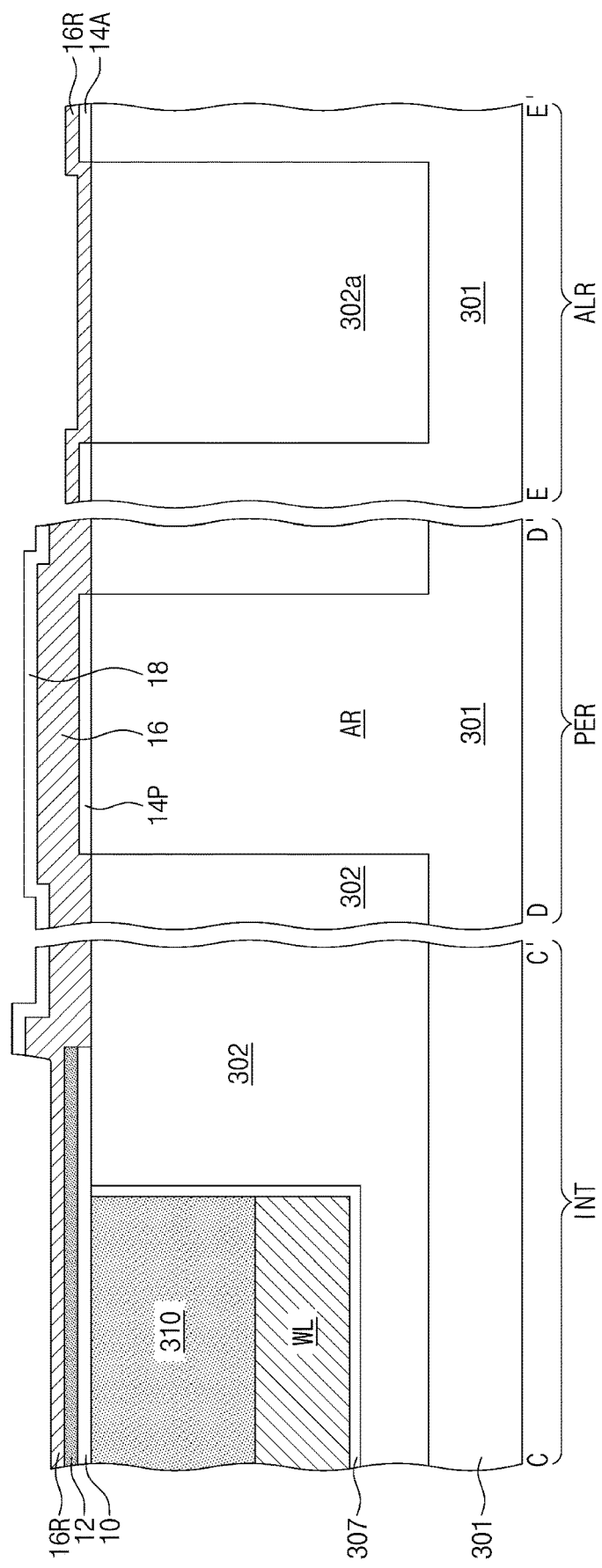
FIG. 30B is a sectional view sequentially illustrating a process of fabricating the semiconductor memory device of FIG. 29B.

Referring to FIGS. 30A and 30B, the top surface of the peripheral poly-silicon layer 16 may be exposed by removing the infiltration prevention layer 18 from the cell array region CAR, the alignment key region ALR, and a portion of the interface region INT using the first mask pattern 19 as an etch mask, in the state shown in FIGS. 4A and 4B. Next, an anisotropic etching process may be performed on the peripheral poly-silicon layer 16 using the first mask pattern 19 as an etch mask. In an embodiment, the peripheral poly-silicon layer 16 is not fully removed from the cell array region CAR, the alignment key region ALR, and a portion of the interface region INT, and may be left to a specific thickness. Accordingly, the top surface of the lower buffer layer 12 is not exposed to the outside, and the peripheral polysilicon remaining layer 16R may be formed. Thereafter, the first mask pattern 19 may be removed to expose a top surface of the infiltration prevention layer 18 in the peripheral circuit region PER. The peripheral polysilicon remaining layer 16R may protect the lower buffer layer 12.

Figure 31:
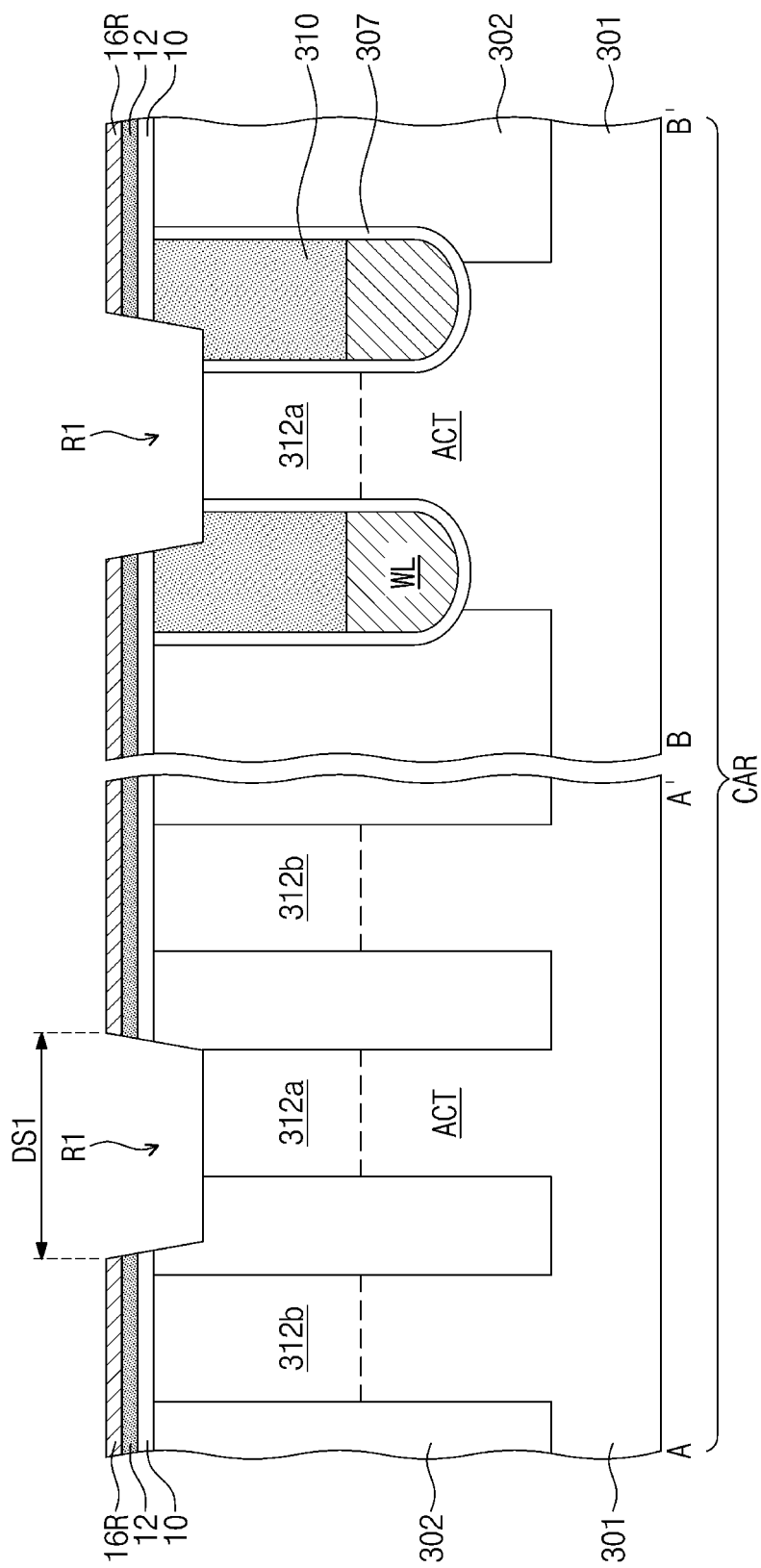

Referring to FIG. 31, the first recess region R1 with a first upper width DS1 may be formed by etching the peripheral polysilicon remaining layer 16R, the lower buffer layer 12, the first buffer layer 10, a portion of the device isolation pattern 302, and a portion of the substrate 301 in the cell array region CAR.

Figure 32:
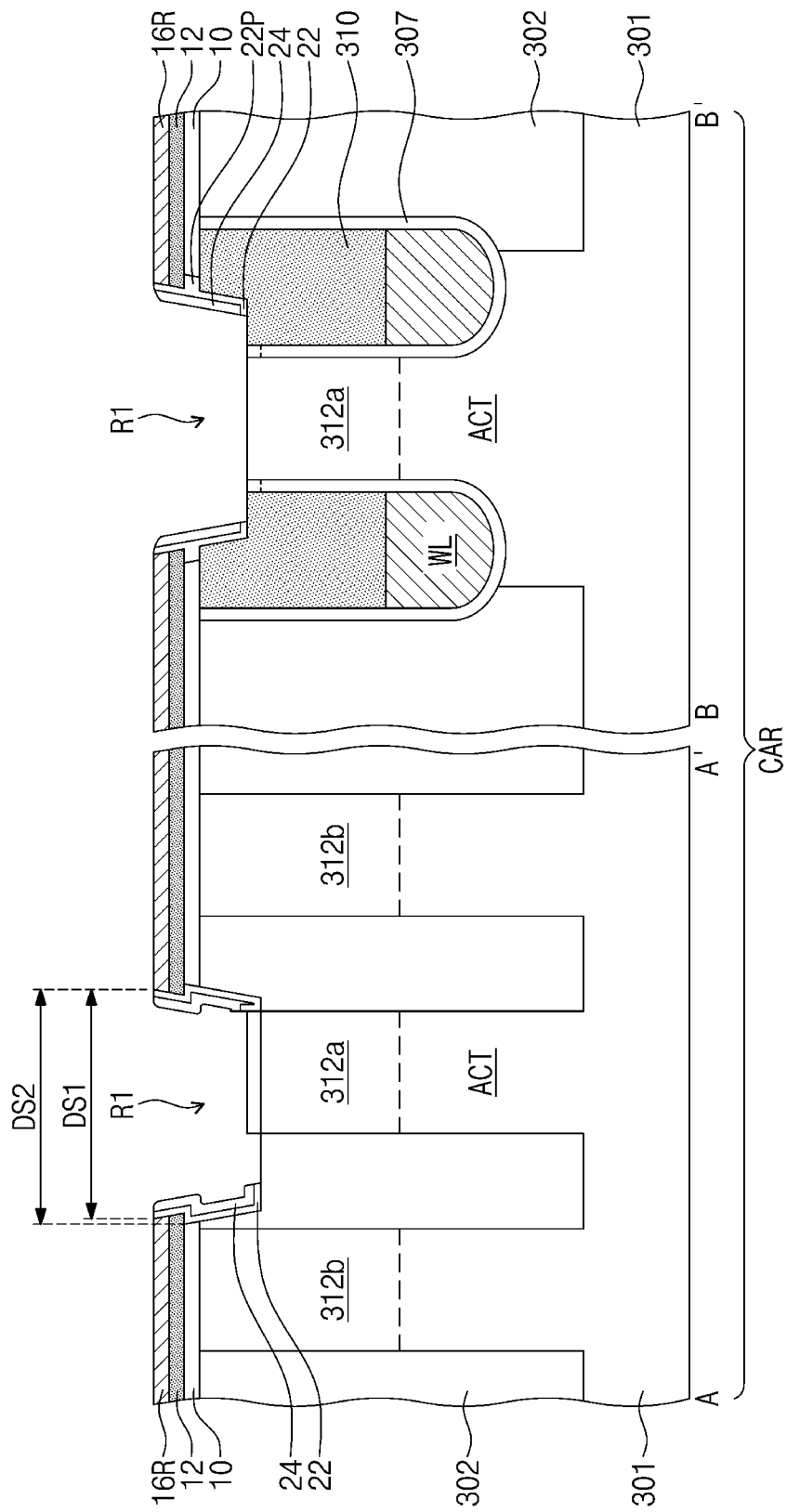

Referring to FIG. 32, an isotropic etching process may be performed on the first buffer layer 10 to allow the first recess region R1 to have an inner width DS2 larger than the first upper width DS1, as described with reference to FIG. 7B. At this time, a portion of the device isolation pattern 302 and a portion of the cell gate dielectric layer 307 may be removed. However, the lower buffer layer 12 and the peripheral polysilicon remaining layer 16R are not removed. Thus, the first recess region R1 may have the inner width DS2 that is greater than the first upper width DS1. When viewed in the B-B' section of FIG. 32, a portion of the first buffer layer 10 may be removed to partially expose a bottom surface of the lower buffer layer 12 and a top surface of the word-line capping pattern 310. Thereafter, the protection spacer 22 and the polysilicon spacer 24 may be formed, as described with reference to FIG. 8B. When viewed in the B-B' section of FIG. 32, the protection spacer 22 may have a protection spacer protruding portion 22P protruding into a region between the lower buffer layer 12 and the word-line capping pattern 310. An upper portion of the protection spacer 22 may cover a side surface of the peripheral polysilicon remaining layer 16R. Thus, the upper portion of the protection spacer 22 may protrude above the top surface of the lower buffer layer 12. In addition, an upper portion of the polysilicon spacer 24 may also protrude above the top surface of the lower buffer layer 12.

Figure 33:
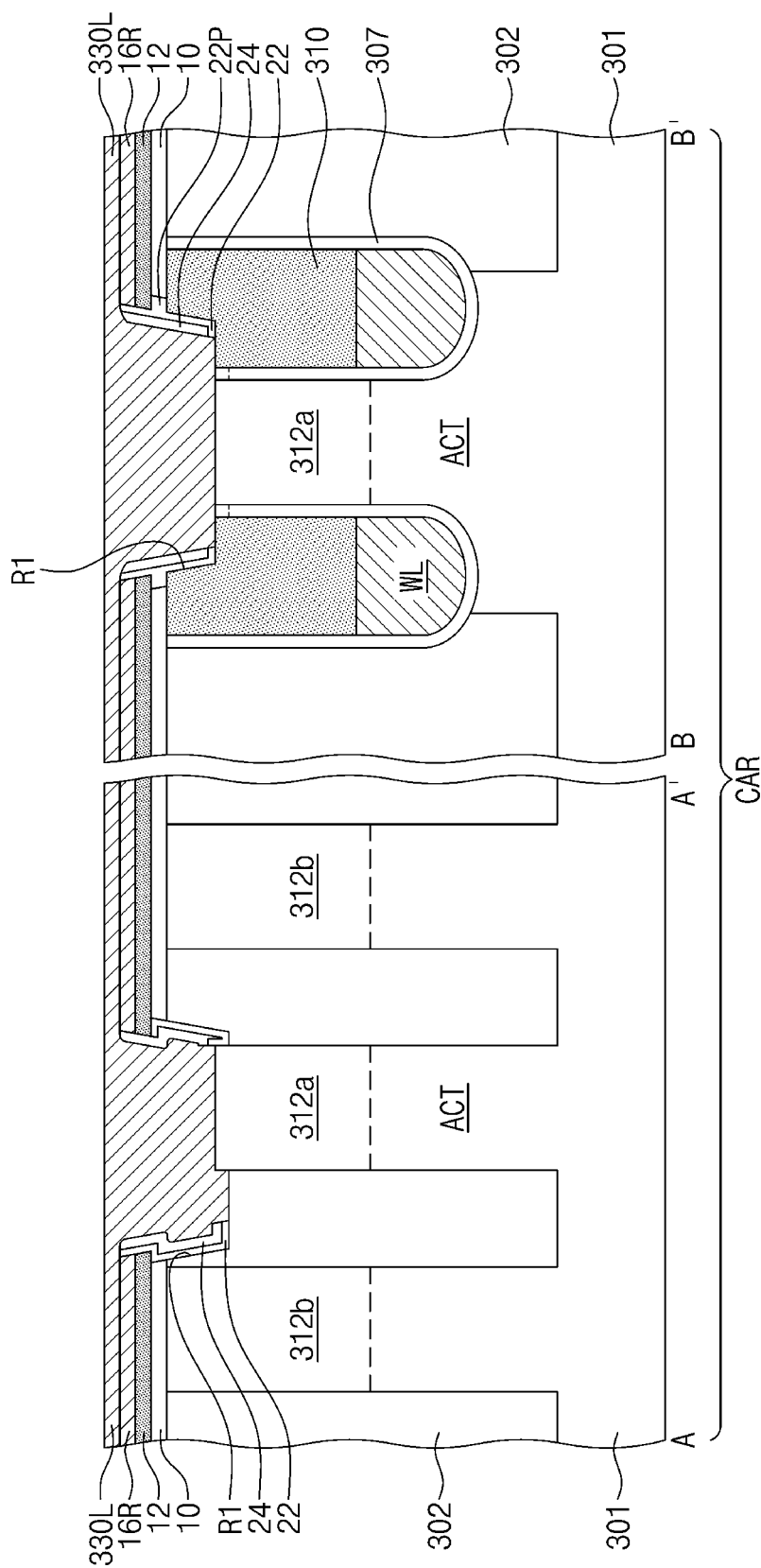

Referring to FIG. 33, the bit-line poly-silicon layer 330L may be deposited on the substrate 301 to fully fill the first recess region R1. Thereafter, a blanket anisotropic etching process may be performed on the bit-line poly-silicon layer 330L, and thus, the bit-line poly-silicon layer 330L may have a specific thickness on the peripheral polysilicon remaining layer 16R. The subsequent process may be performed in the same or similar manner as described with reference to FIGS. 9A to 17 to fabricate the semiconductor memory device of FIGS. 29A and 29B.

When the anisotropic etching processes of FIGS. 31 and 32 is performed, the peripheral polysilicon remaining layer 16R of FIG. 30B may protect the interface region INT, the peripheral circuit region PER, and the alignment key region ALR. In particular, the peripheral polysilicon remaining layer 16R may prevent the lower buffer layer 12, which is disposed on the device isolation pattern 302 adjacent to the side surface of the end portion of the word line WL in the interface region INT, from being damaged, and thus, the top surface of the first buffer layer 10 is not exposed. Accordingly, it may be possible to remove an upper portion of the alignment device isolation pattern 302a in the alignment key region ALR, without forming the fourth mask pattern 30 in the step of FIG. 12. Accordingly, a photolithography process for forming the fourth mask pattern 30 may be omitted.

Figure 34A:
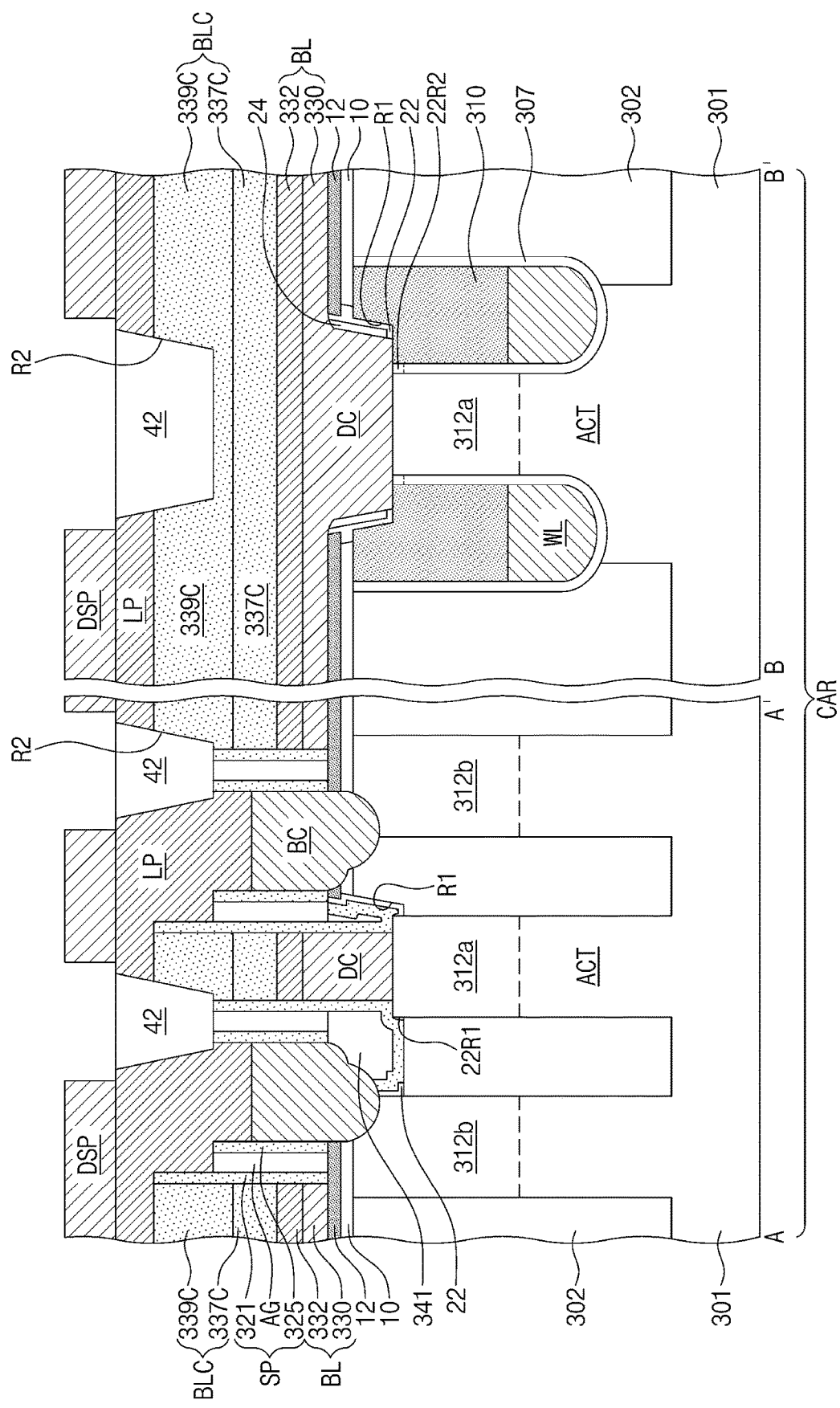
FIG. 34A is a sectional view taken along the lines A-A' and B-B' of FIG. 1A.
Figure 34B:
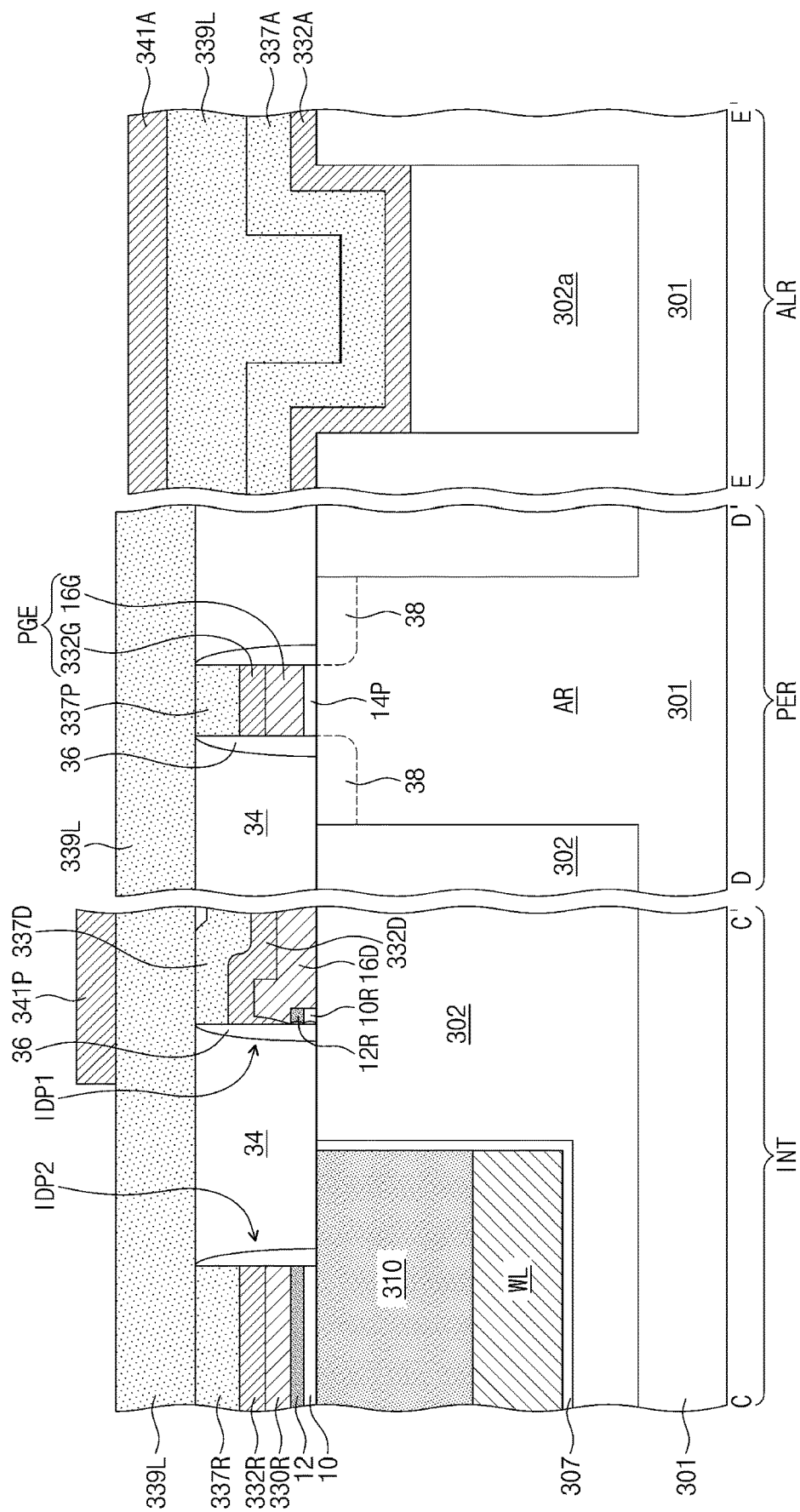
FIG. 34B is a sectional view taken along the lines C-C', D-D', and E-E' of FIG. 1A.

FIG. 34A is a sectional view taken along the lines A-A' and B-B' of FIG. 1A. FIG. 34B is a sectional view taken along the lines C-C', D-D', and E-E' of FIG. 1A.

Referring to FIG. 34A, the bit line BL may include the bit-line polysilicon pattern 330 and the bit-line metal-containing pattern 332, when viewed in the A-A' section of FIG. 34A. The first buffer layer 10 and the lower buffer layer 12 may be interposed between the bit line BL and the substrate 301. The bit line BL may be in contact with the lower buffer layer 12. When viewed in the B-B' section of FIG. 36A, the bit-line contact DC may be composed of a portion of the bit-line polysilicon pattern 330. In a region beside the bit-line contact DC, the first buffer layer 10 and the lower buffer layer 12 may be interposed between the bit-line polysilicon pattern 330 and the device isolation pattern 302. The side surface of the first buffer layer 10 is not aligned to the side surface of the lower buffer layer 12. The side surface of the lower buffer layer 12 may protrude toward the bit-line contact DC, relative to the first buffer layer 10. The topmost portions of the protection spacer 22 and the polysilicon spacer 24 may be located at the same level as the top surface of the lower buffer layer 12. Except for the afore-described features, the device according to the present embodiment may have substantially the same features as that described with reference to FIG. 31A.

Referring to FIG. 34B, the second interfacial dummy pattern IDP2 may include the first buffer layer 10, the lower buffer layer 12, the second polysilicon remaining pattern 330R, the second metal remaining pattern 332R, and the second capping remaining pattern 337R, which are sequentially stacked on the word-line capping pattern 310. Except for the afore-described features, the device according to the present embodiment may have substantially the same features as that described with reference to FIG. 29B.

Figure 35A:
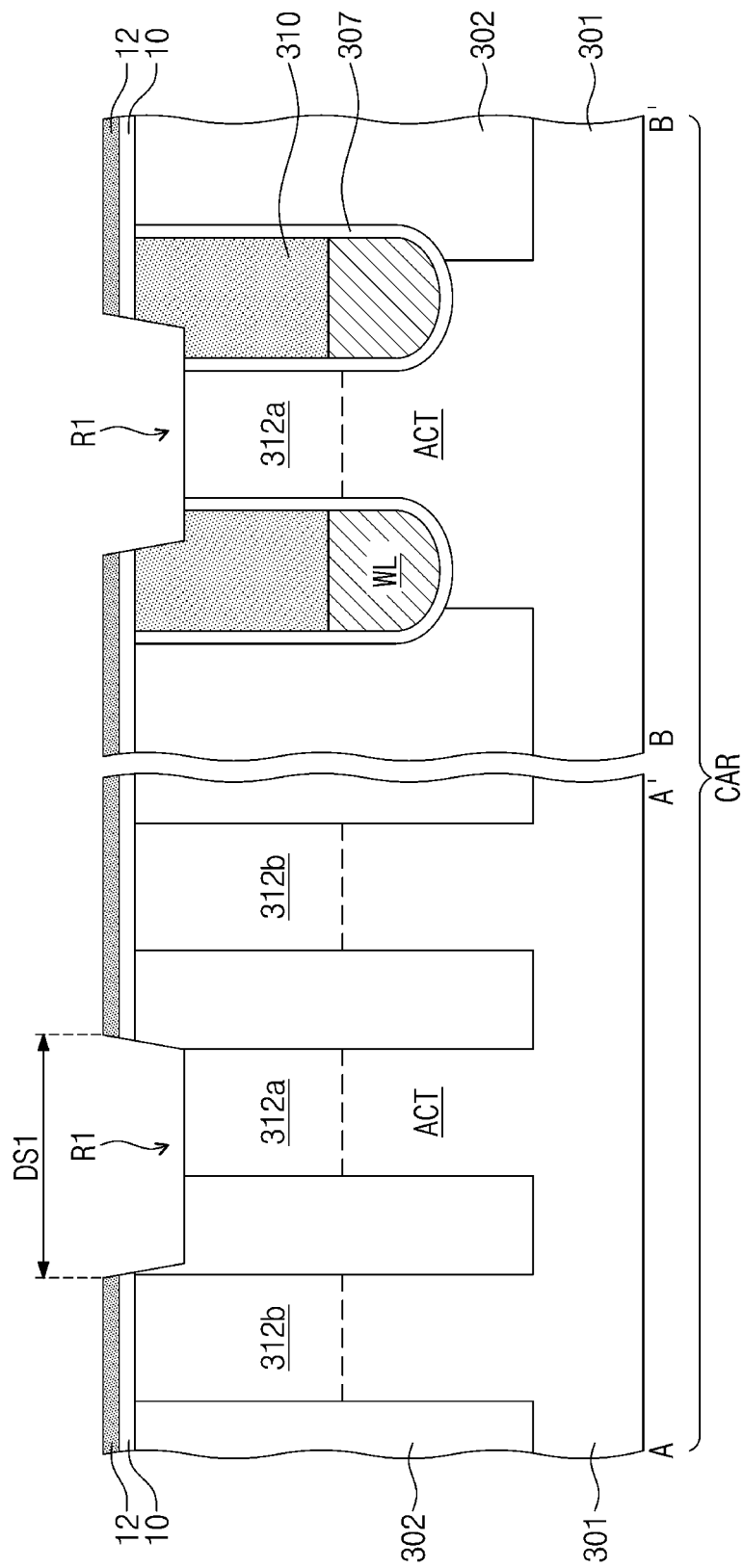
FIGS. 35A and 35B are sectional views sequentially illustrating a process of fabricating the semiconductor memory device of FIG. 34A.
Figure 35B:
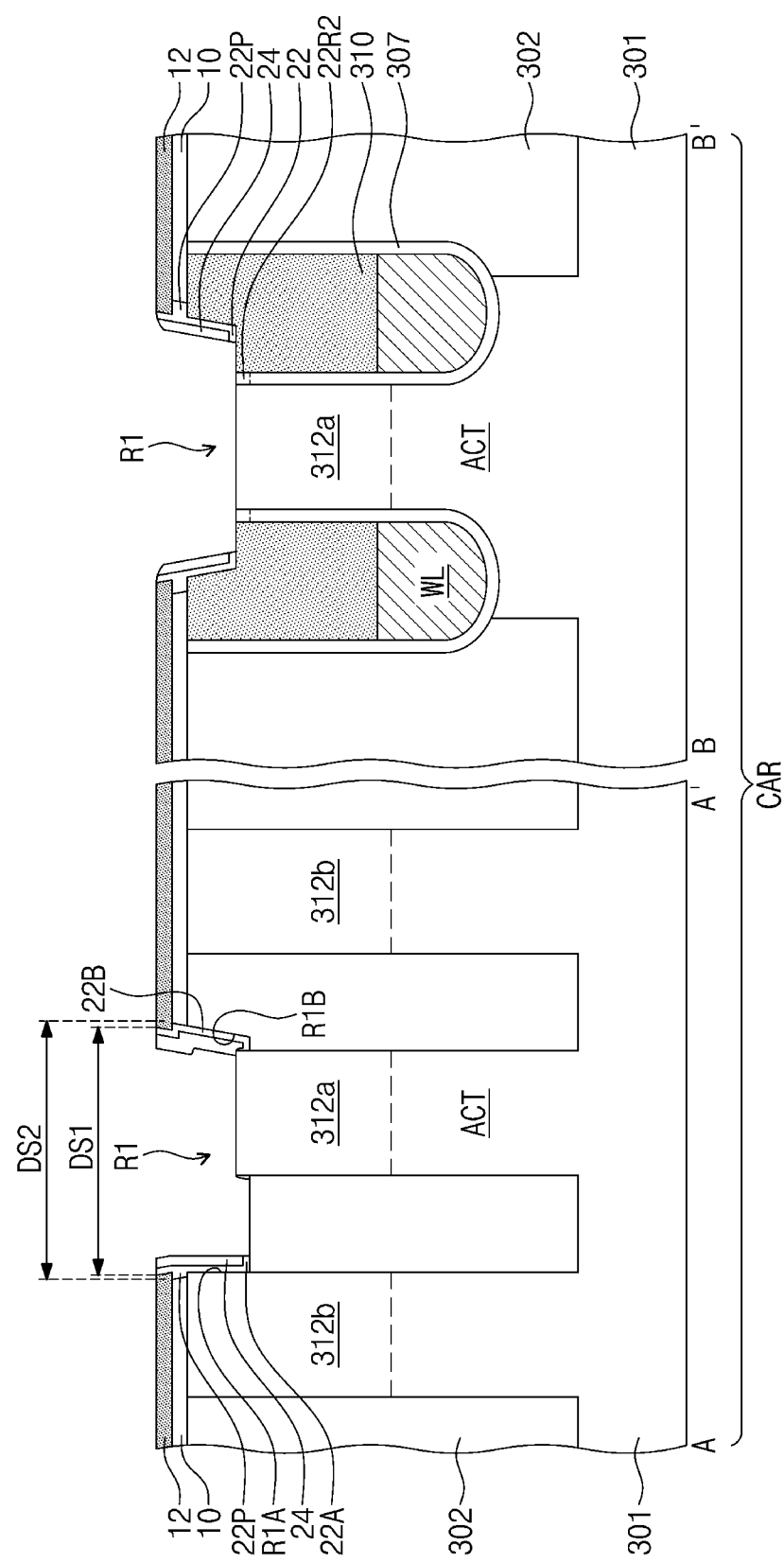

FIGS. 35A and 35B are sectional views sequentially illustrating a process of fabricating the semiconductor memory device of FIG. 34A.

Figure 5A:
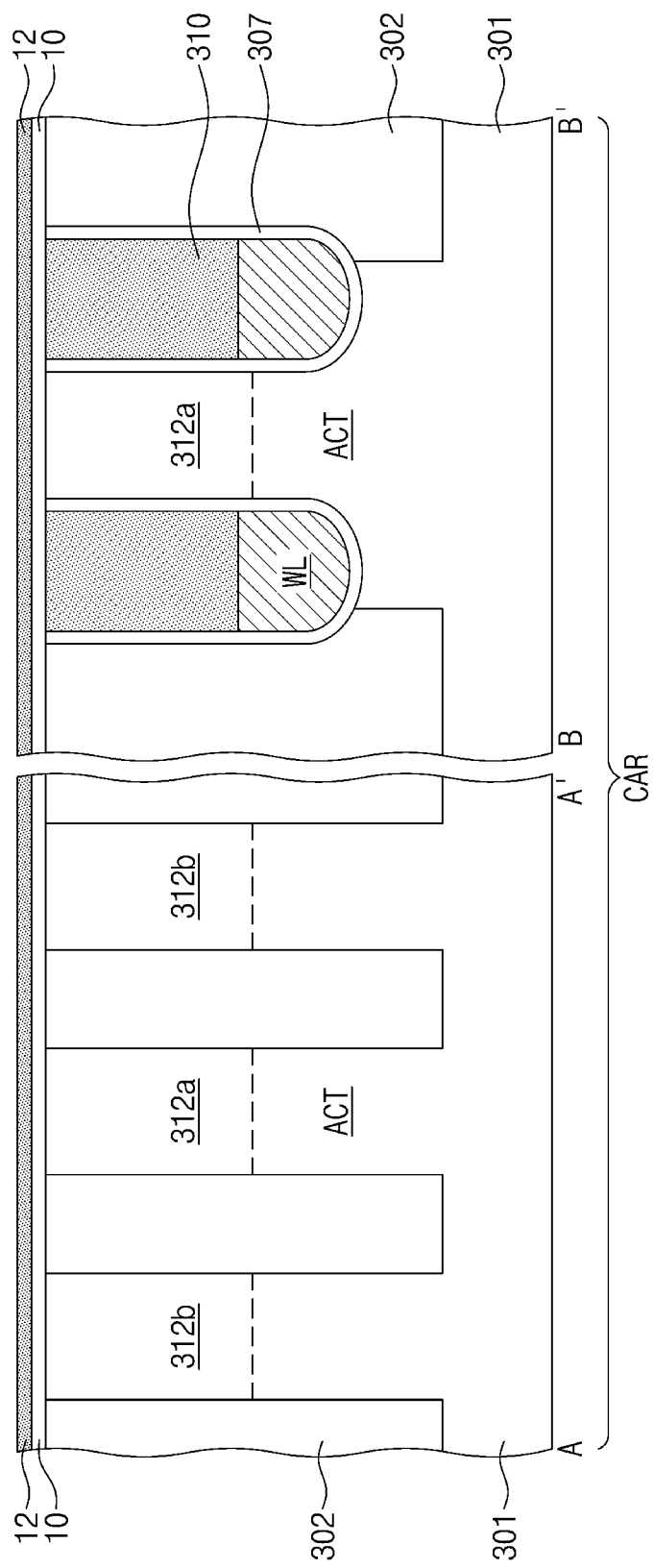

Referring to FIG. 35A, the first recess region R1 may be formed by an anisotropic etching process of partially removing the lower buffer layer 12, the first buffer layer 10, the device isolation pattern 302, and the substrate 301, not by a process (e.g., a phosphoric acid strip process) of removing the lower buffer layer 12 of FIG. 6A, in the state shown in FIG. 5A. The first recess region R1 may be formed to have the first upper width DS1. In an embodiment, the top portion of the substrate 301 provided with the second impurity region 312b may be exposed through the first inner side surface of the first recess region R1.

Referring to FIG. 35B, an isotropic etching process may be performed on the first buffer layer 10 to allow the first recess region R1 to have an inner width DS2 larger than the first upper width DS1, as described with reference to FIG. 7B. The first recess region R1 may have the first inner side surface R1A and the second inner side surface R1B, which are asymmetric to each other. Here, the device isolation pattern 302 near the first inner side surface R1A may be partially removed to expose the side surface of the top portion of the substrate 301 provided with the second impurity region 312b. Since a portion of the first buffer layer 10 is removed, the bottom surface of the lower buffer layer 12 and the top surface of the substrate 301 may be exposed. Thereafter, the protection spacers 22A and 22B and the polysilicon spacer 24 may be formed, as described with reference to FIG. 8B. The first protection spacer 22A may be in contact with the first inner side surface R1A. The first protection spacer 22A may include a protection spacer protruding portion 22P protruding into a region between the lower buffer layer 12 and the substrate 301. The second protection spacer 22B may be in contact with the second inner side surface R1B. The first protection spacer 22A may have a different shape from the second protection spacer 22B. The subsequent process may be performed in the same or similar manner as described with reference to FIGS. 9A to 17 to fabricate the semiconductor memory device of FIGS. 34A and 34B.

Figure 36A:
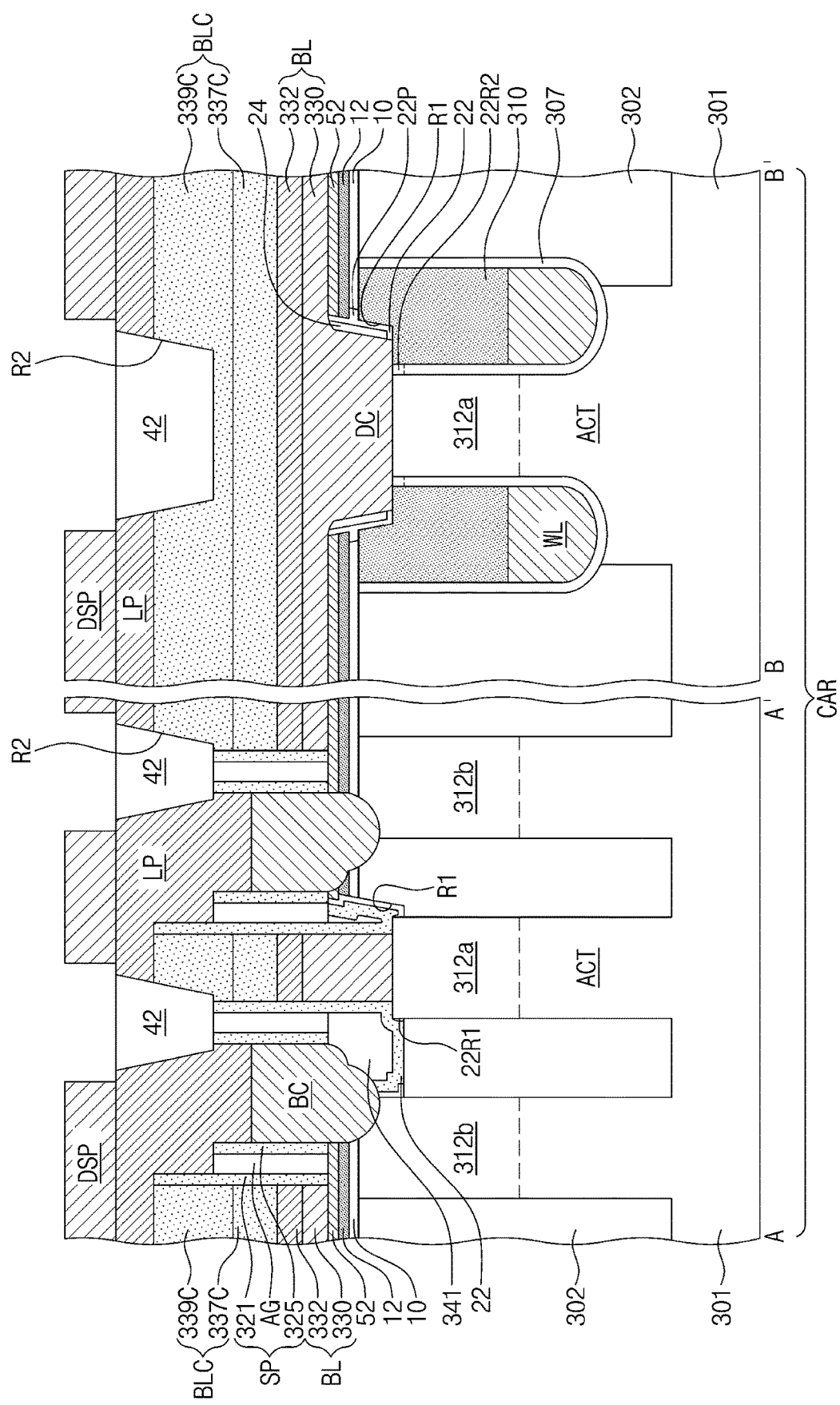
FIG. 36A is a sectional view taken along the lines A-A' and B-B' of FIG. 1A.
Figure 36B:
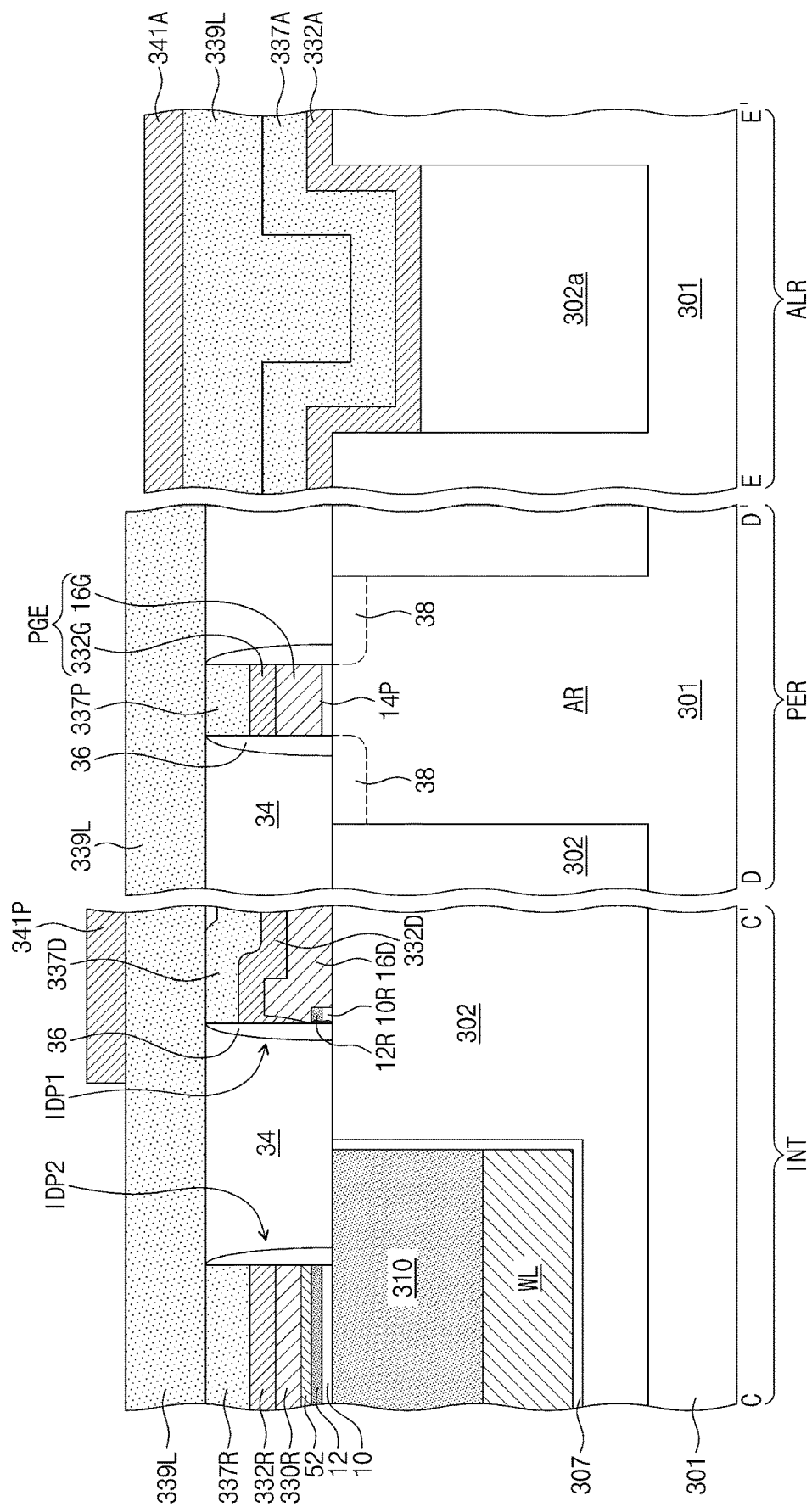
FIG. 36B is a sectional view taken along the lines C-C', D-D', and E-E' of FIG. 1A.

FIG. 36A is a sectional view taken along the lines A-A' and B-B' of FIG. 1A. FIG. 36B is a sectional view taken along the lines C-C', D-D', and E-E' of FIG. 1A.

Referring to FIG. 36A, a buffer protection layer 52 may be interposed between the bit line BL and the lower buffer layer 12, when viewed in the A-A' section of FIG. 36A. The buffer protection layer 52 may be formed of or include a material different from the lower buffer layer 12 and the first buffer layer 10. For example, the buffer protection layer 52 may be formed of or include silicon carbon oxide. The storage node contact BC may penetrate the buffer protection layer 52, the lower buffer layer 12, and the first buffer layer 10 and may be in contact with the second impurity region 312b. When viewed in the B-B' section of FIG. 36A, the buffer protection layer 52 may be interposed between the bit-line polysilicon pattern 330 and the lower buffer layer 12. A side surface of the buffer protection layer 52 may be aligned to the side surface of the lower buffer layer 12. The protection spacer 22 may cover the side surfaces between the lower buffer layer 12 and the buffer protection layer 52. The topmost portions of the protection spacer 22 and the polysilicon spacer 24 may be located at the same level as a top surface of the buffer protection layer 52. Except for the afore-described features, the device according to the present embodiment may have substantially the same features as that described with reference to FIG. 34A.

Referring to FIG. 36B, the second interfacial dummy pattern IDP2 may include the first buffer layer 10, the lower buffer layer 12, the buffer protection layer 52, the second polysilicon remaining pattern 330R, the second metal remaining pattern 332R, and the second capping remaining pattern 337R, which are sequentially stacked on the word-line capping pattern 310. Except for the afore-described features, the device according to the present embodiment may have substantially the same features as that described with reference to FIG. 34B.

Figure 37A:
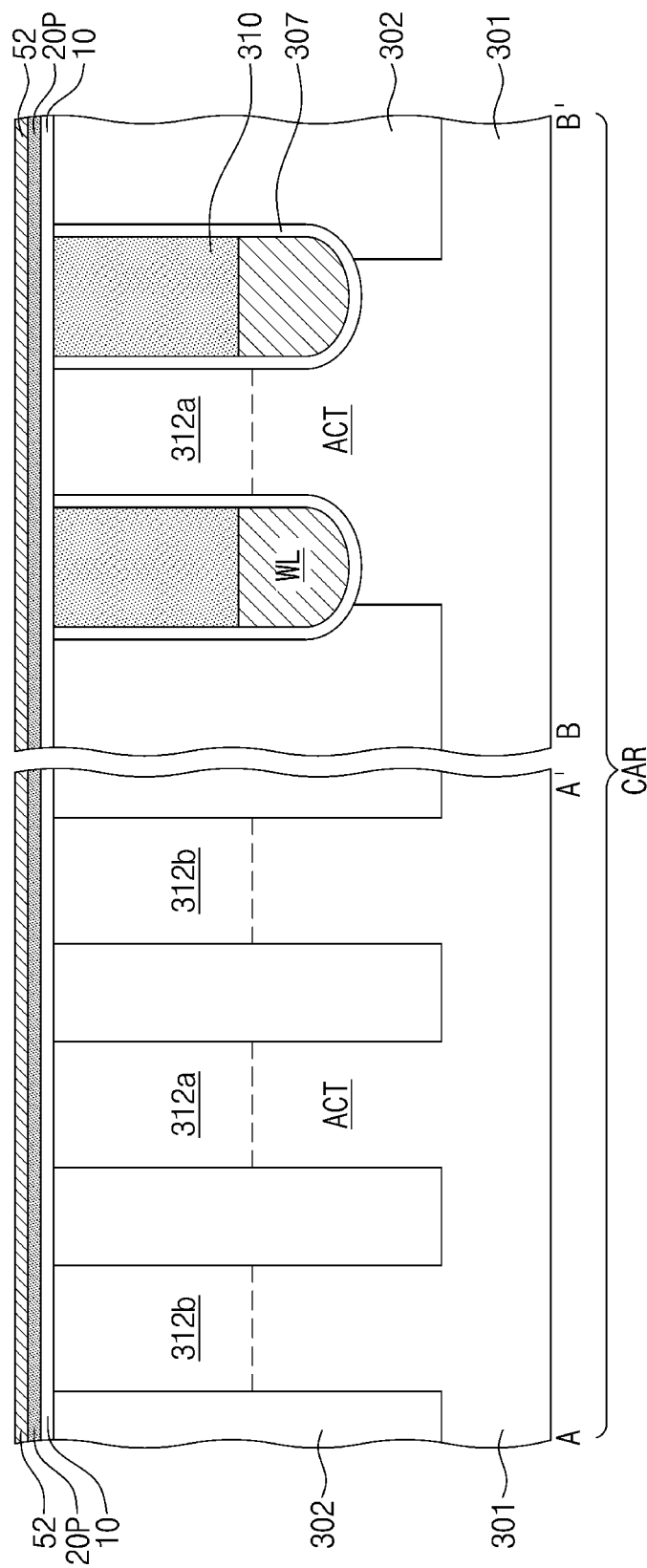
FIGS. 37A, 38, and 39 are sectional views illustrating a process of fabricating the semiconductor memory device of FIG. 36A.
Figure 37B:
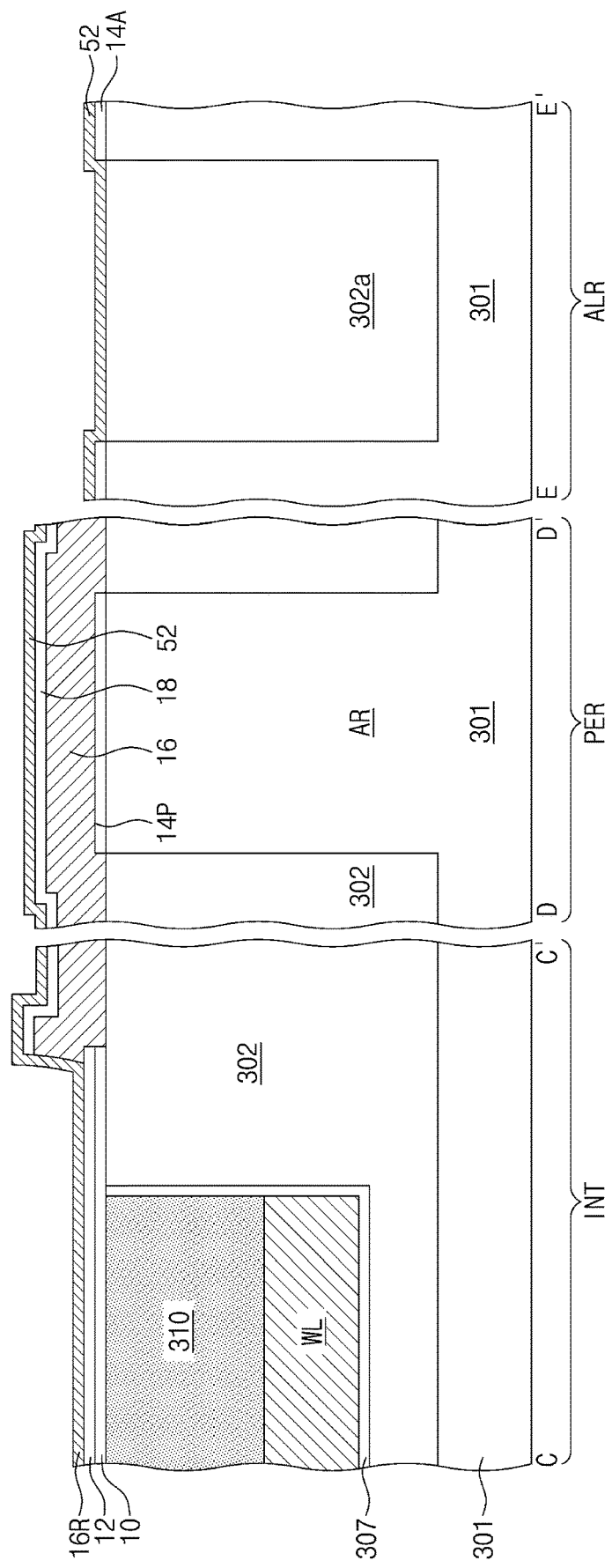
FIG. 37B is a sectional view illustrating a process of fabricating the semiconductor memory device of FIG. 36B.
Figure 38:
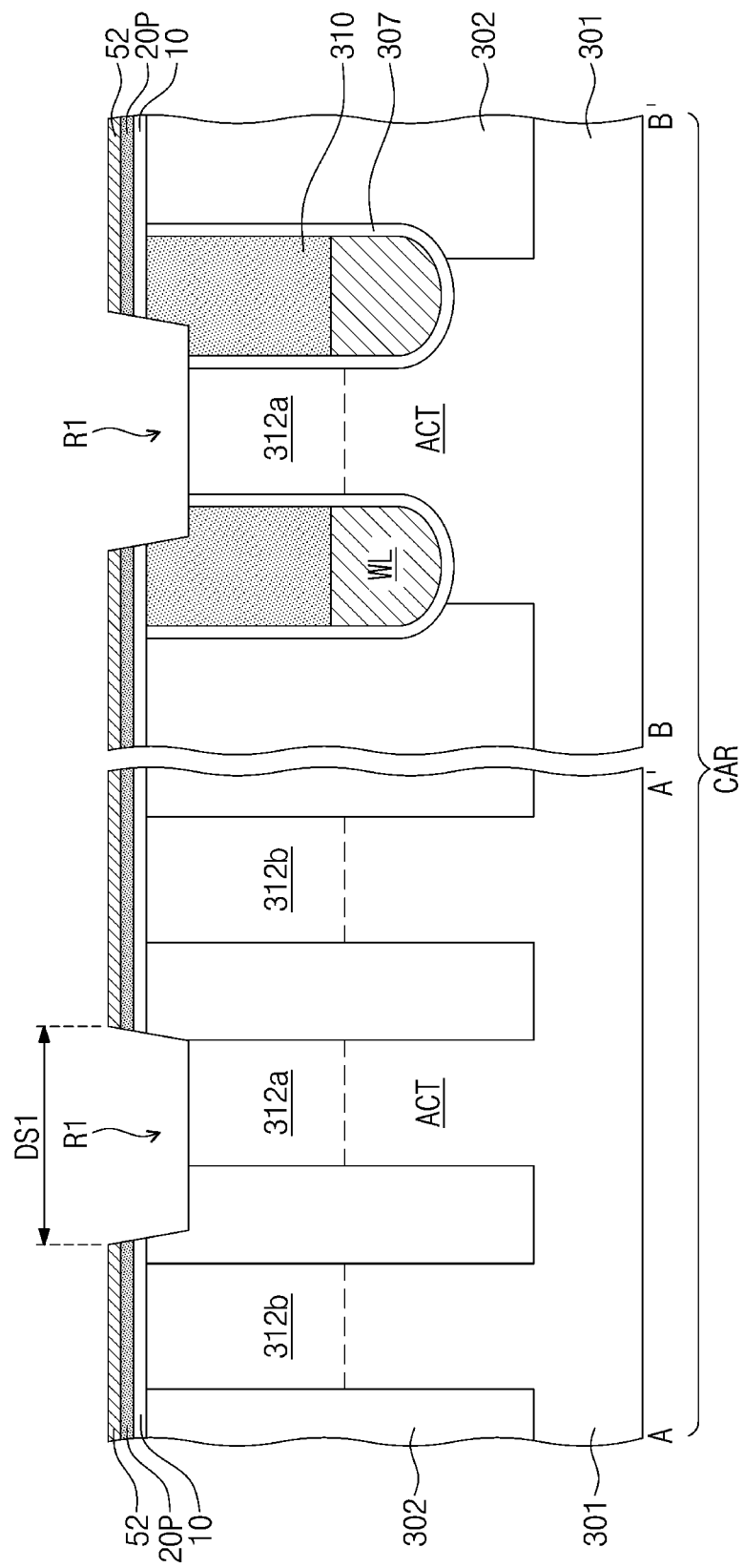
Figure 39:
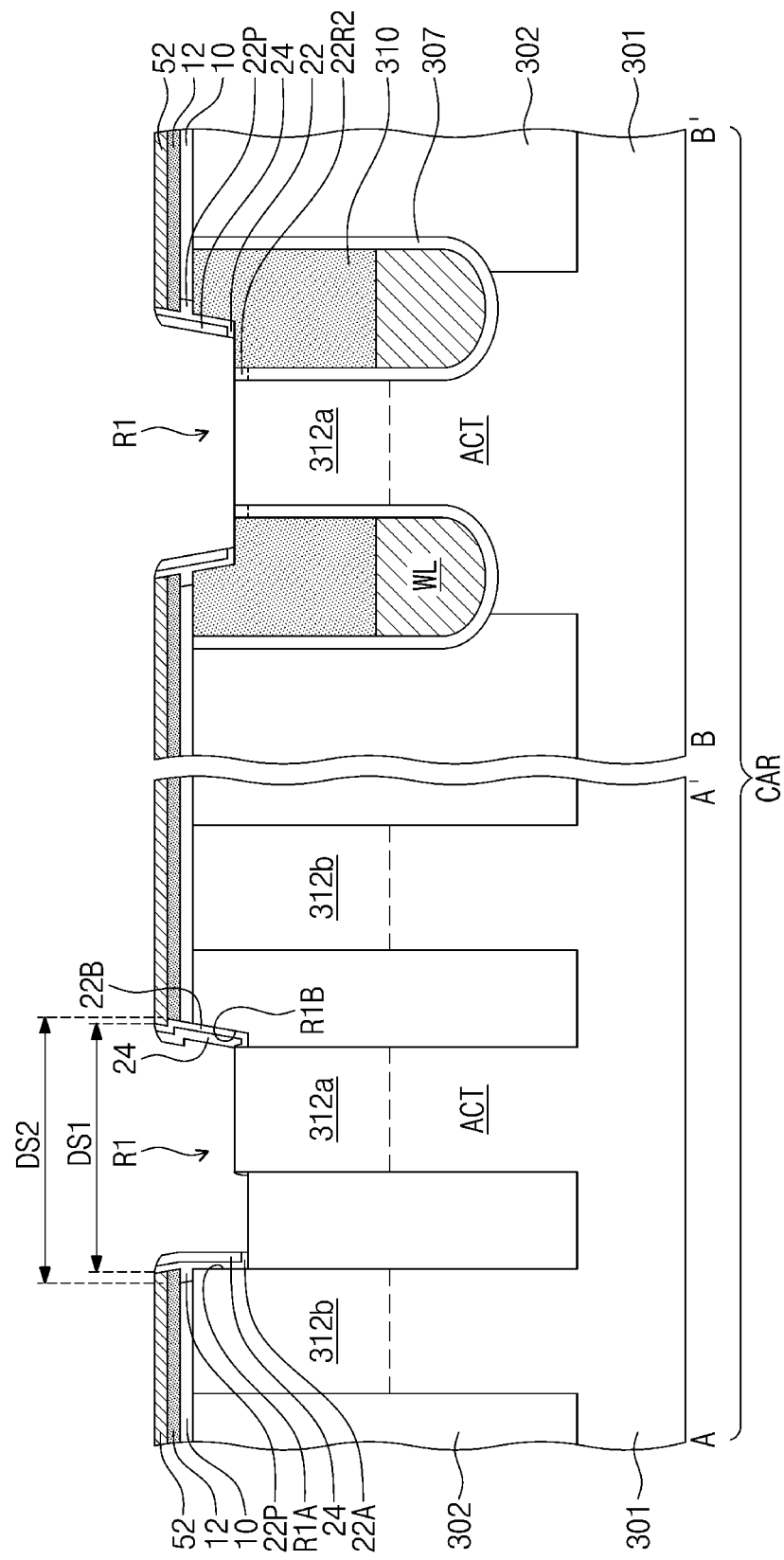

FIGS. 37A, 38, and 39 are sectional views illustrating a process of fabricating the semiconductor memory device of FIG. 36A. FIG. 37B is a sectional view illustrating a process of fabricating the semiconductor memory device of FIG. 36B.

Figure 5B:
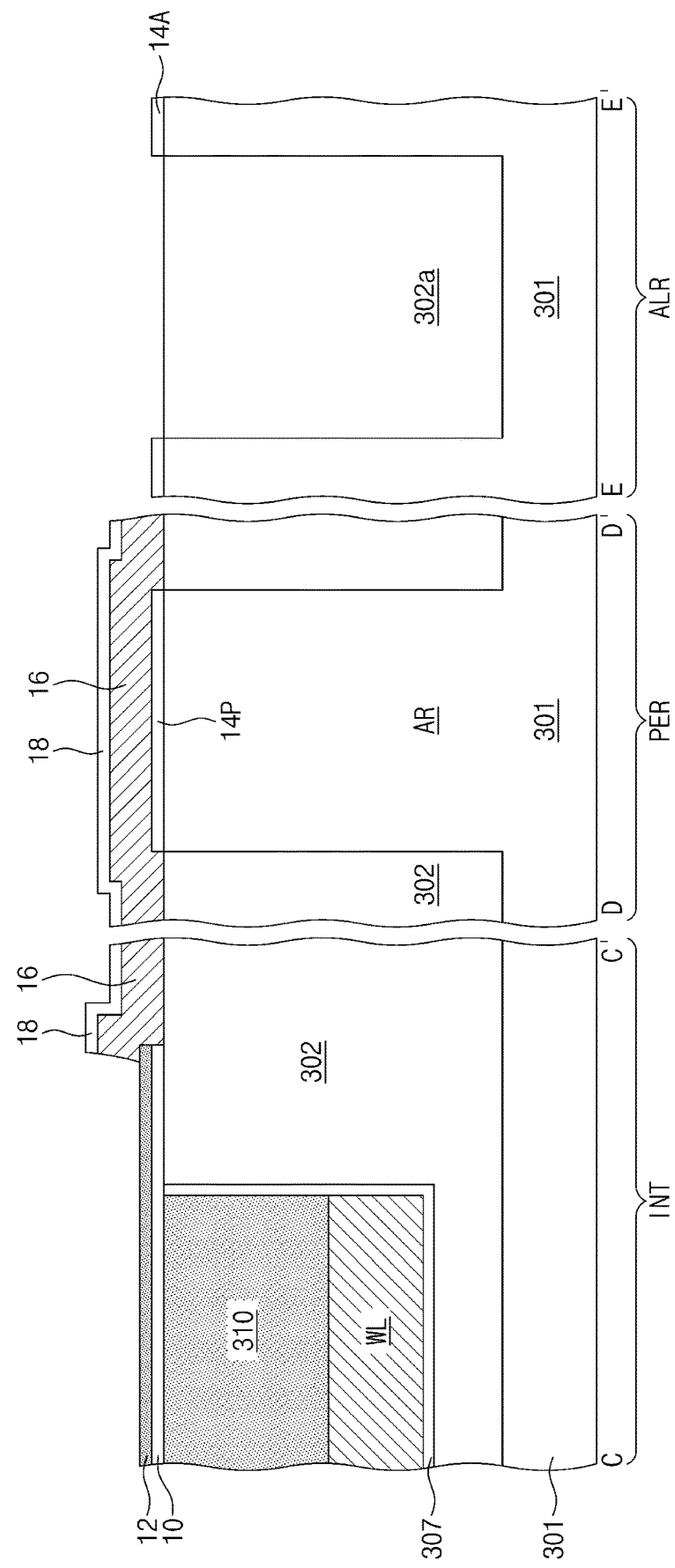

Referring to FIGS. 37A and 37B, a process (e.g., a phosphoric acid strip process) of removing the lower buffer layer 12 of FIG. 6A is not performed in the step of FIGS. 5A and 5B, and the buffer protection layer 52 may be formed to conformally cover the entire top surface of the substrate 301. The buffer protection layer 52 may be formed of or include silicon carbon oxide.

Referring to FIG. 38, the first recess region R1 may be formed by partially removing the buffer protection layer 52, the lower buffer layer 12, the first buffer layer 10, the device isolation pattern 302, and the substrate 301 in the cell array region CAR. The first recess region R1 may be formed to have the first upper width DS1. In an embodiment, the top portion of the substrate 301 provided with the second impurity region 312b may be exposed through the first inner side surface of the first recess region R1.

Referring to FIG. 39, an isotropic etching process may be performed on the first buffer layer 10, as described with reference to FIG. 7B, and in this case, the inner width DS2 of the first recess region R1 may be increased to be larger than the first upper width DS1. The first recess region R1 may have the first inner side surface R1A and the second inner side surface R1B, which are asymmetric to each other. Thereafter, the protection spacers 22A and 22B and the polysilicon spacer 24 may be formed, as described with reference to FIG. 8B. A subsequent process may be performed in the same or similar manner as that described with reference to FIGS. 9A to 17. Here, the buffer protection layer 52 is not removed, and in this case, the semiconductor memory device of FIGS. 36A and 36B may be formed. If the buffer protection layer 52 is removed, the final structure may be the same as that shown in FIGS. 34A and 34B.

When the anisotropic etching processes of FIGS. 38 and 39 is performed, the buffer protection layer 52 of FIG. 37B may protect the interface region INT, the peripheral circuit region PER, and the alignment key region ALR. In particular, the buffer protection layer 52 may prevent the lower buffer layer 12, which is disposed on the device isolation pattern 302 adjacent to the side surface of the end portion of the word line WL in the interface region INT, from being damaged, and thus, the top surface of the first buffer layer 10 is not exposed. Accordingly, it may be possible to remove an upper portion of the alignment device isolation pattern 302a in the alignment key region ALR, without forming the fourth mask pattern 30 in the step of FIG. 12. Thus, a photolithography process for forming the fourth mask pattern 30 may be omitted.

Figure 40A:
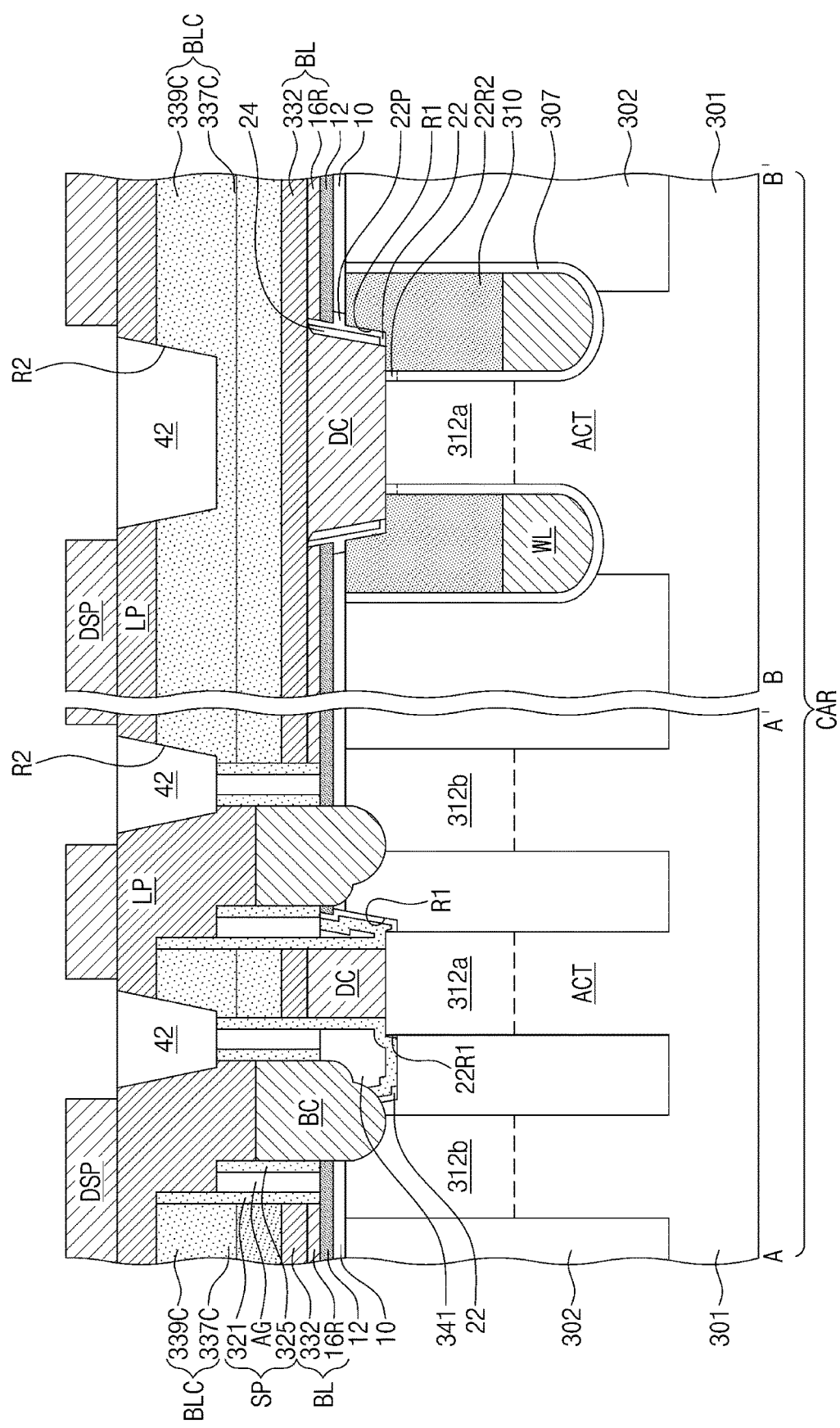
FIG. 40A is a sectional view taken along the lines A-A' and B-B' of FIG. 1A.
Figure 40B:
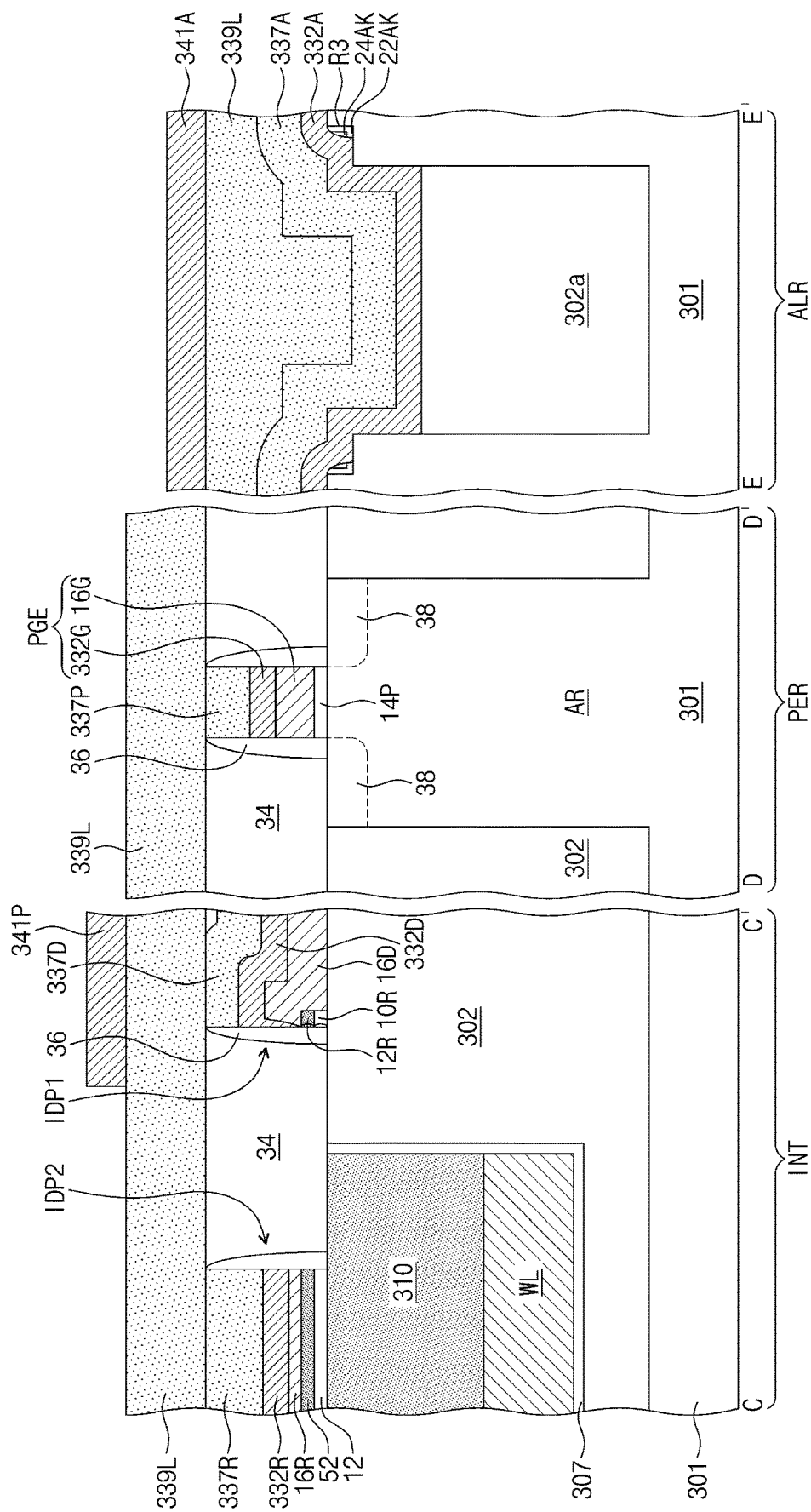
FIG. 40B is a sectional view taken along the lines C-C', D-D', and E-E' of FIG. 1A.

FIG. 40A is a sectional view taken along the lines A-A' and B-B' of FIG. 1A. FIG. 40B is a sectional view taken along the lines C-C', D-D', and E-E' of FIG. 1A.

When viewed in the A-A' section of FIG. 40A, the bit line BL may include the peripheral polysilicon remaining layer 16R and the bit-line metal-containing pattern 332. The peripheral polysilicon remaining layer 16R may be in contact with the bit-line metal-containing pattern 332. The peripheral polysilicon remaining layer 16R may be in contact with the lower buffer layer 12. When viewed in the B-B' section of FIG. 40A, the bit-line contact DC is not composed of a portion of the bit-line polysilicon pattern 330. The protection spacer 22 and the polysilicon spacer 24 may have top portions that are located at the same level as the top surface of the peripheral polysilicon remaining layer 16R. The top portions of the protection spacer 22 and the polysilicon spacer 24 may be in contact with the bit-line metal-containing pattern 332. The protection spacer 22 and the polysilicon spacer 24 may be interposed between the bit-line contact DC and the peripheral polysilicon remaining layer 16R. Except for the afore-described features, the device according to the present embodiment may have substantially the same features as that described with reference to FIG. 36A.

Referring to FIG. 40B, the second interfacial dummy pattern IDP2 may include the first buffer layer 10, the lower buffer layer 12, the peripheral polysilicon remaining layer 16R, the second metal remaining pattern 332R, and the second capping remaining pattern 337R, which are sequentially stacked on the word-line capping pattern 310. In the alignment key region ALR, a third recess region R3 may be formed in the top surface of the substrate 301. A bottom surface of the third recess region R3 may be higher than the top surface of the alignment device isolation pattern 302a. A side surface of the third recess region R3 may be covered with an alignment protection spacer 22AK. The alignment protection spacer 22AK may have an 'L'-shaped section. The alignment protection spacer 22AK may be covered with an alignment polysilicon spacer 24AK. The alignment protection spacer 22AK may be formed of or include the same material as the protection spacer 22. The alignment polysilicon spacer 24AK may be formed of or include the same material as the polysilicon spacer 24. The metal alignment pattern 332A may be in contact with the alignment protection spacer 22AK and the alignment polysilicon spacer 24AK. Except for the afore-described features, the device according to the present embodiment may have substantially the same features as that described with reference to FIG. 34B.

Figure 41:
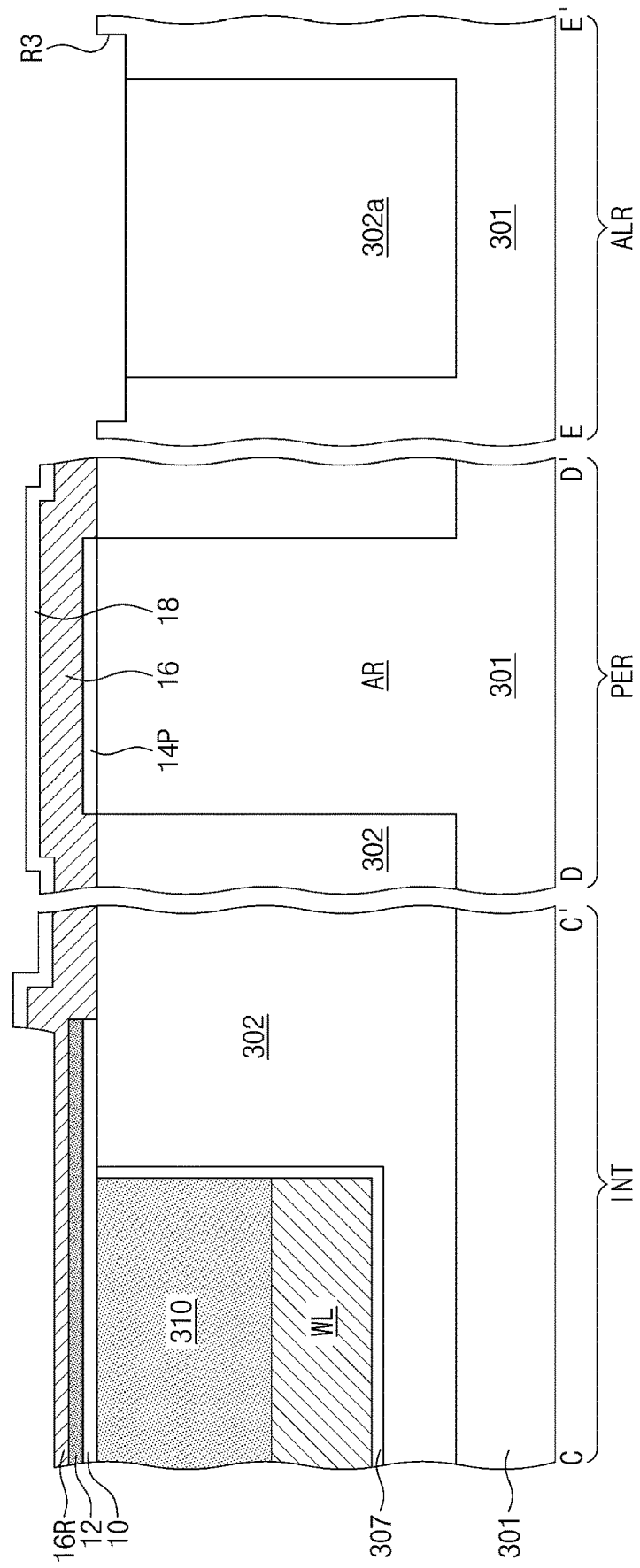
FIGS. 41, 42B, and 43 are sectional views sequentially illustrating a process of fabricating the semiconductor memory device of FIG. 40B.
Figure 42A:
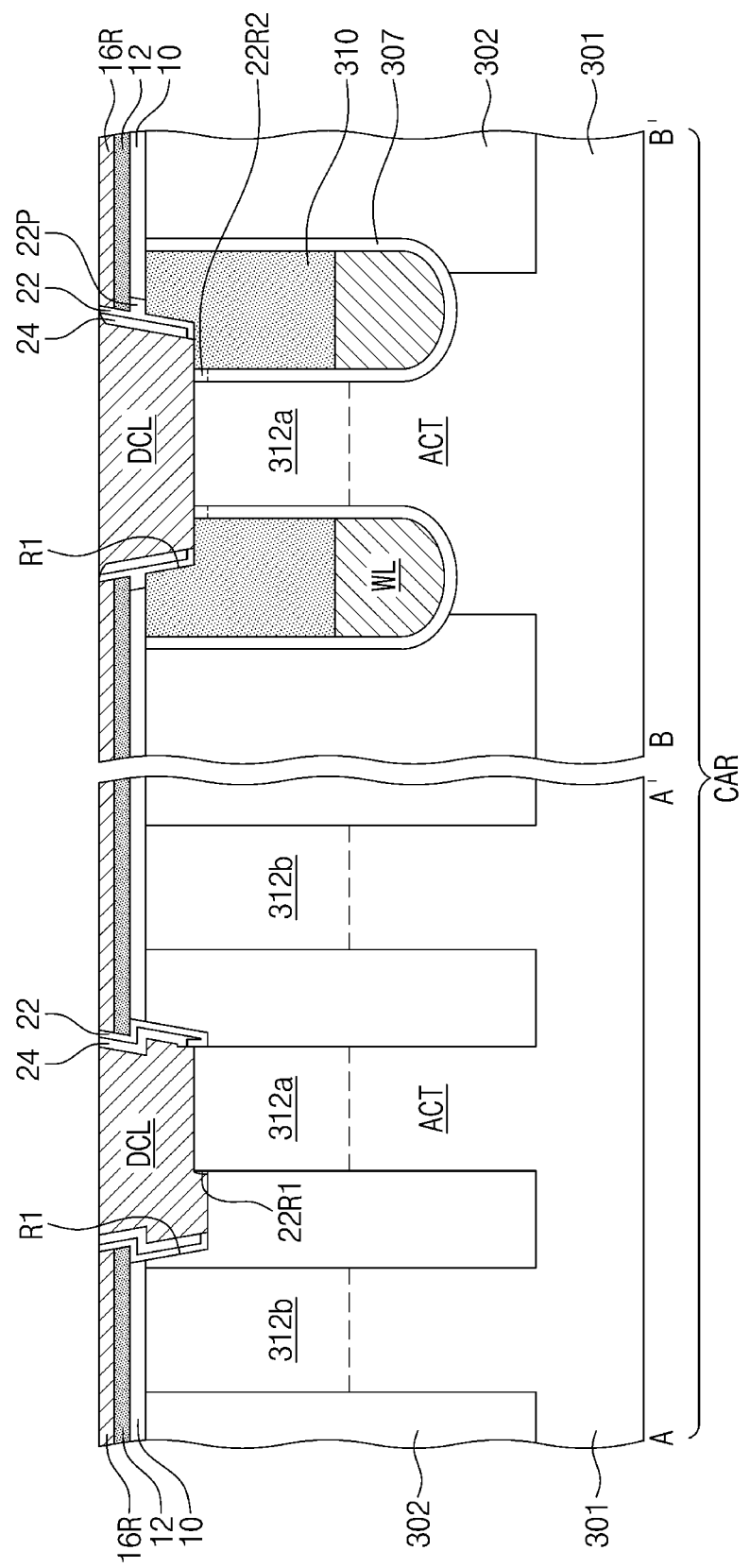
FIG. 42A is a sectional view sequentially illustrating a process of fabricating the semiconductor memory device of FIG. 40A.
Figure 42B:
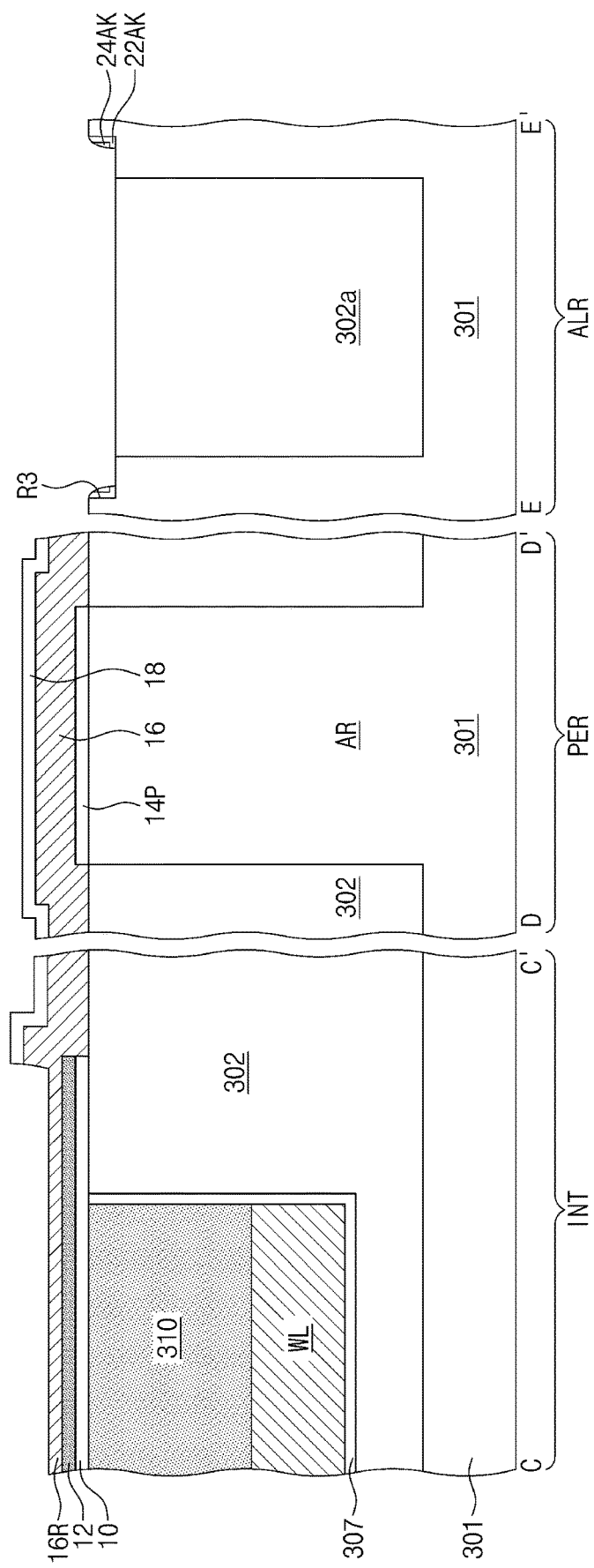
Figure 43:
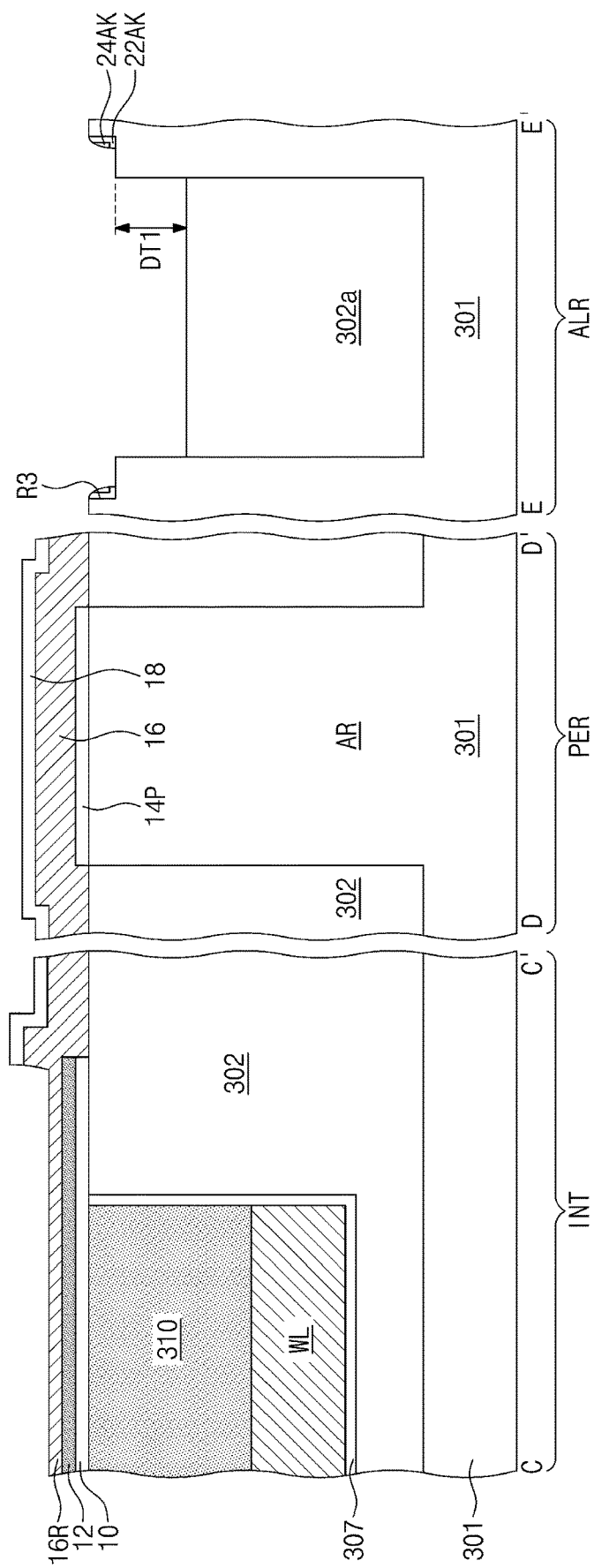

FIG. 42A is a sectional view sequentially illustrating a process of fabricating the semiconductor memory device of FIG. 40A. FIGS. 41, 42B, and 43 are sectional views sequentially illustrating a process of fabricating the semiconductor memory device of FIG. 40B.

Referring to FIGS. 31 and 41, the first recess region R1 with a first upper width DS1 may be formed by etching the peripheral polysilicon remaining layer 16R, the lower buffer layer 12, the first buffer layer 10, a portion of the device isolation pattern 302, and a portion of the substrate 301 in the cell array region CAR. Here, the third recess region R3 may be formed by removing the peripheral polysilicon remaining layer 16R, the alignment oxide layer 14A, and a portion of the substrate 301 in the alignment key region ALR of FIG. 30B. Here, the infiltration prevention layer 18 in the peripheral circuit region PER may prevent the peripheral poly-silicon layer 16 from being etched. In an embodiment, a mask pattern (not shown) may be additionally formed to cover the peripheral circuit region PER and at least a portion of the interface region INT.

Referring to FIGS. 42A and 42B, the width of the first recess region R1 may be increased, and then, the protection spacer 22 and the polysilicon spacer 24 may be formed, as described with reference to FIG. 32. In an embodiment, the alignment polysilicon spacer 24AK covering the side surface of the third recess region R3 in the alignment key region ALR may be also formed when the polysilicon spacer 24 is formed. The bit-line contact layer DCL may be formed on the substrate 301 to fill the first recess region R1, and then, a blanket anisotropic etching process may be performed to leave the bit-line contact layer DCL in the first recess region R1 and to expose the top surface of the peripheral polysilicon remaining layer 16R. At this time, the top portions of the protection spacer 22 and the polysilicon spacer 24 may be also exposed. In addition, the bottom of the third recess region R3 may be exposed in the alignment key region ALR. If the bit-line contact layer DCL is left in the third recess region R3, it may be additionally removed.

Next, referring to FIG. 43, an anisotropic etching process may be performed to remove an upper portion of the alignment device isolation pattern 302a, and thus, a staircase structure may be formed in the alignment key region ALR. Accordingly, the top surface of the alignment device isolation pattern 302a may have the first depth DT1 from the bottom surface of the third recess region R3. Here, the peripheral polysilicon remaining layer 16R may protect the interface region INT. In particular, the peripheral polysilicon remaining layer 16R may prevent the lower buffer layer 12, which is disposed on the device isolation pattern 302 adjacent to the side surface of the end portion of the word line WL in the interface region INT, from being damaged, and thus, the top surface of the first buffer layer 10 is not be exposed. Accordingly, it may be unnecessary to form the mask pattern covering the cell array region CAR, the interface region INT, and the peripheral circuit region PER, in the step of FIG. 43. Thus, a photolithography process to form the mask pattern may be omitted.

According to an embodiment of the inventive concept, a semiconductor memory device may include a protection spacer, which is provided between a substrate and a lower gap-fill insulating pattern and is used to improve reliability of the semiconductor memory device.

In a method of fabricating a semiconductor memory device according to an embodiment of the inventive concept, the protection spacer may prevent the substrate from being etched during forming a bit line, and thus, it may be possible to prevent a failure from occurring in the semiconductor memory device.

While example embodiments of the inventive concept have been particularly shown and described, it will be understood by one of ordinary skill in the art that variations in form and detail may be made therein without departing from the spirit and scope of the attached claims.

What is claimed is:
1. A semiconductor memory device, comprising:
   a first impurity region and a second impurity region, which are provided in a substrate and are spaced apart from each other, a top surface of the second impurity region being higher than a top surface of the first impurity region;

a device isolation pattern interposed between the first impurity region and the second impurity region;
a first contact plug, which directly contacts the first impurity region and has a bottom surface lower than the top surface of the second impurity region;
a gap-fill insulating pattern interposed between the first contact plug and the second impurity region;
a first protection spacer interposed between the gap-fill insulating pattern and the second impurity region; and
a first spacer, which directly contacts a side surface of the first contact plug and the device isolation pattern and is interposed between the first protection spacer and the gap-fill insulating pattern,
wherein the first protection spacer directly contacts the first spacer.

2. The semiconductor memory device of claim 1, wherein the first protection spacer has an 'L' or 'J'-shaped section.

3. The semiconductor memory device of claim 1, wherein a portion of the device isolation pattern is interposed between the first protection spacer and the second impurity region.

4. The semiconductor memory device of claim 1, further comprising:
a first conductive line, which directly contacts the first contact plug and crosses over the substrate in a first direction;
a second conductive line, which is extended in a second direction crossing the first direction and is adjacent to the first impurity region, in the substrate; and
a capping pattern, which directly contacts the second conductive line and is interposed between the second conductive line and the first conductive line,
wherein the bottom surface of the first contact plug is lower than a top surface of the capping pattern, and
wherein the first protection spacer includes a first portion interposed between an upper side surface of the capping pattern and the side surface of the first contact plug.

5. The semiconductor memory device of claim 4, further comprising:
a polysilicon spacer interposed between the first protection spacer and the first contact plug,
wherein the polysilicon spacer comprises the same material as the first contact plug.

6. The semiconductor memory device of claim 5, further comprising:
a first buffer layer interposed between the capping pattern and the first conductive line,
wherein a side surface of the first buffer layer is not aligned with the upper side surface of the capping pattern adjacent thereto.

7. The semiconductor memory device of claim 6, further comprising:
a second buffer layer interposed between the first buffer layer and the first conductive line,
wherein the first protection spacer further includes a second portion that is interposed between the side surface of the first contact plug and the side surface of the first buffer layer and between the side surface of the first contact plug and a side surface of the second buffer layer.

8. The semiconductor memory device of claim 7, wherein the side surface of the second buffer layer extends toward the first contact plug beyond the side surface of the first buffer layer,
wherein the first protection spacer further includes a protruding portion interposed between the top surface of the capping pattern and a bottom surface the second buffer layer, and
wherein the protruding portion of the first protection spacer directly contacts the side surface of the first buffer layer.

9. The semiconductor memory device of claim 8, further comprising:
a third buffer layer interposed between the second buffer layer and the first conductive line,
wherein the first to third buffer layers comprises different materials from each other.

10. The semiconductor memory device of claim 9, wherein the first protection spacer directly contacts the side surface of the first buffer layer, the side surface of the second buffer layer, and a side surface of the third buffer layer.

11. The semiconductor memory device of claim 1, further comprising:
a second protection spacer, which is spaced apart from the first protection spacer with the first contact plug interposed therebetween and is interposed between the gap-fill insulating pattern and a third impurity region,
wherein the device isolation pattern is further interposed between the third impurity region and the first impurity region,
wherein the gap-fill insulating pattern is further interposed between the first contact plug and the third impurity region,
wherein the first protection spacer comprises the same material as the second protection spacer, and
wherein the first protection spacer and the second protection spacer have different shapes from each other.

12. The semiconductor memory device of claim 11, wherein, when measured at the same level, a distance between the first contact plug and the first protection spacer is different from a distance between the first contact plug and the second protection spacer.

13. The semiconductor memory device of claim 1, wherein the second impurity region is disposed near a portion of the first contact plug,
the semiconductor memory device further comprises:
a third impurity region, which is disposed in the substrate and near another side of the first contact plug and is spaced apart from the first and second impurity regions;
a second contact plug, which directly contacts the second impurity region and is spaced apart from the first contact plug; and
a third contact plug, which directly contacts the third impurity region and is spaced apart from the first contact plug, and
a width of the second contact plug is different from a width of the third contact plug.

14. The semiconductor memory device of claim 1, further comprising:
a first conductive line, which directly contacts the first contact plug and crosses over the substrate in a first direction,
wherein the first conductive line comprises a metal-containing pattern, and
the first protection spacer is extended to directly contacts a bottom surface of the metal-containing pattern.

15. A semiconductor memory device, comprising:
a device isolation pattern disposed in a substrate to define a plurality of active regions;

a recess region defined in the device isolation pattern and the substrate and having a first inner side surface and a second inner side surface opposite to each other;

a first impurity region and a second impurity region disposed in a first active region of the plurality of active regions and a second active region of the plurality of active regions, respectively, the first impurity region being provided in the substrate exposed through a bottom surface of the recess region;

a bit-line contact, which directly contacts the first impurity region and is disposed in the recess region;

a first protection spacer covering a lower portion of the first inner side surface of the recess region; and a second protection spacer covering a lower portion of the second inner side surface of the recess region, wherein the first protection spacer and the second protection spacer comprise the same material and have different shapes from each other.

16. The semiconductor memory device of claim 15, further comprising:

a first lower gap-fill insulating pattern disposed in the recess region and between the bit-line contact and the first protection spacer; and a second lower gap-fill insulating pattern disposed in the recess region and between the bit-line contact and the second protection spacer, wherein the first and second lower gap-fill insulating patterns have different shapes from each other.

17. The semiconductor memory device of claim 16, further comprising:

a first spacer, which directly contacts a first side surface of the bit-line contact and is interposed between the first protection spacer and the first lower gap-fill insulating pattern; and a second spacer, which directly contacts a second side surface, opposite to the first side surface, of the bit-line contact and is interposed between the second protection spacer and the second lower gap-fill insulating pattern, wherein the first spacer and the second spacer have different shapes from each other.

18. The semiconductor memory device of claim 15, wherein at least one of the first protection spacer and the second protection spacer has an 'L' or 'J'-shaped section.

19. A semiconductor memory device, comprising:

a device isolation pattern disposed in a substrate to define a plurality of active regions;

a recess region defined in the device isolation pattern and the substrate and having a first inner side surface and a second inner side surface opposite to each other;

a first impurity region and a second impurity region disposed in a first active region of the plurality of active regions and a second active region of the plurality of active regions, respectively, the first impurity region being provided in the substrate exposed through a bottom of the recess region;

a bit-line contact, which directly contacts the first impurity region and is disposed in the recess region;

a first protection spacer covering the first inner side surface of the recess region; and a second protection spacer covering the second inner side surface of the recess region, wherein the first protection spacer directly contacts the substrate, and wherein the second protection spacer is spaced apart from the substrate.

20. The semiconductor memory device of claim 19, further comprising:

a lower gap-fill insulating pattern, which is disposed in the recess region and between the bit-line contact and the first protection spacer; and a first spacer, which directly contacts a side surface of the bit-line contact and is interposed between the first protection spacer and the lower gap-fill insulating pattern, wherein the first protection spacer has a thickness smaller than the first spacer.

* * * * *